(12) United States Patent
Sato et al.

(10) Patent No.: US 6,238,842 B1
(45) Date of Patent: *May 29, 2001

(54) POSITIVE PHOTOSENSITIVE COMPOSITION

(75) Inventors: Kenichiro Sato; Toshiaki Aoai, both of Shizuoka (JP)

(73) Assignee: Fuji Photo Film Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/266,597

(22) Filed: Mar. 11, 1999

(30) Foreign Application Priority Data

Mar. 12, 1998 (JP) .................................................. 10-061449
Mar. 12, 1998 (JP) .................................................. 10-061478

(51) Int. Cl.$^7$ ................................ G03C 1/72; G03C 1/73
(52) U.S. Cl. ................................ 430/281.1; 430/270.1; 430/917; 430/905
(58) Field of Search ........................ 430/270.1, 281.1, 430/286.1, 913, 919, 920, 921, 906; 522/31

(56) References Cited

U.S. PATENT DOCUMENTS

| 5,279,921 | * | 1/1994 | Onishi et al. | 430/270.1 |
| 5,580,694 | * | 12/1996 | Allen et al. | 430/270.1 |
| 5,786,131 | * | 7/1998 | Allen et al. | 430/270.1 |
| 5,863,699 | * | 1/1999 | Asakawa et al. | 430/270.1 |
| 5,879,857 | * | 3/1999 | Chandross et al. | 430/270.1 |
| 6,042,991 | * | 3/2000 | Aoai et al. | 430/285.1 |

FOREIGN PATENT DOCUMENTS

10221853 * 8/1998 (JP) .
10239848 * 9/1998 (JP) .

* cited by examiner

Primary Examiner—Hoa Van Le
Assistant Examiner—Yvette M. Clarke
(74) Attorney, Agent, or Firm—Sughrue, Mion, Zinn, Macpeak & Seas, PLLC

(57) ABSTRACT

An object of the present invention is to provide a positive photosensitive composition suitable for use with an exposure light having a wavelength of 250 nm or shorter, especially 220 nm or shorter. The positive photosensitive composition comprises (A) a compound which generates an acid upon irradiation with actinic rays or a radiation, (B) a resin having monovalent polyalicyclic groups represented by at least one of the following general formulae (I), (II), and (III) and further having groups which decompose by the action of an acid to enhance solubility in an alkaline developing solution, and (C) a compound represented by the following general formula (CI) or (CII) or a low-molecular compound (i) comprising one or more hydrophilic functional groups and an internally crosslinked hydrocarbon group having from 5 to 30 carbon atoms or a naphthalene compound (ii) having one or more hydrophilic functional groups and from 10 to 30 carbon atoms:

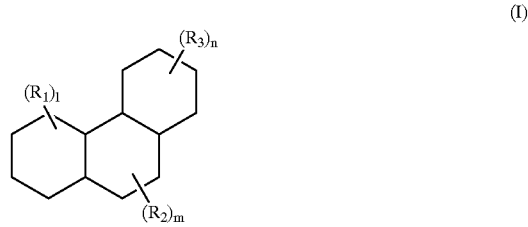

(I)

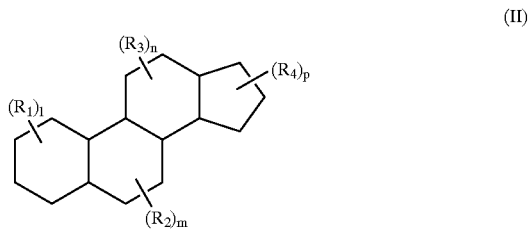

(II)

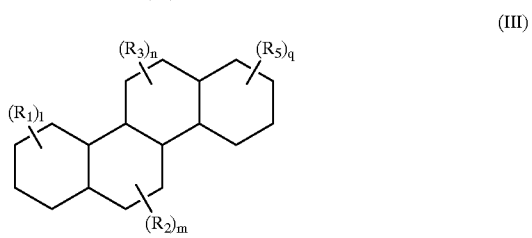

(III)

wherein the substituents are as defined in the specification.

8 Claims, No Drawings

POSITIVE PHOTOSENSITIVE COMPOSITION

FIELD OF THE INVENTION

The present invention relates to positive photosensitive compositions for use in the production of semiconductors, e.g., ICs, in the production of circuit boards for liquid crystals, thermal heads, etc., and in other photofabrication processes. More particularly, this invention relates to positive photosensitive compositions suitable for use in applications where far ultraviolet rays having a wavelength of 250 nm or shorter are used as an exposure light.

BACKGROUND OF THE INVENTION

Among positive photoresist compositions are the chemical amplification type resist compositions described, e.g., in U.S. Pat. No. 4,491,628 and European Patent 249,139. A chemical amplification type positive resist composition is a pattern-forming material in which an acid generates in exposed areas upon irradiation with a radiation such as far ultraviolet rays and this acid catalyzes a reaction that makes the areas irradiated with the actinic rays and the unirradiated areas to differ in solubility in a developing solution to thereby form a pattern on a substrate.

Examples of such resist compositions include combinations of a compound which generates an acid upon photodecomposition with an acetal or O,N-acetal compound (see JP-A-48-89003; the term "JP-A" as used herein means an "unexamined published Japanese patent application"), with an orthoester or amidoacetal compound (see JP-A-51-120714), with a polymer having acetal or ketal groups in the backbone (see JP-A-53-133429), with an enol ether compound (see JP-A-55-12995), with an N-acyliminocarbonic acid compound (see JP-A-55-126236), with a polymer having orthoester groups in the backbone (see JP-A-56-17345), with a tertiary alkyl ester compound (see JP-A-60-3625) with a silyl ester compound (see JP-A-60-10247), and with a silyl ether compound (see JP-A-60-37549 and JP-A-60-121446). These combinations show high photosensitivity since they have a quantum efficiency exceeding 1 because of their principle.

Examples of systems which decompose upon heating in the presence of an acid to become alkali-soluble include systems comprising a combination of a compound which generates an acid upon exposure to light with an ester having a tertiary or secondary carbon (e.g., t-butyl or 2-cyclohexenyl) or with a carbonic ester compound, as described in, e.g., JP-A-59-45439, JP-A-60-3625, JP-A-62-229242, JP-A-63-27829, JP-A-63-36240, JP-A-63-250642, JP-A-5-181279, *Polym. Eng. Sce.*, Vol.23, p.1012 (1983), *ACS. Syr.*, Vol.242, p.11 (1984), *Semiconductor World*, November 1987 issue, p.91, *Macromolecules*, Vol.21, p.1475 (1988), and *SPIE*, Vol.920, p.42 (1988); systems comprising a combination of the acid-generating compound with an acetal compound, as described in, e.g., JP-A-4-219757, JP-A-5-249682, and JP-A-6-65332; and systems comprising a combination of the acid-generating compound with a t-butyl ether compound, as described in, e.g., JP-A-4-211258 and JP-A-6-65333.

These systems employ as the main component a resin having a poly(hydroxystyrene) backbone, which shows low absorption mainly in a wavelength region including 248 nm. Consequently, these systems have high sensitivity and high resolution and are capable of forming a satisfactory pattern when a KrF excimer laser is used as a light source for exposure.

However, the degree of integration in integrated circuits is increasing more and more, and it has become necessary to form an ultrafine pattern having a line width of 0.5 µm or smaller in the production of semiconductor substrates for ULSIs and the like.

Known as one means for attaining finer patterns is to use an exposure light having a shorter wavelength in resist pattern formation. This can be explained with the Rayleigh's equation which represents the resolution (line width) R of an optical system:

$$R = k \cdot \lambda / NA$$

(wherein $\lambda$ is the wavelength of exposure light, NA is the numerical aperture of a lens, and k is a process constant). This equation shows that a higher resolution, i.e., a smaller value of R, can be attained by using an exposure light having a shorter wavelength $\lambda$.

For example, the i-ray (365 nm) emitted from a high-pressure mercury lamp has been used so far in the production of DRAMs having degrees of integration of up to 64 megabits. For processes for mass-producing 256-megabit DRAMs, investigations are being made on the employment of KrF excimer laser light (248 nm) as an exposure light substitute for i-ray. For use in producing DRAMs having a degree of integration of 1 gigabit or higher, exposure lights having even shorter wavelengths are being investigated and use of ArF excimer laser light (193 nm), $F_2$ excimer laser light (157 nm), X-rays, electron beams, and the like is thought to be effective [see Takumi Ueno et al., "Tanpacho Fotorejisuto Zairyo—ULSI Nimuketabisaikako—(Short-wavelength Photoresist Materials—Fine Processing toward ULSIs—)", Bunshin Shuppan, 1988).

In the case of using a light source emitting a shorter-wavelength light, e.g., an ArF excimer laser (193 nm), as a light source for exposure, even the chemical amplification type systems described above have been insufficient because compounds having aromatic groups intrinsically show intense absorption in a region including 193 nm.

Although use of a poly(meth)acrylate as a polymer showing reduced absorption in a wavelength region including 193 nm is described in *J. Vac. Sci. Technol.*, B9, 3357 (1991), this polymer has had a problem that it is inferior to conventional phenolic resins having aromatic groups in resistance to the dry etching generally conducted in semiconductor production processes.

In contrast, it has been reported in *Proc. of SPIE*, 1672, 66 (1992) that a polymer having alicyclic groups is comparable in dry etching resistance to the aromatic polymers and shows reduced absorption in a region including 193 nm. This report has led to recent enthusiastic investigations on the utilization of that kind of polymer. Examples of that polymer are described in, e.g., JP-A-4-39665, JP-A-5-80515, JP-A-5-265212, JP-A-5-297591, JP-A-5-346668, JP-A-6-289615, JP-A-6-324494, JP-A-7-49568, JP-A-7-185046, JP-A-7-191463, JP-A-7-199467, JP-A-7-234511, JP-A-7-252324, and JP-A-8-259626. However, these polymers do not always have sufficient dry etching resistance and are disadvantageous also in that the synthesis thereof necessitates many steps.

The larger the dissolution rate between before and after exposure in a chemical amplification type resist, the higher the resolution of the resist. Consequently, in chemical amplification type resists of the type in which a resin and a dissolution inhibitor are changed in solubility, higher resolution is obtained when the dissolution inhibitor has a higher dissolution inhibitive effect. Although there has been almost no dissolution inhibitor which is applicable also to far ultraviolet light having a wavelength as short as 220 nm or below, a photoresist composition has been disclosed which contains a dissolution inhibitor comprising a specific compound and a photo-acid generator which generates an acid upon light irradiation (see JP-A-9-265177).

Furthermore, a composition comprising a substituted androstane, a radiation-sensitive acid generator, and a copolymer binder has been disclosed as a radiation-sensitive resist composition for far ultraviolet rays which has improved sensitivity and resolution and which, when used as a resist film having a thickness of 1 μm and exposed to ultraviolet rays having a wavelength as short as 193 nm, can sufficiently form an image even at a radiation dose below about 15 mJ/cm$^2$ (see JP-A-8-15865).

However, these compositions for short-wavelength light exposure have had problems of considerable pattern cracking, poor pattern/substrate adhesion, fine-pattern falling, etc.

A radiation-sensitive resin composition suitable for use as a chemical amplification type photoresist has been disclosed in which the transmission of far ultraviolet rays can be sufficiently controlled and which is considerably reduced in standing wave marks and halation and satisfactory in developability, pattern shape, etc. and has sufficient resistance to dry etching. This radiation-sensitive resin composition comprises (A) a resin which releases protective groups by the action of an acid to become alkali-soluble, (B) a radiation-sensitive acid generator, and (C) at least one compound selected from (i) alicyclic low-molecular compounds having one or more hydrophilic functional groups and from 5 to 25 carbon atoms and (ii) naphthalenic low-molecular compounds having from 10 to 40 carbon atoms (see JP-A-9-274318).

However, the above radiation-sensitive resin composition which transmits far ultraviolet rays still has insufficient sensitivity when exposed to a short-wavelength light, e.g., ArF excimer laser light (193 nm). Since ArF excimer laser light has a high energy, exposure with an ArF excimer laser over a prolonged period poses a problem that the life of the expensive exposure apparatus becomes shorter due to the exposure energy. Consequently, use of a resist composition having insufficient sensitivity results in a longer exposure time and hence leads to a shorter life of the exposure apparatus. The prior art composition described above further has problems of, e.g., the occurrence of development defects, poor pattern/substrate adhesion, and fine-pattern falling.

SUMMARY OF THE INVENTION

As described above, the prior art photoresist compositions for short-wavelength light exposure have problems of considerable pattern cracking, poor pattern/substrate adhesion, fine-pattern falling, etc. Further improvements have hence been desired.

Accordingly, an object of the present invention is to provide a positive photosensitive composition suitable for use with an exposure light having a wavelength of 250 nm or shorter, especially 220 nm or shorter. More specifically, the object is to provide an excellent positive photosensitive composition which, upon exposure to a light having a wavelength of 250 nm or shorter, especially 220 nm or shorter, shows satisfactory sensitivity and resolution and gives a resist pattern reduced in cracking and satisfactory in adhesion to the substrate.

As described above, the prior art photoresist compositions for short-wavelength light exposure not only are required to be significantly improved in sensitivity so as to improve the durability of exposure apparatuses, but have problems concerning pattern/substrate adhesion, development defects, etc. Further improvements have hence been desired.

Accordingly, another object of the present invention is to provide a positive photosensitive composition suitable for use with an exposure light having a wavelength of 250 nm or shorter, especially 220 nm or shorter. More specifically, the object is to provide an excellent positive photosensitive composition which, upon exposure to a light having a wavelength of 250 nm or shorter, especially 220 nm or shorter, shows significantly improved satisfactory sensitivity and excellent developability, i.e., freedom from development defects, and gives a resist pattern showing satisfactory adhesion to the substrate.

As a result of intensive investigations made by the present inventors while taking account of the properties described above, they have found that the objects of the present invention are successfully accomplished by the use of a combination of a resin having the following specific alicyclic groups and specific additives. The present invention has been achieved based on this finding.

Specifically, the first composition of the present invention has the following constitution.

(1) A first positive photosensitive composition comprising (A) a compound which generates an acid upon irradiation with actinic rays or a radiation, (B) a resin having monovalent polyalicyclic groups represented by at least one of the following general formulae (I), (II), and (III) and further having groups which decompose by the action of an acid to enhance solubility in an alkaline developing solution, and (C) a compound represented by the following general formula (CI) or (CII):

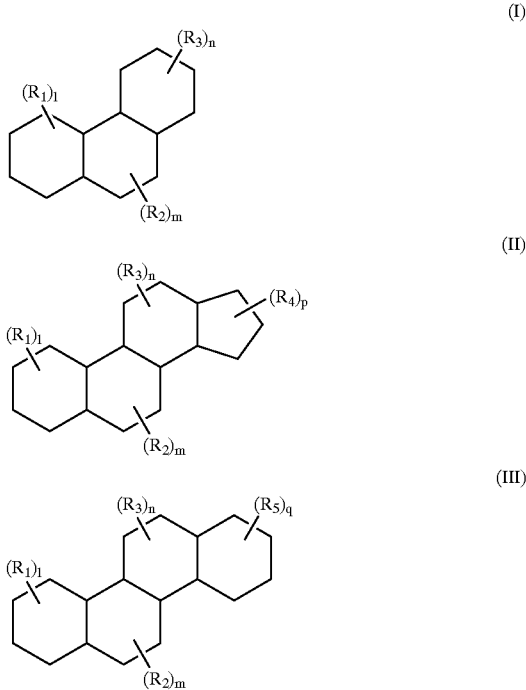

wherein $R_1$ to $R_5$ may be the same or different and each represents an optionally substituted alkyl, cycloalkyl, alkenyl, acyloxy, or alkynyl group, a halogen atom, a cyano group, or a group represented by

—$R_6$—O—$R_7$,
—$R_8$—CO—O—$R_9$,

—R$_{10}$—CO—NR$_{11}$R$_{12}$,
—R$_{13}$—O—CO—R$_{14}$,
—R$_{15}$—CO—X$_1$—A$_1$—R$_{16}$,
—R$_{15}$—CO—X$_1$—A$_2$—R$_{17}$,
—R$_{15}$—CO—NHSO$_2$—X$_2$—A—R$_{17}$, or
—COOZ, wherein R$_7$ and R$_9$ may be the same or different and each represents a hydrogen atom, an optionally substituted alkyl, cycloalkyl, or alkenyl group, —Z, or such a group that the —O—R$_7$ or —CO—O—R$_9$ functions as a group which decomposes by the action of an acid to enhance solubility in an alkaline developing solution (acid-decomposable group), Z is a group represented by either of the following formulae:

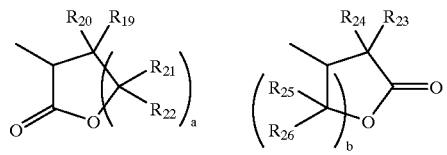

wherein R$_{19}$ g to R$_{26}$ may be the same or different and each represents a hydrogen atom or an optionally substituted alkyl group and a and b each represents 1 or 2, R$_{11}$, R$_{12}$, and R$_{14}$ may be the same or different and each represents a hydrogen atom or an optionally substituted alkyl, cycloalkyl, or alkenyl group, provided that R$_{11}$ and R$_{12}$ may be bonded to each other to form a ring, R$_6$, R$_8$, R$_{10}$ and R$_{13}$ may be the same or different and each represents a single bond or an optionally substituted alkylene, alkenylene, or cycloalkylene group, R$_{15}$ represents a single bond or an optionally substituted alkylene or cycloalkylene group, X$_1$ represents an oxygen atom, a sulfur atom, or —NH—, X$_2$ represents a single bond or —NH—, A represents one member or a combination of two or more members selected from the group consisting of a single bond and optionally substituted alkylene, ether, thioether, carbonyl, ester, amide, sulfonamide, urethane, and urea groups, A$_1$ represents one member or a combination of two or more members selected from the group consisting of optionally substituted alkylene, ether, thioether, carbonyl, and ester groups, A$_2$ represents one member or a combination of two or more members selected from the group consisting of optionally substituted alkylene, ether, thioether, carbonyl, ester, amide, sulfonamide, urethane, and urea groups, provided that at least one A$_2$ is selected from sulfonamide, urethane, and urea groups, R$_{16}$ represents —COOH, —COOR$_9$, —OR$_7$, —COOZ, —CN, a hydroxyl group, or —CO—NH—SO$_2$—R$_{30}$, and R$_{17}$ represents —COOH, —COOR$_9$, —OR$_7$, —CN, a hydroxyl group, —CO—NH—R$_{30}$, —CO—NH—SO$_2$—R$_{30}$, —Z, or an optionally substituted alkyl, cycloalkyl, or alkoxy group, wherein R$_{30}$ represents an optionally substituted alkyl or cycloalkyl group, and l, m, n, p, and q may be the same or different and each represents 0 or an integer of 1 to 5, provided that when l, m, n, p, or q is 2 or larger, the plural substituents with respect to each of R$_1$, R$_2$, R$_3$, R$_4$ and R$_5$ may be the same or different; two of the plural substituents, which are present on the same carbon, in combination may represent a carbonyl group (=O) or a thiocarbonyl group (=S); two of the plural substituents, which are bonded to adjacent carbon atoms, may represent a double bond between the carbon atoms; and two of the plural substituents may be bonded to each other to form a ring, the bond for external linkage of each monovalent polyalicyclic group represented by general formula (I), (II), or (III) being located in any position in the polycyclic hydrocarbon structure;

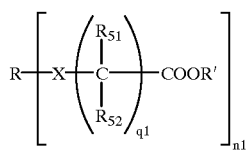 (CI)

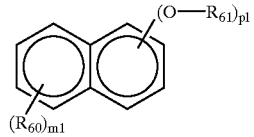 (CII)

wherein in formula (CI), X represents O, S, —N(R$_{53}$)—, or a single bond, R$_{51}$, R$_{52}$, and R$_{53}$ each represents a hydrogen atom or an alkyl group, R' represents such a group that the —COOR' functions as an acid-decomposable group, and R represents a residue having a valency of n1 and comprising either an internally crosslinked hydrocarbon group or a naphthalene ring, and in formula (CII), R$_{60}$ represents a hydrogen atom or an alkyl group, R$_{61}$ represents such a group that the —O—R$_{61}$ functions as an acid-decomposable group, m1, n1, and p1 may be the same or different and each represents an integer of 1 to 4, and q1 represents an integer of 0 to 10.

The second composition of the present invention has the following constitution.

(2) A second positive photosensitive composition comprising (A) a compound which generates an acid upon irradiation with actinic rays or a radiation, (B) a resin having monovalent polyalicyclic groups represented by at least one of general formulae (I), (II), and (III) defined above and further having groups which decompose by the action of an acid to enhance solubility in an alkaline developing solution, and (C) at least one of (i) a low-molecular compound comprising one or more hydrophilic functional groups and an internally crosslinked hydrocarbon group having from 5 to 30 carbon atoms and (ii) a naphthalene compound having one or more hydrophilic functional groups and from 10 to 30 carbon atoms.

DETAILED DESCRIPTION OF THE INVENTION

The compounds for use in the present invention will be explained below in detail.

(B) Resin Having both Polyalicyclic Groups Represented by at least One of General Formulae (I) to (III) and Groups Decomposing with Acid to Enhance Solubility in Alkaline Developing Solution (Referred to also as Acid-Decomposable Groups):

In the present invention, the polyalicyclic groups represented by general formulae (I) to (III) and the acid-decomposable groups each may be bonded to any site of the base resin. Namely, the polyalicyclic groups represented by general formulae (I) to (III) and the acid-decomposable groups may be bonded to different repeating units in the base resin. Alternatively, the base resin may contain repeating units each having both a polyalicyclic group represented by general formula (I), (II), or (III) and an acid-decomposable group. Furthermore, the two kinds of groups may be bonded to the base resin in these two manners.

In the resin according to the present invention, the repeating structural units having groups represented by at least one of general formulae (I) to (III) may be any units having these groups. However, repeating structural units represented by the following general formulae (IV) to (VI) are preferred. More preferred are those represented by general formula (IV).

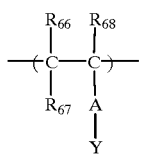

(IV)

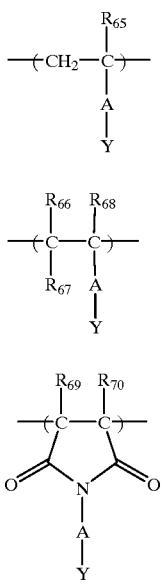

(V)

(VI)

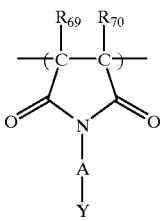

In formulae (IV) to (VI), $R_{65}$, $R_{66}$, and $R_{68}$ to $R_{70}$ may be the same or different, and each represents a hydrogen atom, a halogen atom, a cyano group, an alkyl group, or a haloalkyl group. $R_{67}$ represents a cyano group, —CO—OR$_{77}$, or —CO—NR$_{78}$R$_{79}$.

A's may be the same or different and represent one member or a combination of two or more members selected from the group consisting of a single bond and optionally substituted alkylene, alkenylene, cycloalkylene, ether, thioether, carbonyl, ester, amide, sulfonamide, urethane, and urea groups, or each represents —SO$_2$—, —O—CO—R$_{80}$—, —CO—O—R$_{81}$—, or —CO—NR$_{82}$—R$_{83}$—.

$R_{77}$ represents a hydrogen atom, an optionally substituted alkyl, cycloalkyl, or alkenyl group, or such a group that the —CO—OR$_{77}$ functions as an acid-decomposable group.

$R_{78}$, $R_{79}$, and $R_{82}$ may be the same or different, and each represents a hydrogen atom or an optionally substituted alkyl, cycloalkyl, or alkenyl group. $R_{78}$ and $R_{79}$ may be bonded to each other to form a ring.

$R_{80}$, $R_{81}$, and $R_{83}$ may be the same or different, and each represents a single bond or a bivalent alkylene, alkenylene, or cycloalkylene group, or a bivalent group formed by combining these groups with an ether, ester, amide, urethane or ureido group.

Y represents any of the polyalicyclic groups represented by general formulae (I) to (III) described above.

In the present invention, the resin of component (B) is preferably one which has repeating structural units represented by at least one of general formulae (IV), (V), and (VI) described above and repeating structural units represented by at least one of the following general formulae (VII), (VIII), and (IX), and which decomposes by the action of an acid to have enhanced solubility in an alkaline developing solution.

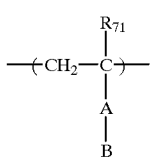

(VII)

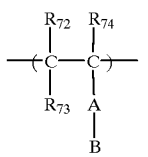

(VIII)

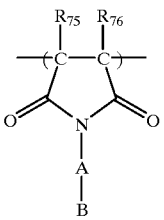

(IX)

In formulae (VII) to (IX), $R_{71}$, $R_{72}$, and $R_{74}$ to $R_{76}$ may be the same or different, and each represents a hydrogen atom, a halogen atom, a cyano group, an alkyl group, or a haloalkyl group. $R_{73}$ has the same meaning as $R_{67}$ described above. Symbol A has the same meaning as in general formulae (IV) to (VI) described above.

B is a group which decomposes by the action of an acid to enhance solubility in an alkaline developing solution.

In the present invention, the resin of component (B) preferably further contains repeating structural units represented by at least one of the following general formulae (X), (XI), and (XII) each having a carboxyl group.

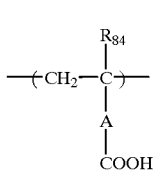

(X)

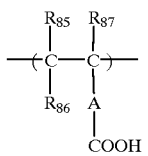

(XI)

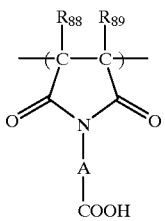

(XII)

In general formulae (X) to (XII), $R_{84}$, $R_{85}$, and $R_{87}$ to $R_{89}$ may be the same or different, and each represents a hydrogen atom, a halogen atom, a cyano group, an alkyl group, or a haloalkyl group.

$R_{86}$ represents a cyano group, a carboxyl group, —CO—$OR_{90}$, or —CO—$NR_{91}R_{92}$.

Symbol A has the same meaning as in general formulae (IV) to (VI). $R_{90}$ represents an optionally substituted alkyl, cycloalkyl, or alkenyl group.

$R_{91}$ and $R_{92}$ may be the same or different, and each represents a hydrogen atom or an optionally substituted alkyl, cycloalkyl, or alkenyl group, provided that $R_{91}$ and $R_{92}$ may be bonded to each other to form a ring.

Preferred examples of the alkyl group represented by each of $R_1$ to $R_5$, $R_7$, $R_9$, $R_{11}$, $R_{12}$, $R_{14}$, $R_{19}$ to $R_{26}$, $R_{30}$, $R_{65}$, $R_{66}$, $R_{68}$ to $R_{70}$, $R_{71}$, $R_{72}$, $R_{74}$ to $R_{79}$, $R_{82}$, $R_{84}$, $R_{85}$, and $R_{87}$ to $R_{92}$ in the general formulae given above include optionally substituted alkyl groups having 1 to 8 carbon atoms, such as methyl, ethyl, propyl, n-butyl, sec-butyl, hexyl, 2-ethylhexyl, and octyl.

Preferred examples of the cycloalkyl group represented by each of $R_1$ to $R_5$, $R_7$, $R_9$, $R_{11}$, $R_{12}$, $R_{14}$, $R_{19}$ to $R_{26}$, $R_{30}$, $R_{65}$, $R_{66}$, $R_{68}$ to $R_{70}$, $R_{71}$, $R_{72}$, $R_{74}$ to $R_{79}$, $R_{82}$, $R_{84}$, $R_{85}$, and $R_{87}$ to $R_{92}$ include optionally substituted cycloalkyl groups such as cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl, and tetracyclodecanyl.

Preferred examples of the alkenyl group include optionally substituted alkenyl groups having 2 to 6 carbon atoms, such as vinyl, propenyl, allyl, butenyl, pentenyl, hexenyl, and cyclohexenyl.

Examples of the alkoxy group represented by each of $R_1$ to $R_5$ and $R_{17}$ include optionally substituted alkoxy groups having 1 to 4 carbon atoms, such as methoxy, ethoxy, propoxy, and butoxy.

Examples of the acyloxy group represented by each of $R_1$ to $R_5$ include optionally substituted acyloxy groups having 1 to 4 carbon atoms, such as acetoxy and butyryloxy.

Preferred examples of the alkynyl group represented by each of $R_1$ to $R_5$ include those having 2 to 4 carbon atoms, such as acetyl and propargyl.

In the case where l, m, n, p, or q is 2 or larger, the plural substituents with respect to each of $R_1$, $R_2$, $R_3$, $R_4$ and $R_5$ may be the same or different; two of the plural substituents, which are present on the same carbon, in combination may represent a carbonyl group (=O) or a thiocarbonyl group (=S).

Two of the plural substituents, which are bonded to adjacent carbon atoms, may represent a double bond between the carbon atoms. The carbon-carbon double bonds thus formed preferably are not conjugated carbon-carbon double bonds.

In the case where there are two or more substituents represented by each of $R_1$ to $R_5$, two of these may be bonded to each other to form a ring. Preferred examples of this ring include three- to eight-membered rings optionally containing one or more heteroatoms, such as cyclopropyl, cyclopentyl, cyclohexyl, cycloheptyl, tetrahydrofuranyl, and tetrahydropyranyl. These rings may have substituents.

The bond for external linkage of each monovalent polyalicyclic group represented by general formula (I), (II), or (III) may be located in any position in the polycyclic hydrocarbon structure, and is preferably located in the 3-, 7-, or 12-position of the steroid framework.

Preferred examples of the haloalkyl group represented by each of $R_{65}$, $R_{66}$, $R_{68}$ to $R_{70}$, $R_{71}$, $R_{72}$, $R_{74}$ to $R_{76}$, $R_{84}$, $R_{85}$, and $R_{87}$ to $R_{89}$ include alkyl groups having 1 to 4 carbon atoms and substituted with one or more of fluorine, chlorine, and bromine atoms. Specific examples thereof include fluoromethyl, chloromethyl, bromomethyl, fluoroethyl, chloroethyl, and bromoethyl.

In the present invention, examples of the halogen atom include fluorine, chlorine, and bromine atoms.

Preferred examples of the alkylene group represented by each of $R_6$, $R_8$, $R_{10}$, $R_{13}$, and A include optionally substituted alkylene groups having 1 to 8 carbon atoms, such as methylene, ethylene, propylene, butylene, hexylene, and octylene. Preferred examples of the alkenylene group include optionally substituted alkenylene groups having 2 to 6 carbon atoms, such as ethenylene, propenylene, and butenylene. Preferred examples of the cycloalkylene group include optionally substituted cycloalkylene groups having 5 to 8 carbon atoms, such as cyclopentylene and cyclohexylene.

Examples of the optionally substituted alkylene group represented by each of $R_{15}$, A, $A_1$, and $A_2$ include groups represented by the following formula:

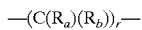

wherein $R_a$ and $R_b$ may be the same or different, and each represents a hydrogen atom, an alkyl group, a substituted alkyl group, a halogen atom, a hydroxyl group, or an alkoxy group. Preferred examples of the alkyl group include lower alkyl groups such as methyl, ethyl, propyl, isopropyl, and butyl. More preferably, the alkyl group represents a substituent selected from the group consisting of methyl, ethyl, propyl, and isopropyl. Examples of the substituent (s) of the substituted alkyl group include hydroxy, halogen atoms, and alkoxy groups. Examples of the alkoxy group include those having 1 to 4 carbon atoms, such as methoxy, ethoxy, propoxy, and butoxy. Symbol r represents an integer of 1 to 10.

Preferred examples of the cycloalkylene group represented by $R_{15}$ include optionally substituted cycloalkylene groups having 5 to 8 carbon atoms, such as cyclopentylene and cyclohexylene.

$A_2$ contains at least one of sulfonamide, urethane, and ureido groups, and these groups each may form a bivalent group in cooperation with one member or a bivalent combination of two or more members selected from the group consisting of alkylene, substituted alkylene, ether, thioether, carbonyl, ester, amide, sulfonamide, urethane, and urea groups.

Symbols l, m, n, p, and q in general formulae (I) to (III), which each represents 0 or an integer of 1 to 5, each preferably represents 0 or an integer of 1 or 2.

Examples of the alkylene, alkenylene, and cycloalkylene groups represented by each of $R_{80}$, $R_{81}$, and $R_{83}$ include the same alkylene, alkenylene, and cycloalkylene groups as those enumerated above, and further include bivalent groups each made up of any of those groups and, bonded thereto, at least one of ether, ester, amide, urethane, and ureido groups.

Preferred examples of the ring constituted of $R_{11}$ and $R_{12}$ bonded to each other or of $R_{78}$ and $R_{79}$ bonded to each other in cooperation with the nitrogen atom include five- to eight-membered rings. Specific examples thereof include pyrrolidine, piperidine, and piperazine.

$R_7$, $R_9$, $R_{77}$, and B each constitutes an acid-decomposable group.

In the resin according to the present invention, acid-decomposable groups may be contained in the structures of groups represented by at least one of general formulae (I) to (III) (for example, as —O—$R_7$ or —CO—O—$R_9$), or may be contained in repeating structural units each having a group represented by general formula (I), (II), or (III) (for example, as —CO—O—$R_{77}$), or may be contained in other repeating structural units. The acid-decomposable groups may be contained in two or more kinds of such structures or units.

Examples of the acid-decomposable groups include groups which hydrolyze by the action of an acid to form an acid and groups which release a carbon cation by the action of an acid to form an acid. Preferred are groups represented by the following general formulae (XIII) and (XIV). Such acid-decomposable groups serve to impart excellent long-term stability.

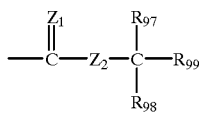

(XIII)

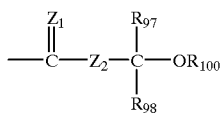

(XIV)

In formulae (XIII) and (XIV), $R_{97}$ to $R_{99}$ may be the same or different, and each represents a hydrogen atom or an optionally substituted alkyl, cycloalkyl, or alkenyl group, provided that at least one of $R_{97}$ to $R_{99}$ in formula (XIII) is not a hydrogen atom. $R_{100}$ represents an optionally substituted alkyl, cycloalkyl, or alkenyl group. Two of $R_{97}$ to $R_{99}$ in formula (XIII) or two of $R_{97}$, $R_{98}$, and $R_{100}$ in formula (XIV) may be bonded to each other to form a three- to eight-membered ring structure comprising carbon atoms and optionally containing one or more heteroatoms. Specific examples of such a ring include cyclopropyl, cyclopentyl, cyclohexyl, cycloheptyl, 1-cyclohexenyl, 2-tetrahydrofuranyl, and 2-tetrahydropyranyl. $Z_1$ and $Z_2$ may be the same or different, and each represents an oxygen atom or a sulfur atom.

Preferred examples of the alkyl and cycloalkyl groups are the same as those shown hereinabove with regard to $R_1$ to $R_5$. Preferred examples of the alkenyl group include optionally substituted alkenyl groups having 2 to 6 carbon atoms, such as vinyl, propenyl, allyl, butenyl, pentenyl, hexenyl, and cyclohexenyl.

Other preferred examples of the acid-decomposable groups include —C(=O)—O—R (wherein R represents a trialkylsilyl group, e.g., trimethylsilyl, t-butyldimethylsilyl, or diisopropylmethylsilyl, or a 3-oxocyclohexyl group).

Preferred examples of the substituents which may be possessed by the substituents described above in detail include hydroxy, halogen atoms (fluorine, chlorine, bromine, and iodine), nitro, cyano, amide, sulfonamide, alkyl groups such as those enumerated hereinabove with regard to $R_1$ to $R_5$, alkoxy groups such as methoxy, ethoxy, hydroxyethoxy, propoxy, hydroxypropoxy, and butoxy, alkoxycarbonyl groups such as methoxycarbonyl and ethoxycarbonyl, acyl groups such as formyl, acetyl, and benzoyl, acyloxy groups such as acetoxy and butyryloxy, and carboxy.

In addition to the above, when $R_9$ or $R_{77}$ is such a group that the —CO—O—$R_9$ or —CO—O—$R_{77}$ functions as an acid-decomposable group, examples of $R_9$ and $R_{77}$ include the groups exemplified later as R' in formula (CI), and when $R_7$ is such a group that the —O—$R_7$ functions as an acid-decomposable group, examples of $R_7$ include the groups exemplified later as $R_{61}$ in formula (CII).

The content of repeating structural units (preferably represented by at least one of general formulae (IV) to (VI)) each having an alicyclic group represented by general formula (I), (II), or (III) in the resin according to the present invention is regulated while taking account of a balance among resistance to dry etching, alkali developability, etc. However, the content thereof is preferably 20% by mole or higher, more preferably from 30 to 80% by mole, most preferably from 40 to 65% by mole, based on all repeating units.

The content of repeating structural units (preferably represented by at least one of general formulae (VII) to (IX)) each having any of the above-described acid-decomposable groups in the resin according to the present invention is regulated while taking account of performances such as alkali developability and adhesion to substrates. However, the content thereof is preferably from 5 to 80% by mole, more preferably from 10 to 70% by mole, most preferably from 20 to 60% by mole, based on all repeating units. The above content of repeating structural units containing acid-decomposable groups means the amount in the resin of all repeating structural units containing any acid-decomposable groups, including those contained in the repeating structural units each having a group represented by general formula (I), (II), or (III).

Monomers corresponding to the repeating units according to the present invention can be synthesized generally by the esterification reaction of, e.g., alcohols each having in the molecule a partial structure represented by general formula (I), (II), or (III) with a carboxylic acid or a derivative thereof each having a polymerizable functional group in the molecule, or by reacting such alcohols with an imide. A polymer containing the repeating units according to the present invention can be obtained by polymerizing corresponding monomers using a general free-radical initiator, e.g., an azo initiator. Alternatively, the polymer may be obtained by subjecting the monomers to cationic polymerization or anionic polymerization in an ordinary manner. If desired and necessary, the polymer obtained may be treated to convert its functional groups to another kind of functional groups.

Specific examples of the repeating structural units represented by general formulae (IV) to (VI) are shown below as (a1) to (a131). However, the present invention should not be construed as being limited thereto.

(a1) 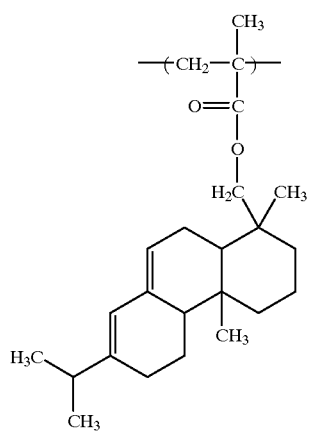
(a2) 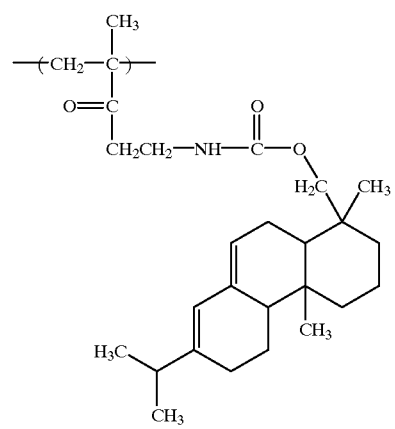
(a3) 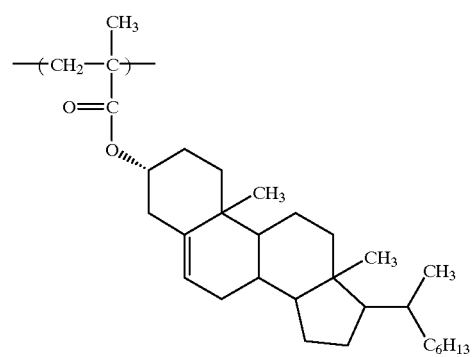
(a4) 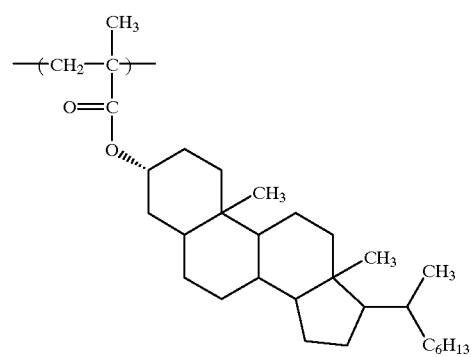
(a5) 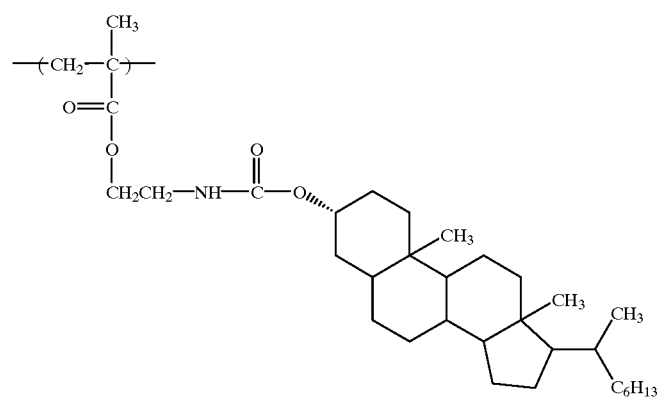
(a6) 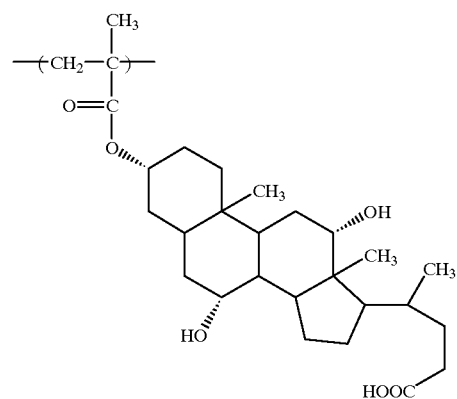
(a7) 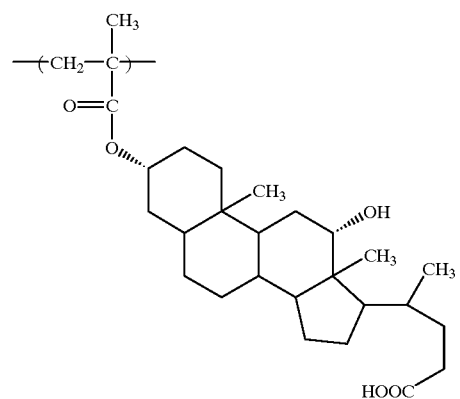

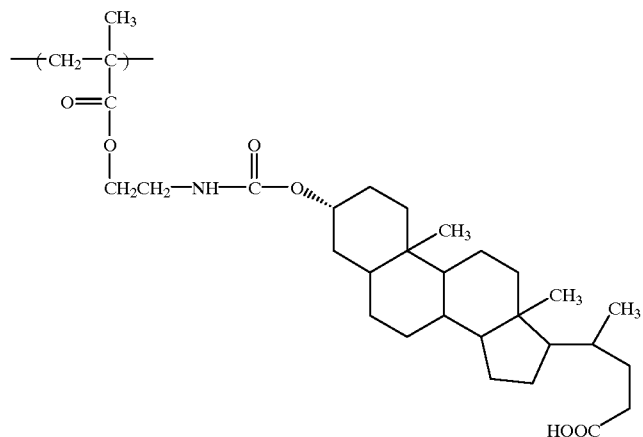
(a8)
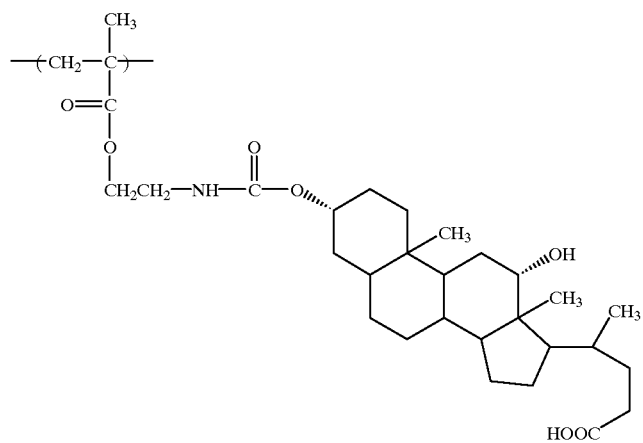
(a9)
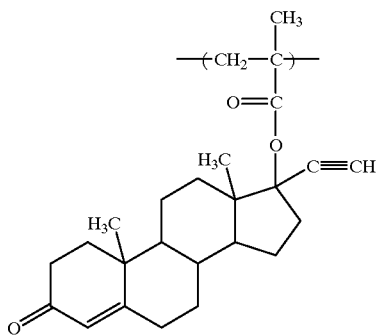
(a10)

(a11)
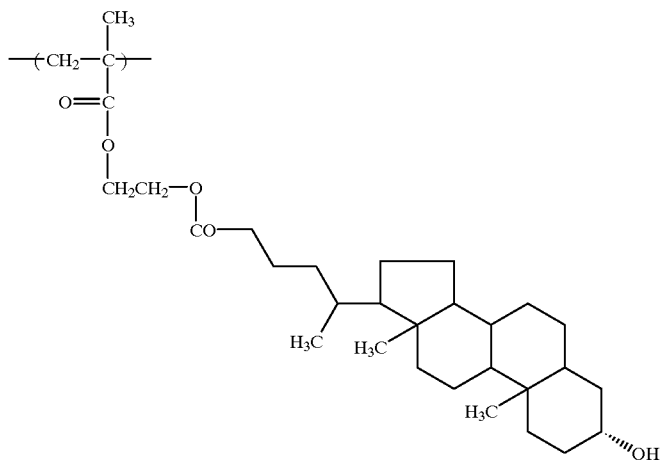
(a12)
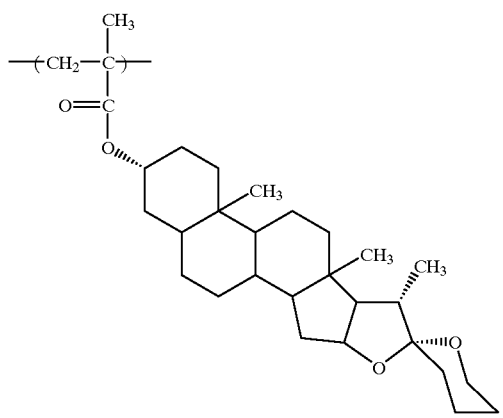
(a13)
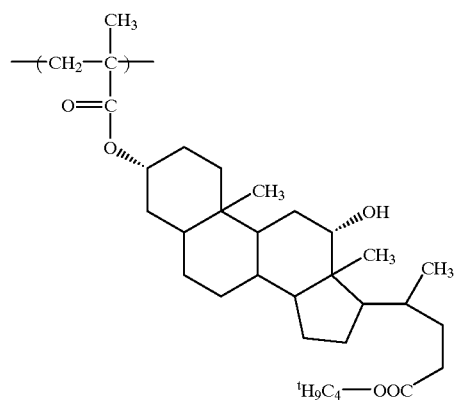
(a14)
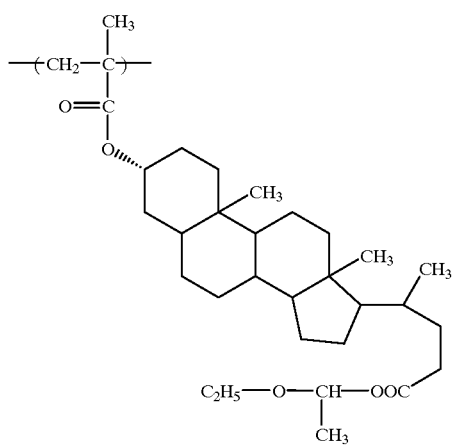

-continued
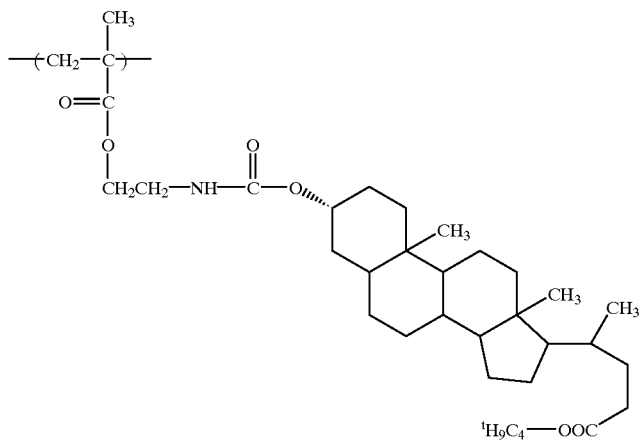
(a15)
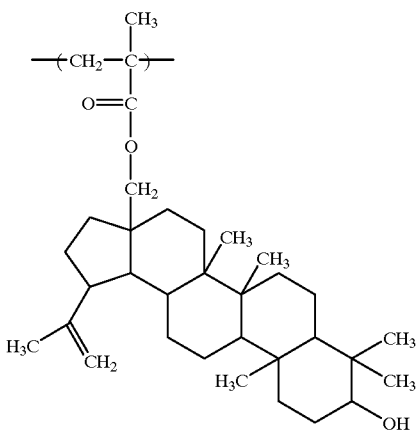
(a16)
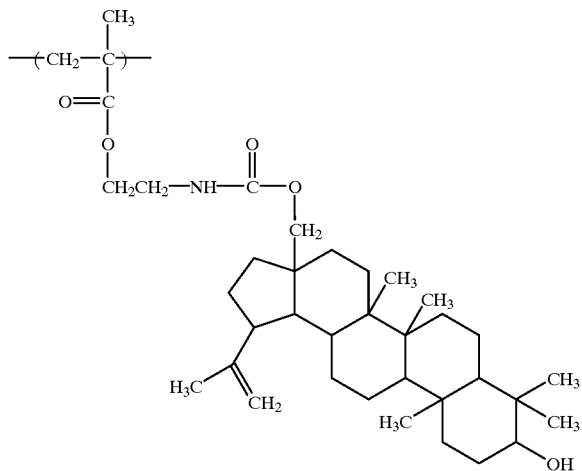
(a17)

(a18)
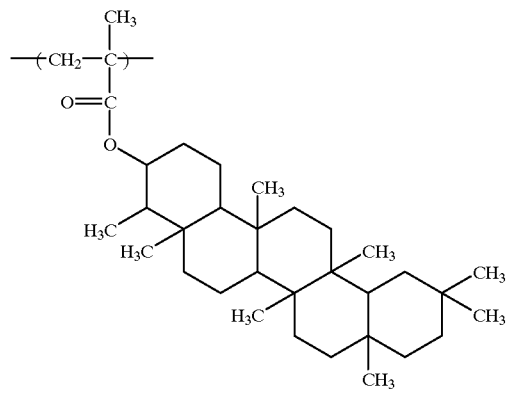
(a19)
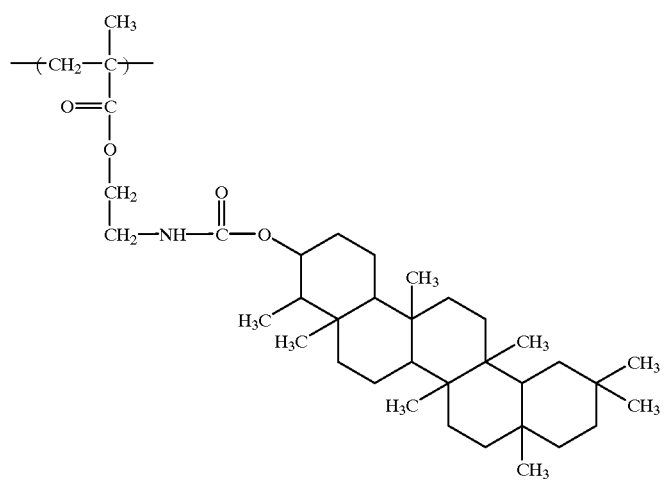
(a20)
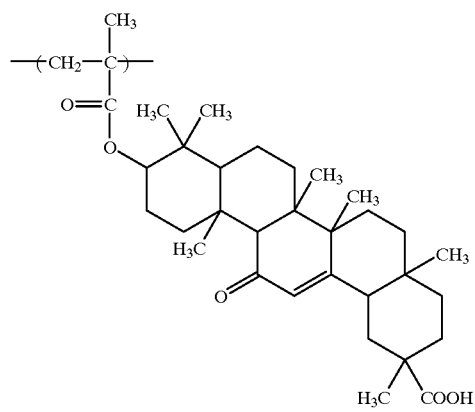

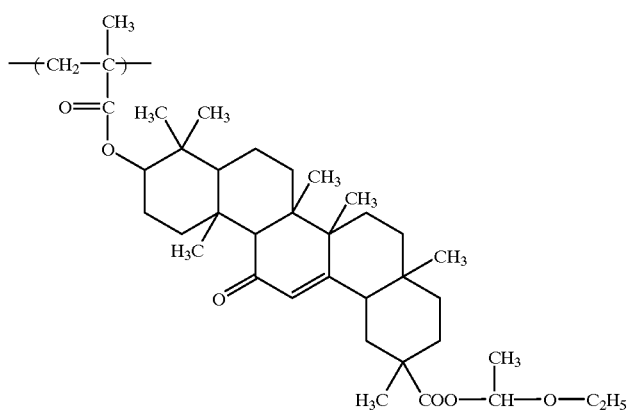
(a21)
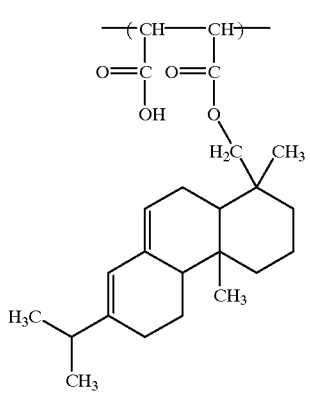
(a22)
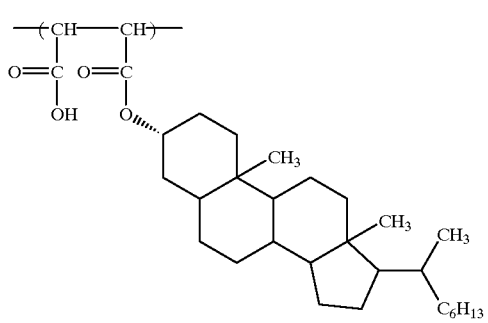
(a23)
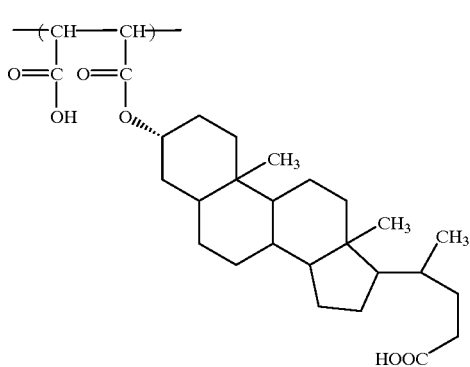
(a24)
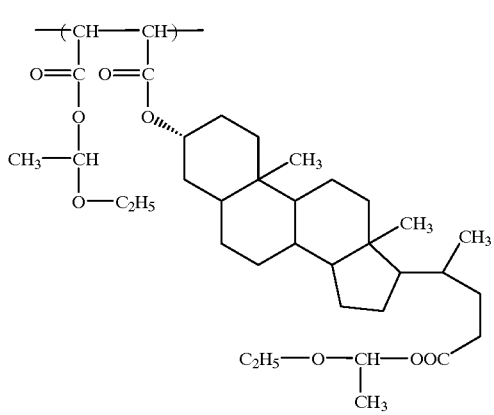
(a25)
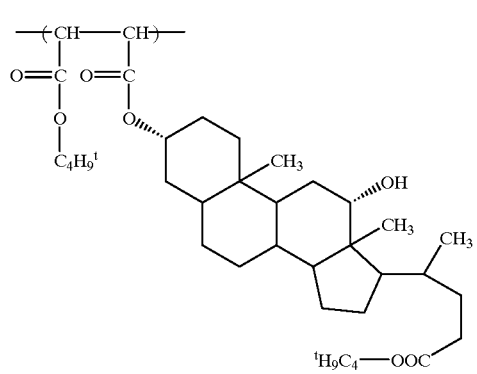
(a26)
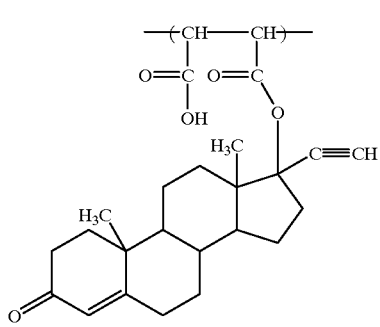
(a27)

-continued
(a28) 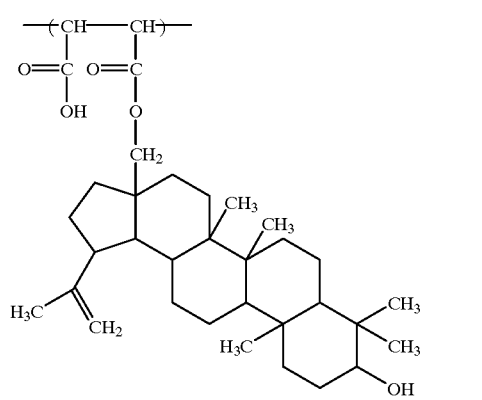
(a29) 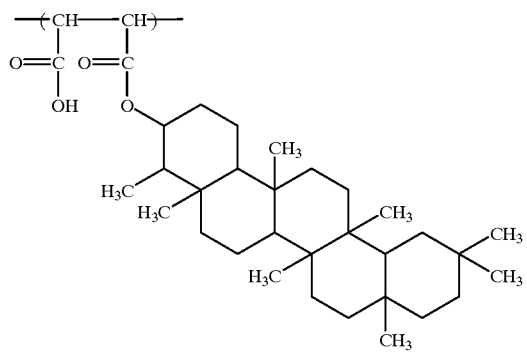
(a30) 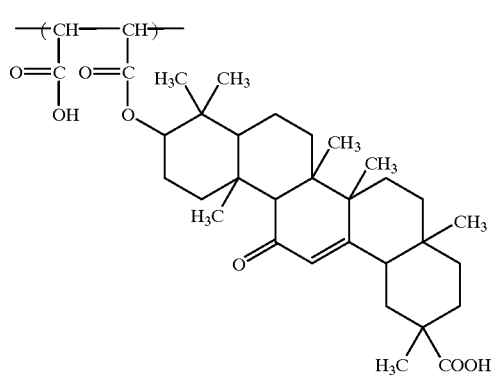
(a31) 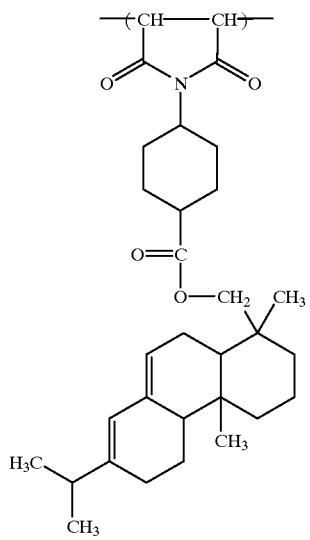
(a32) 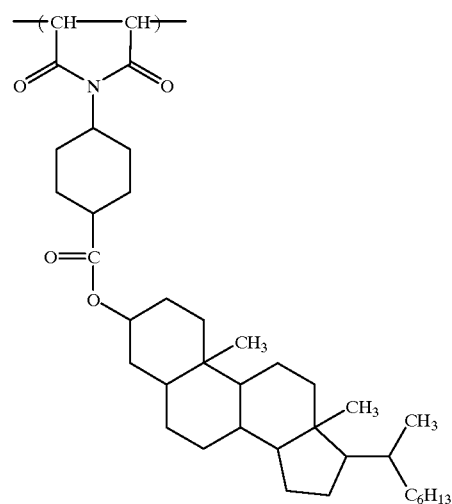
(a33) 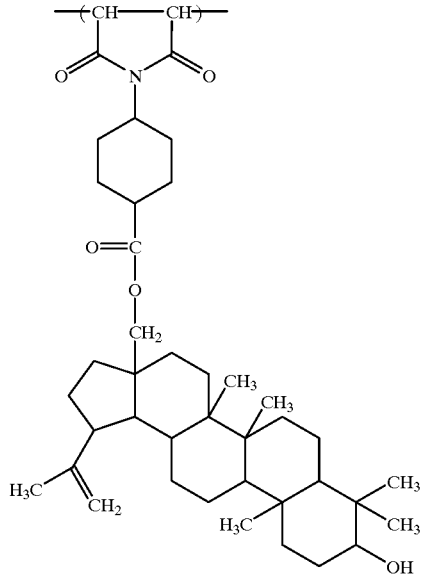

-continued
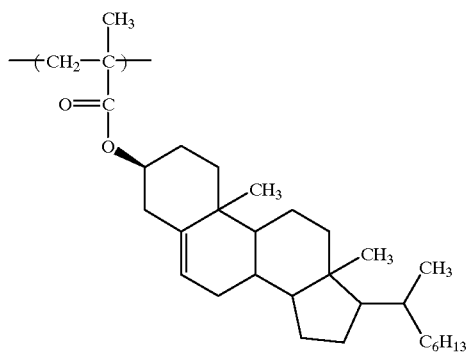 (a34)
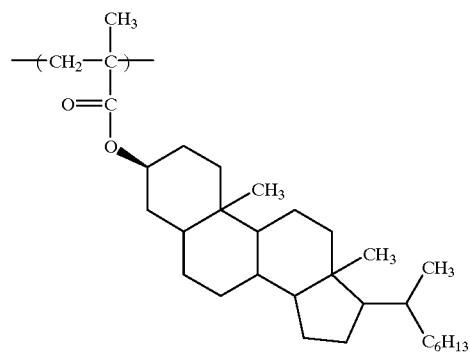 (a35)
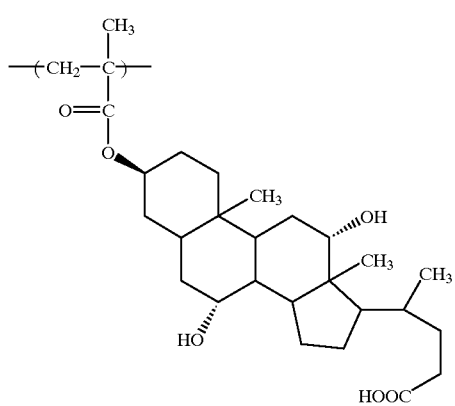 (a36)
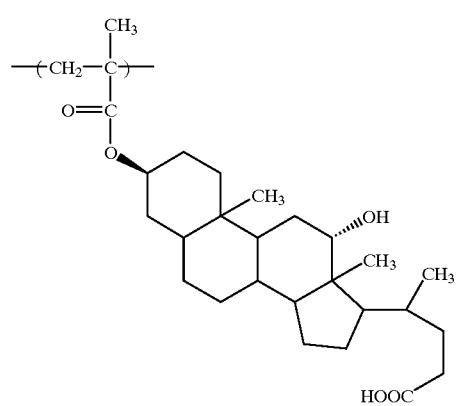 (a37)
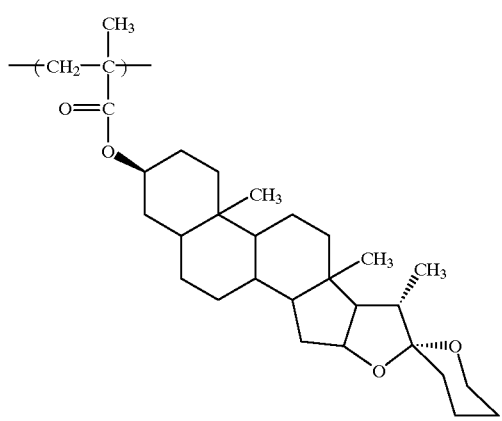 (a38)
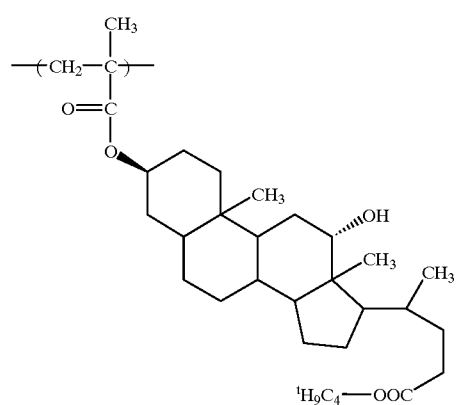 (a39)
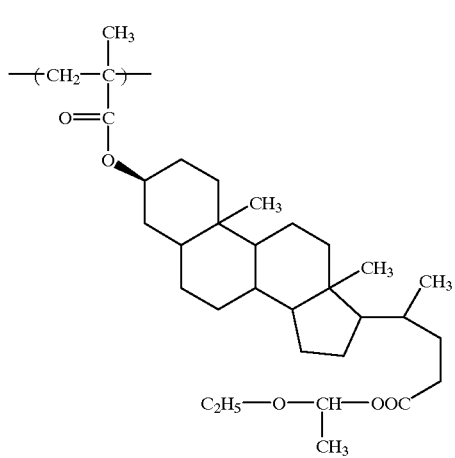 (a40)
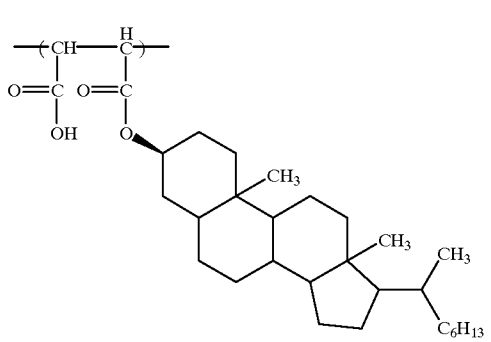 (a41)

-continued
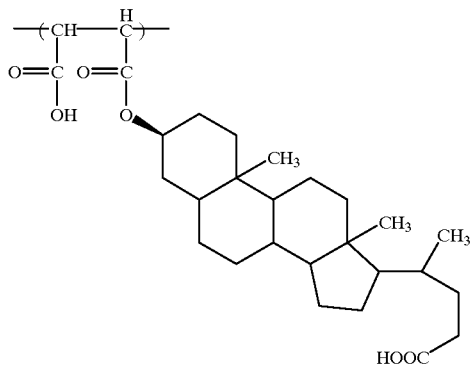
(a42)
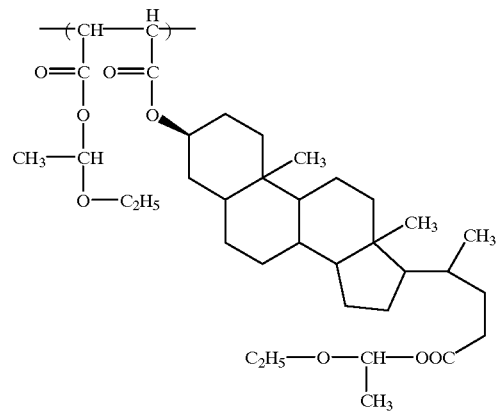
(a43)
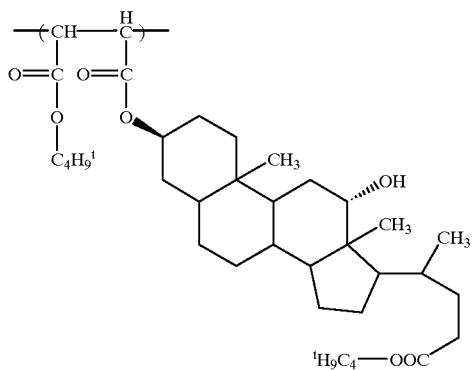
(a44)
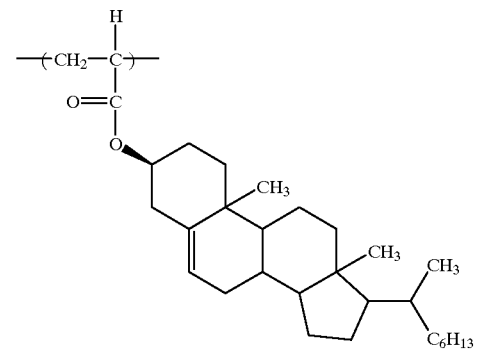
(a45)
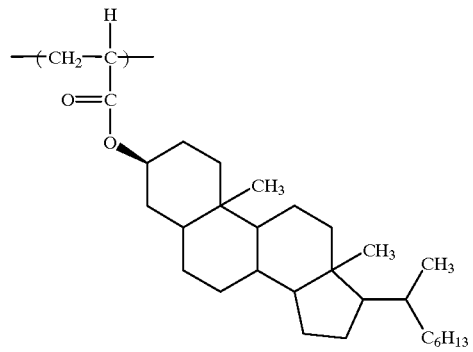
(a46)
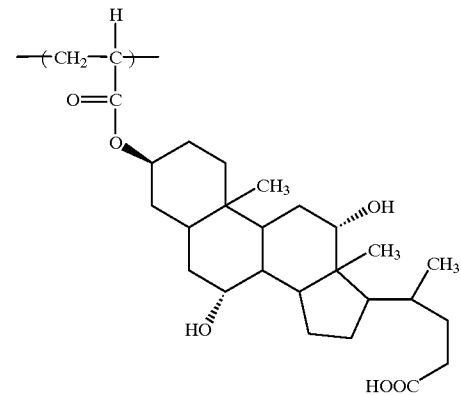
(a47)
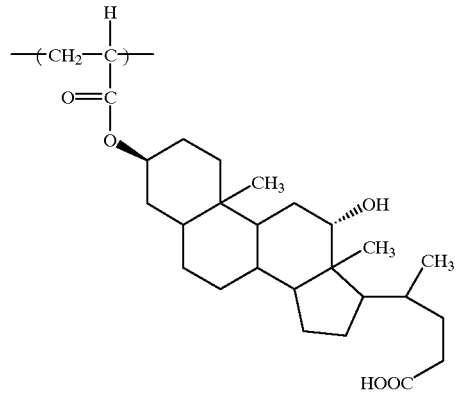
(a48)
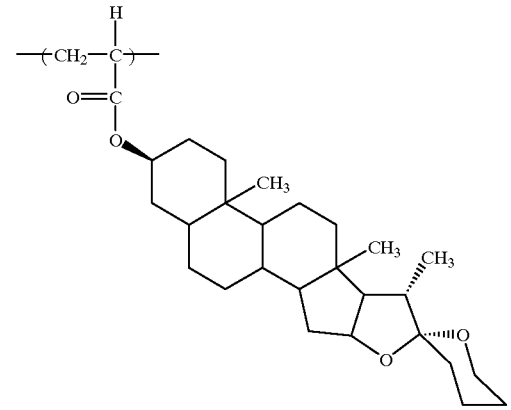
(a49)

-continued
(a50)
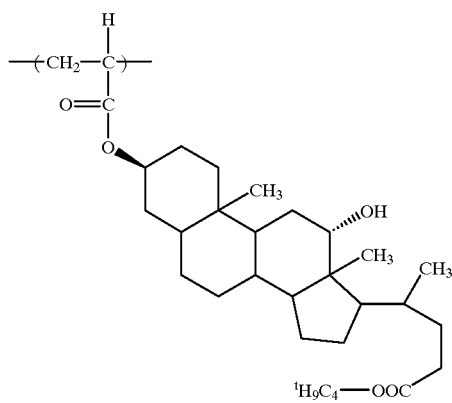
(a51)
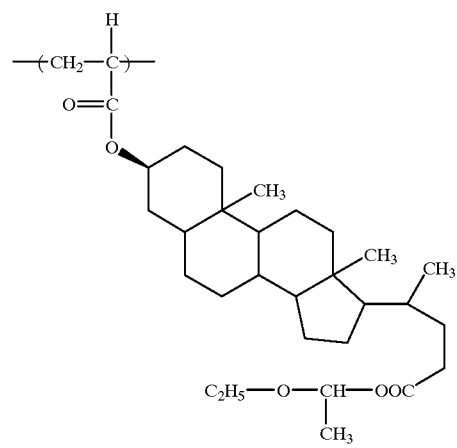
(a52)
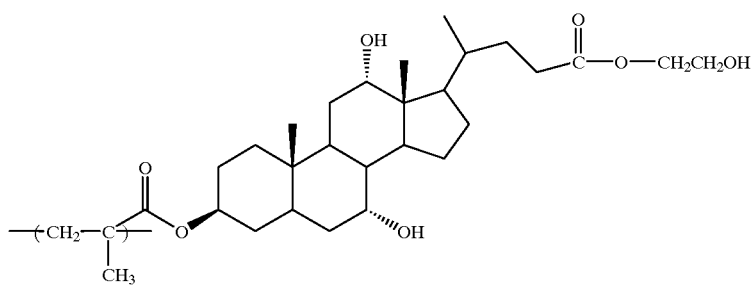
(a53)
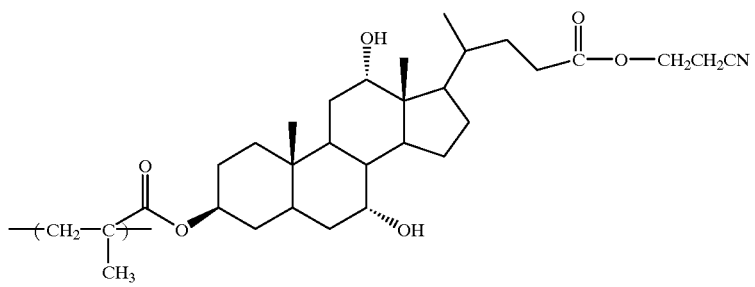
(a54)
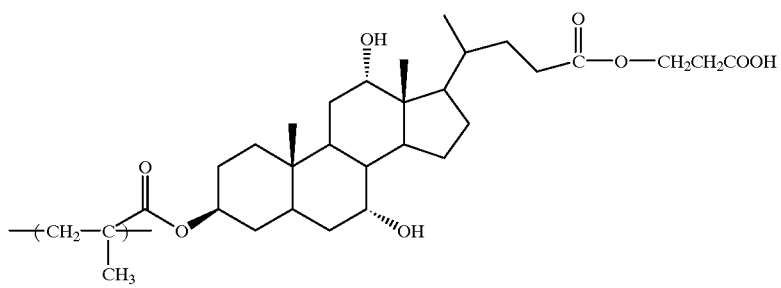
(a55)
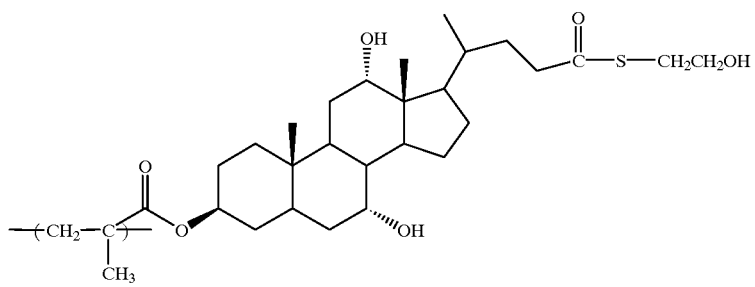

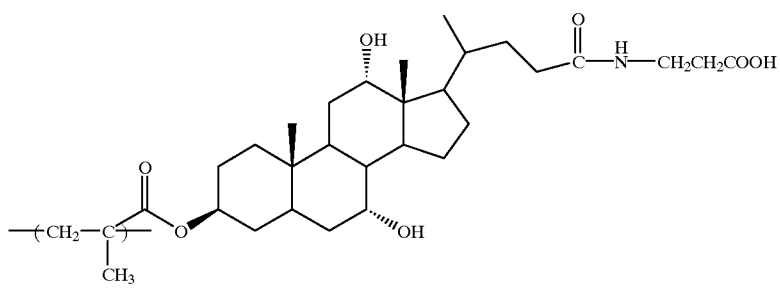
(a56)
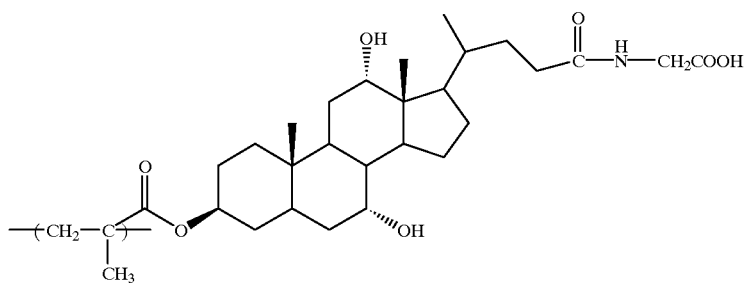
(a57)
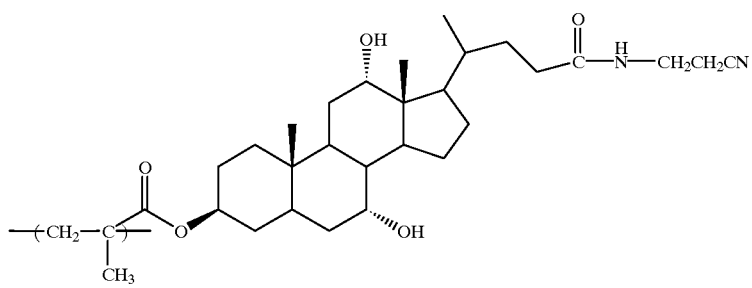
(a58)
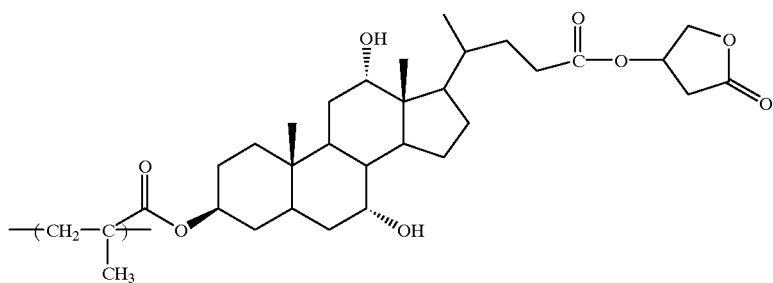
(a59)
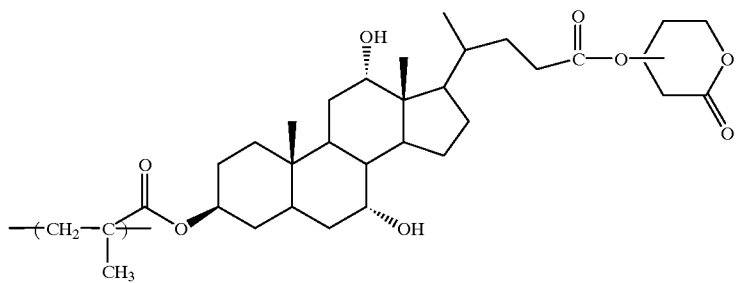
(a60)

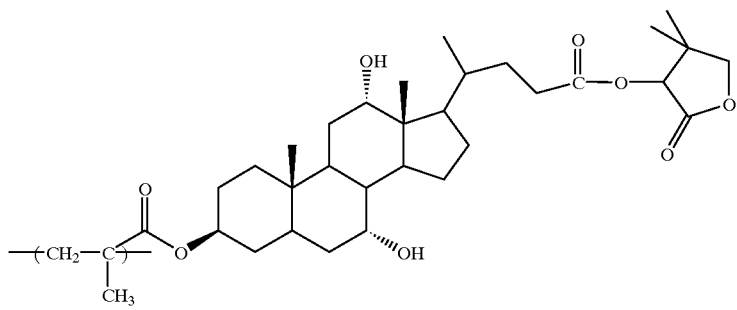
(a61)
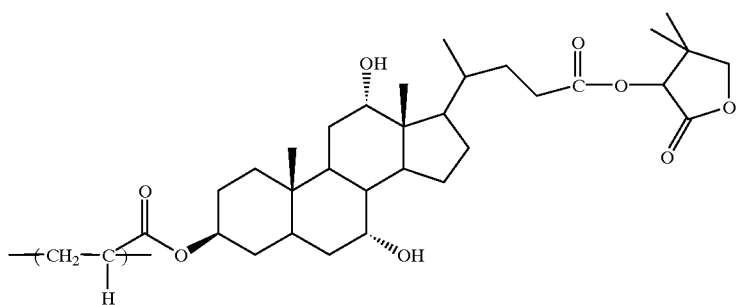
(a62)
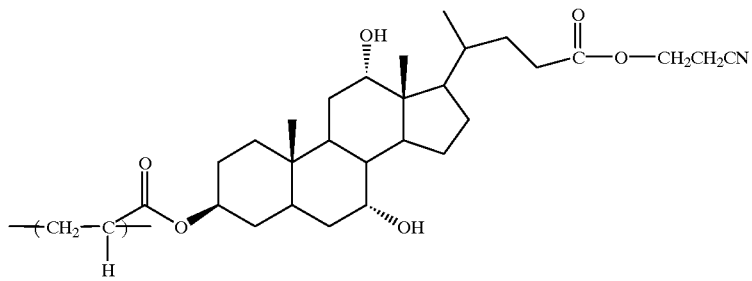
(a63)
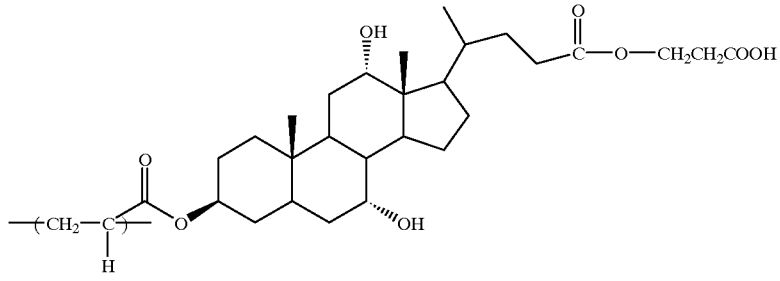
(a64)
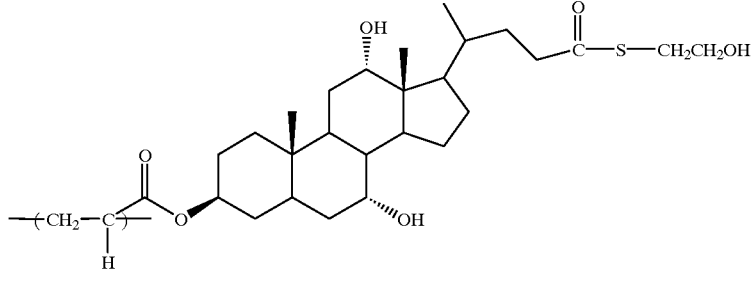
(a65)

(a66)
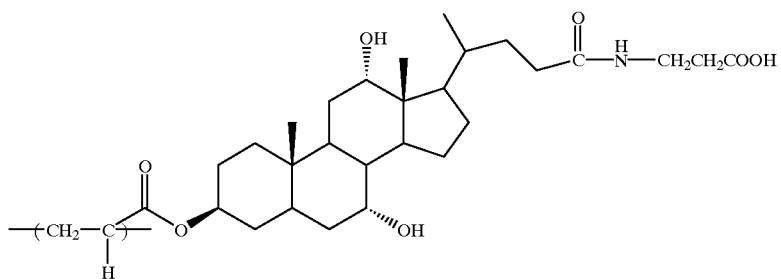
(a67)
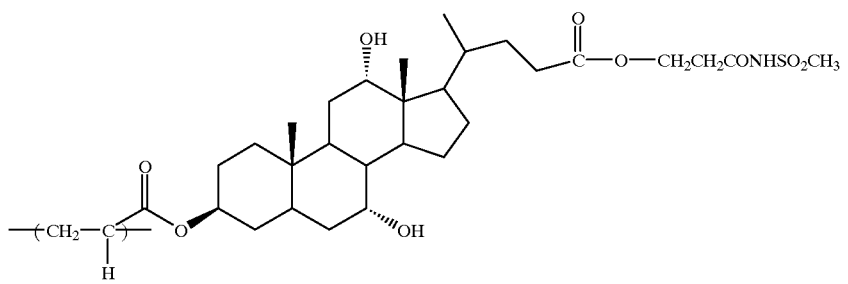
(a68)
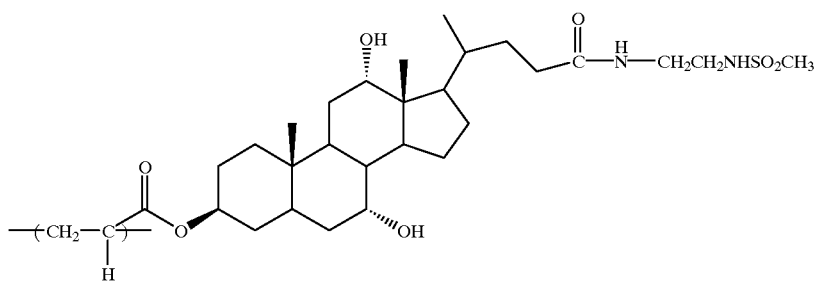
(a69)
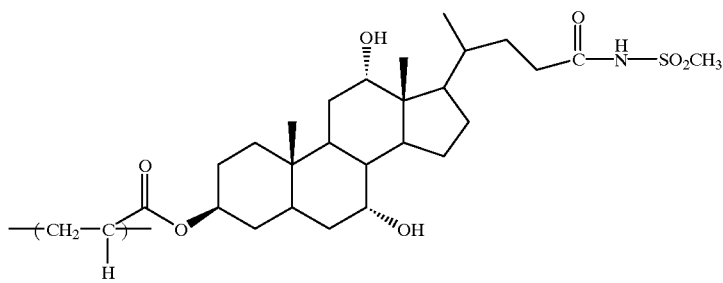
(a70)
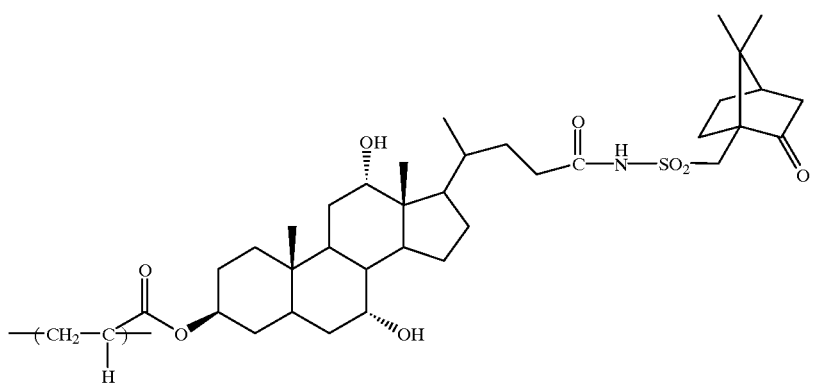

-continued
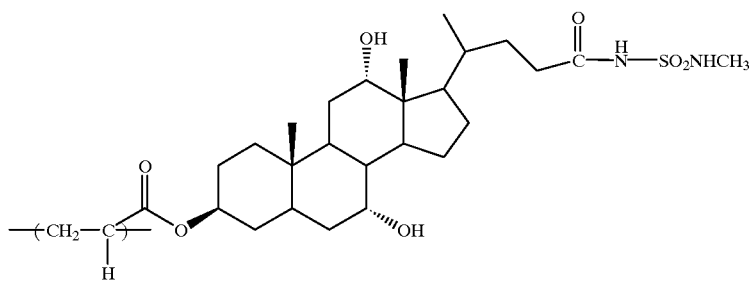
(a71)
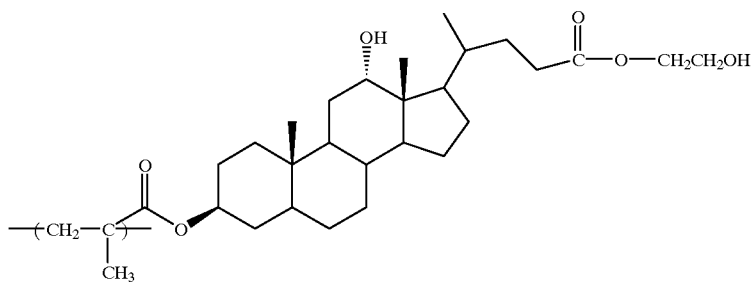
(a72)
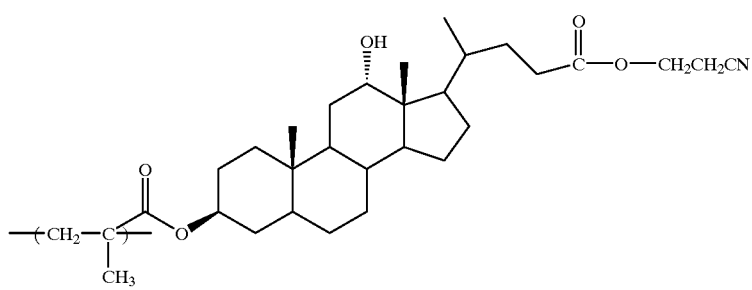
(a73)
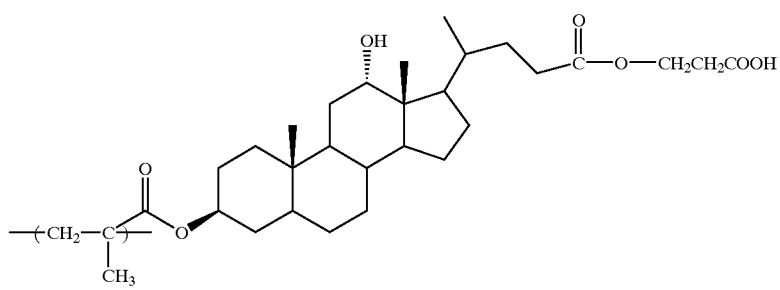
(a74)
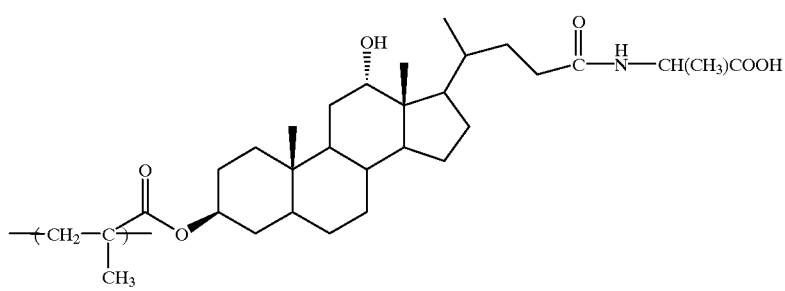
(a75)

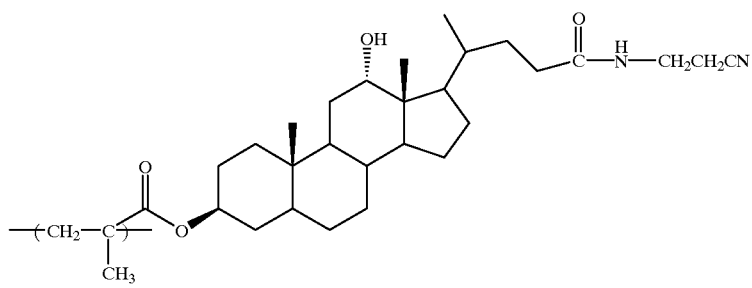
(a76)
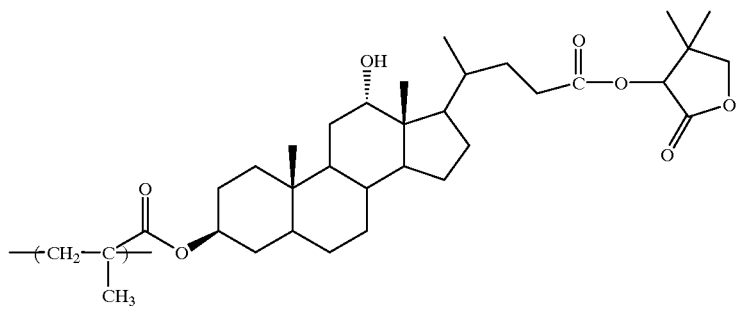
(a77)
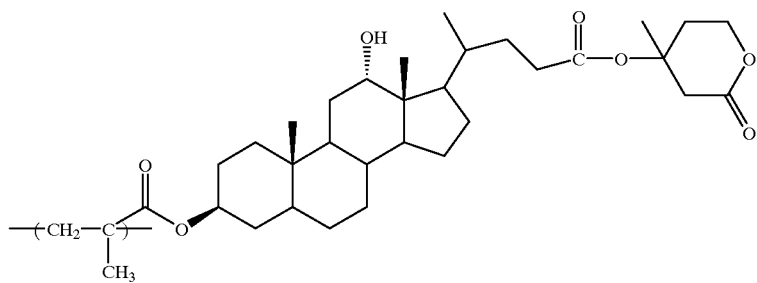
(a78)
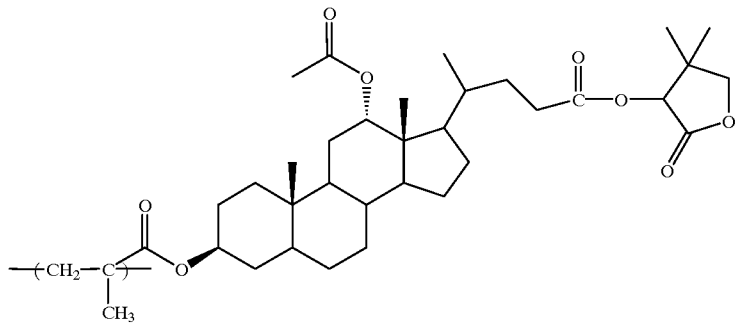
(a79)
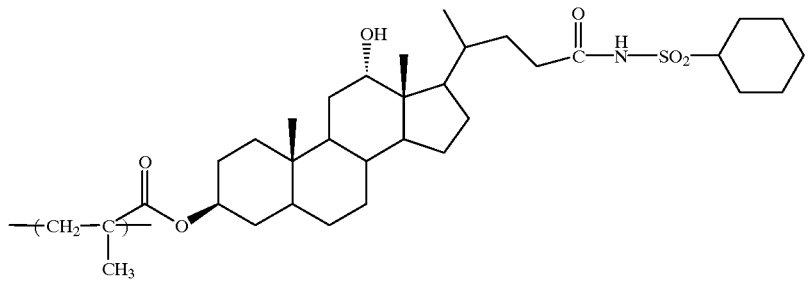
(a80)

-continued
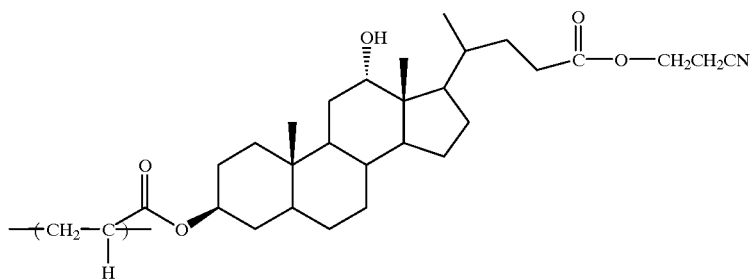
(a81)
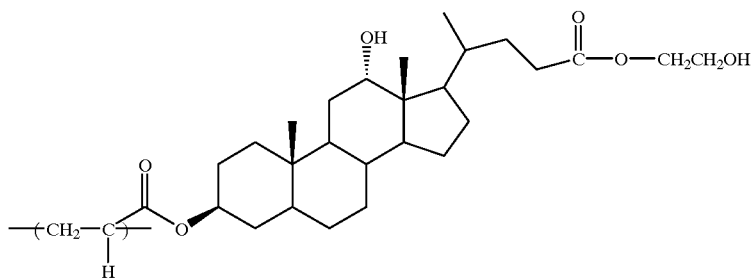
(a82)
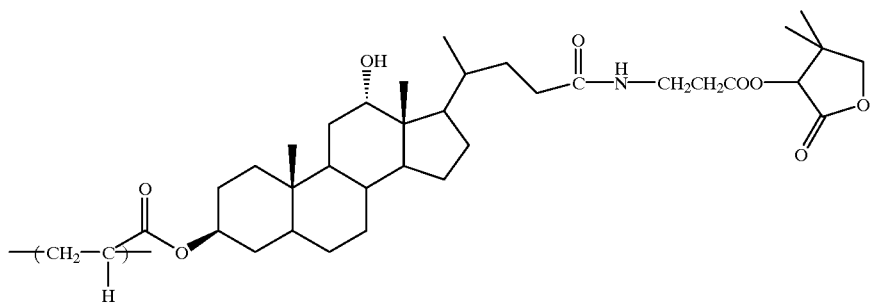
(a83)
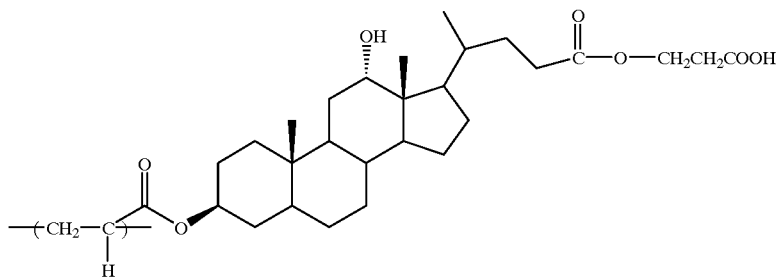
(a84)
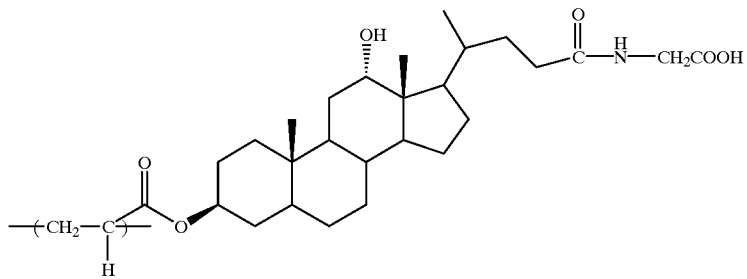
(a85)

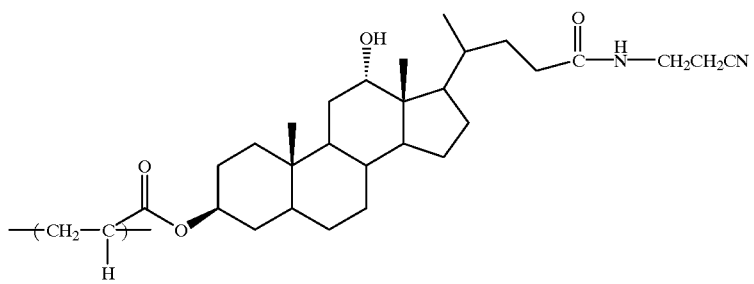
(a86)
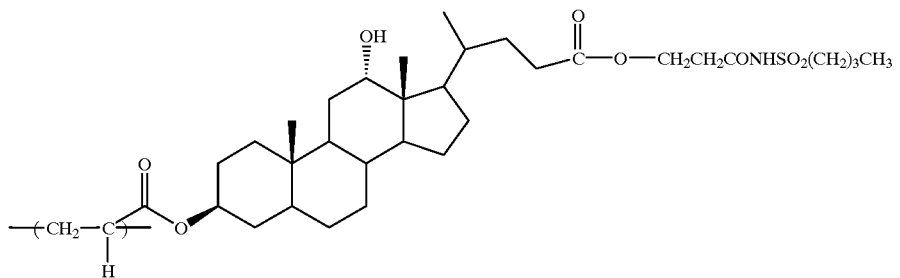
(a87)
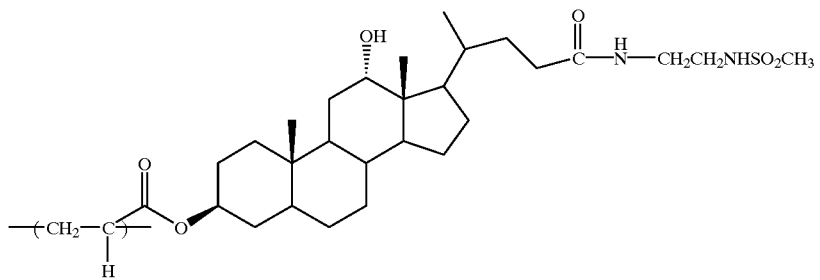
(a88)
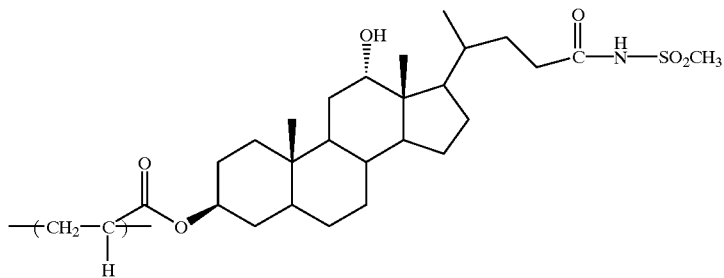
(a89)
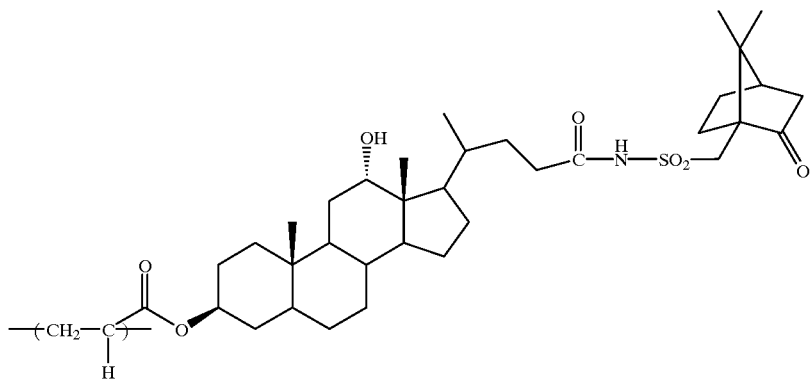
(a90)

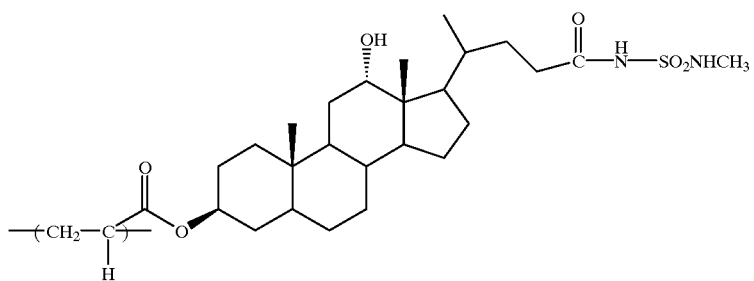
(a91)
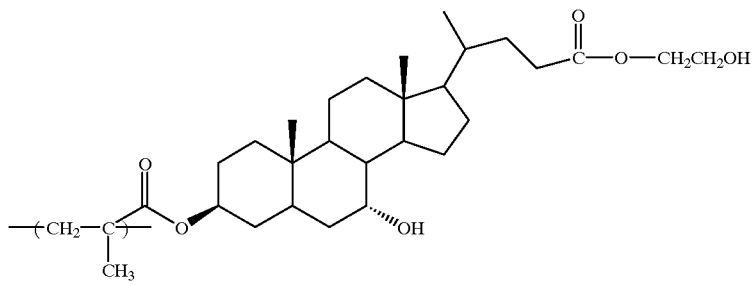
(a92)
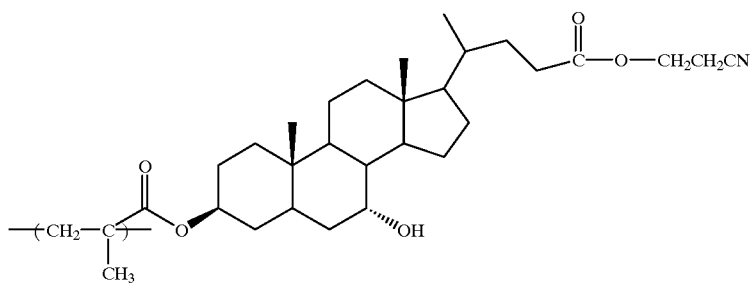
(a93)
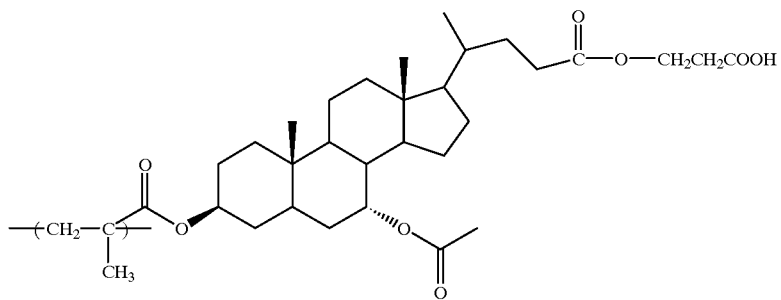
(a94)
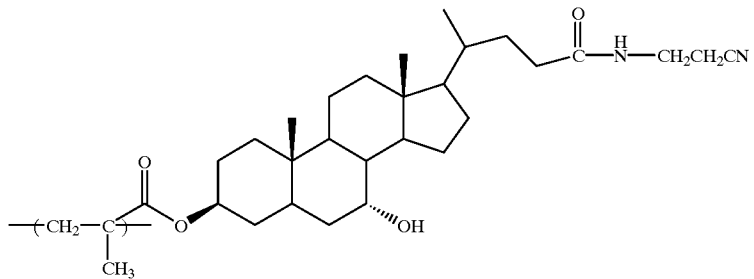
(a95)

-continued
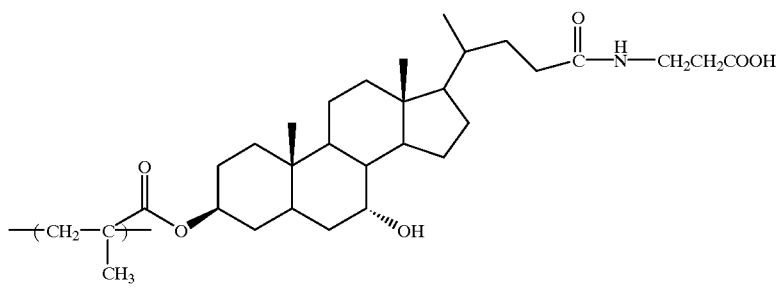
(a96)
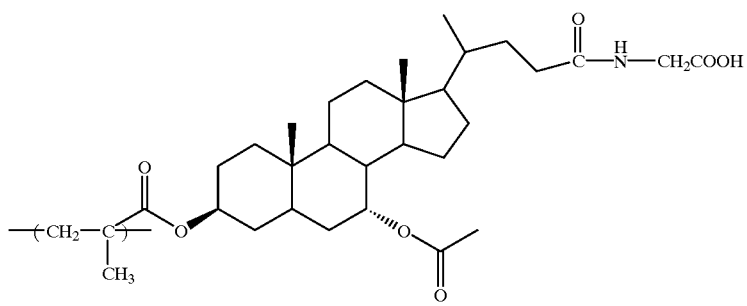
(a97)
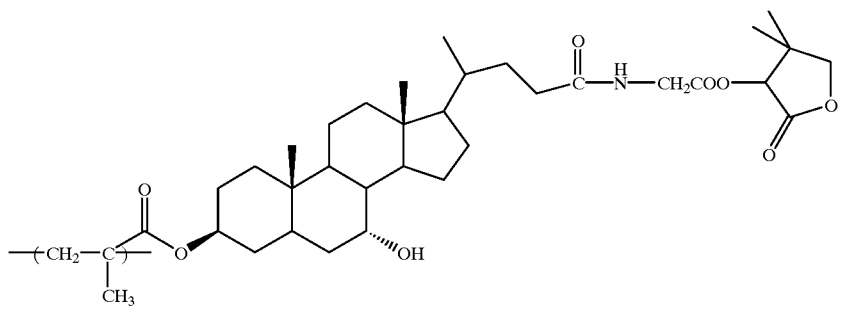
(a98)
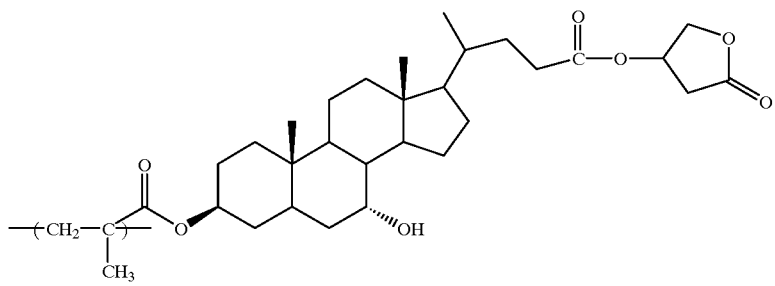
(a99)
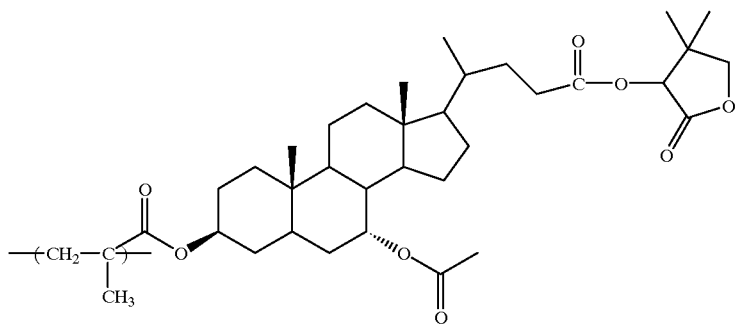
(a100)

(a101)
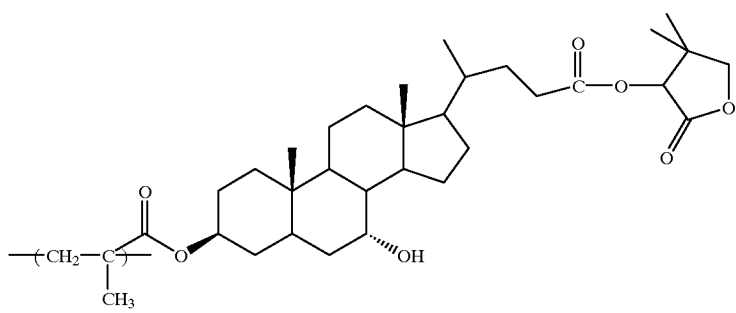
(a102)
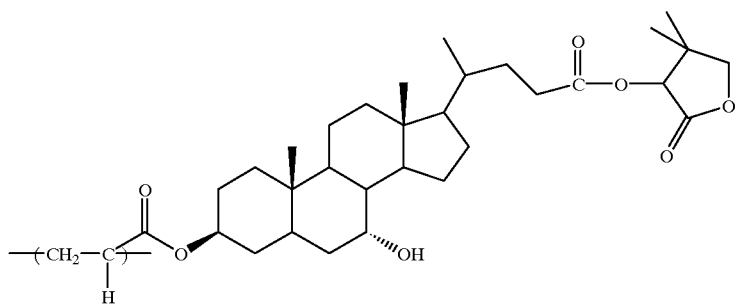
(a103)
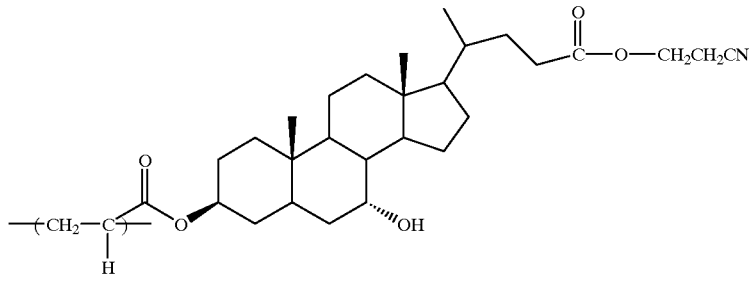
(a104)
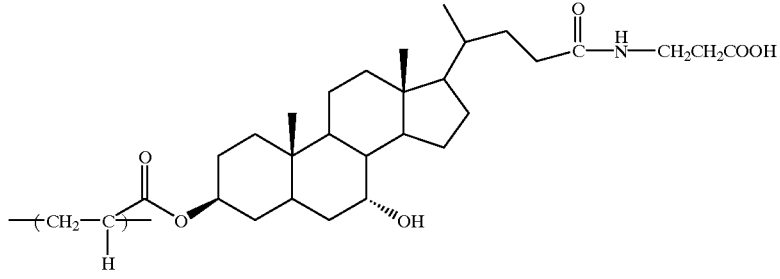
(a105)
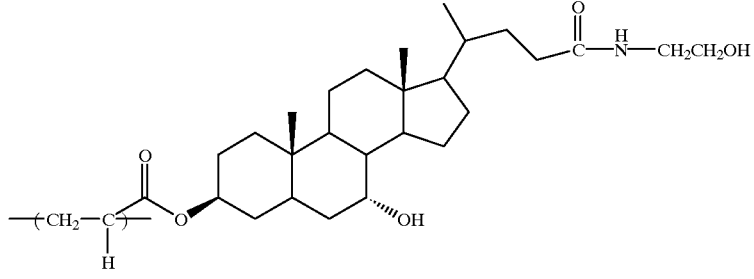

(a106)
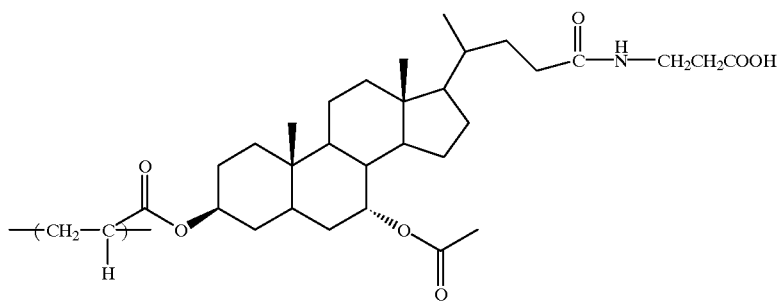
(a107)
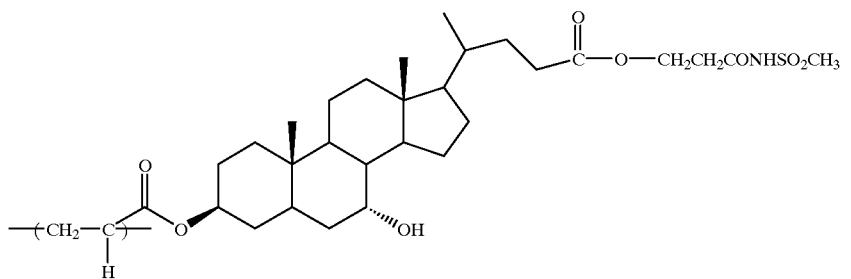
(a108)
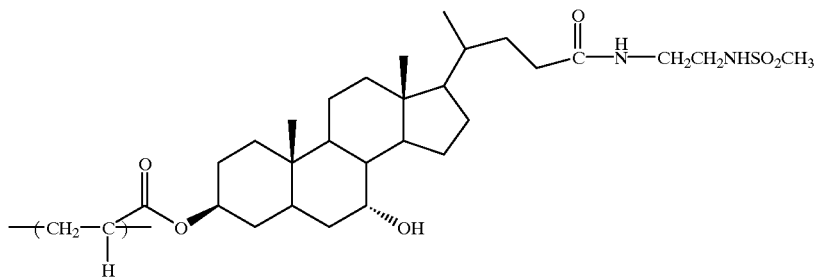
(a109)
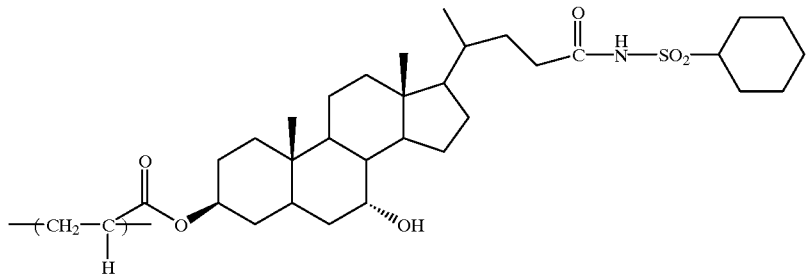
(a110)
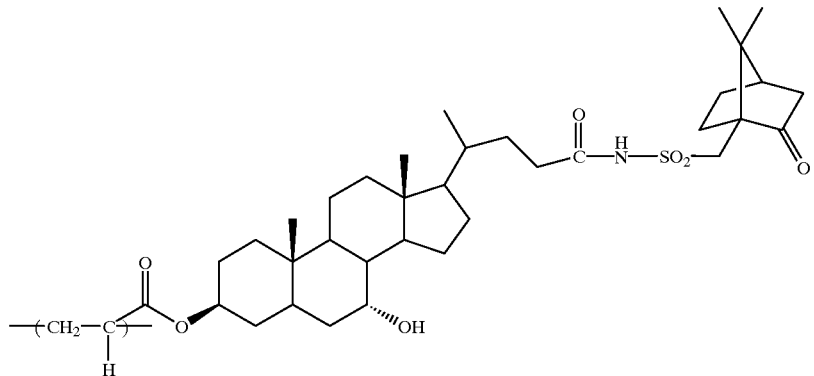

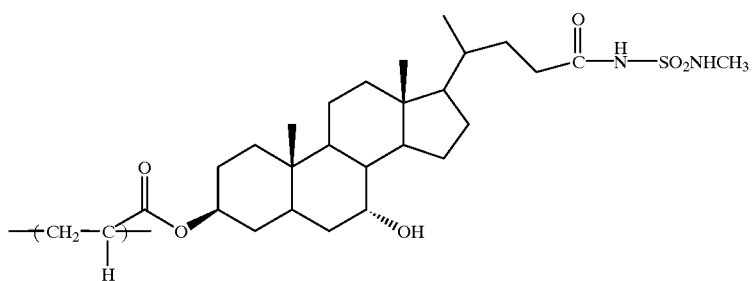
(a111)
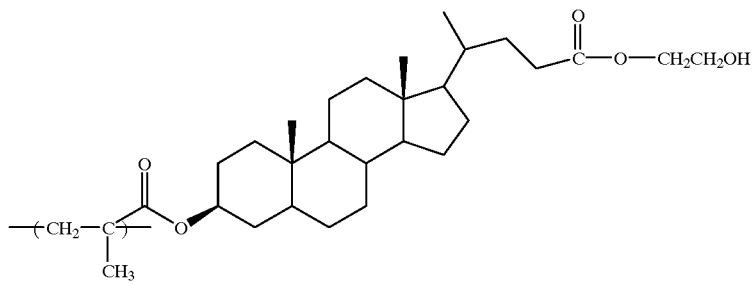
(a112)
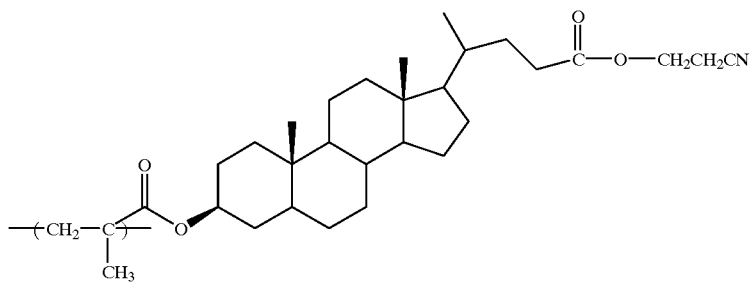
(a113)
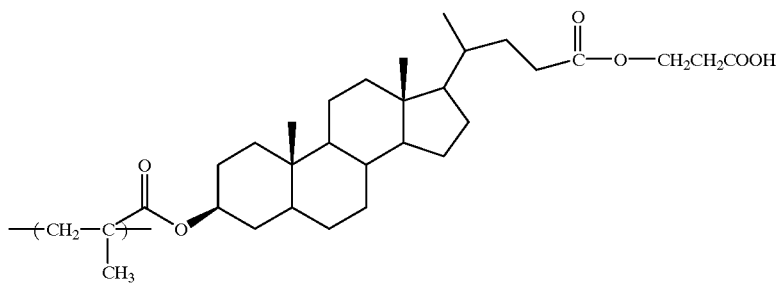
(a114)
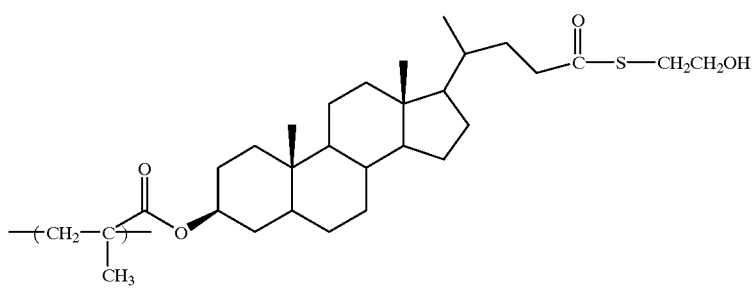
(a115)

-continued
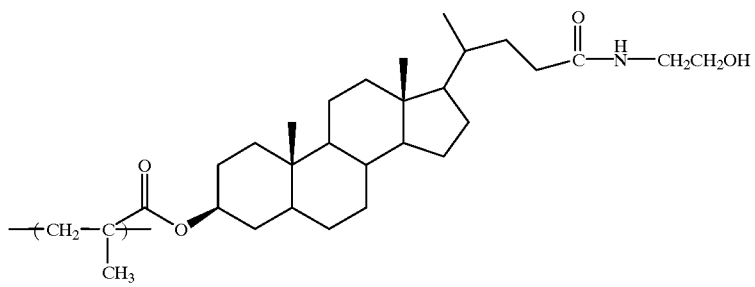
(a116)
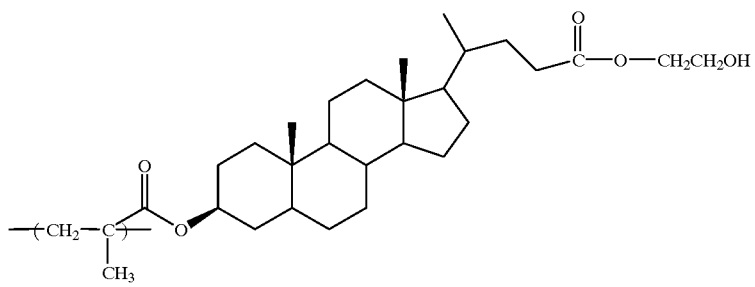
(a117)
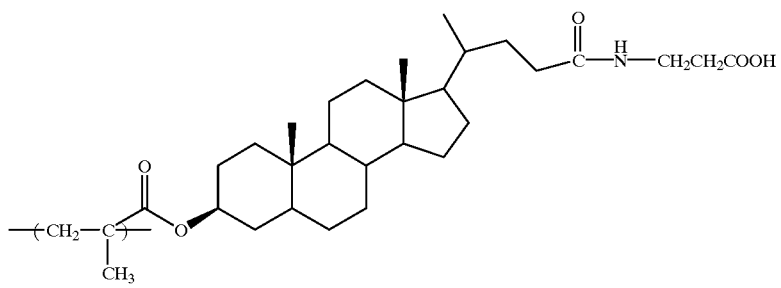
(a118)
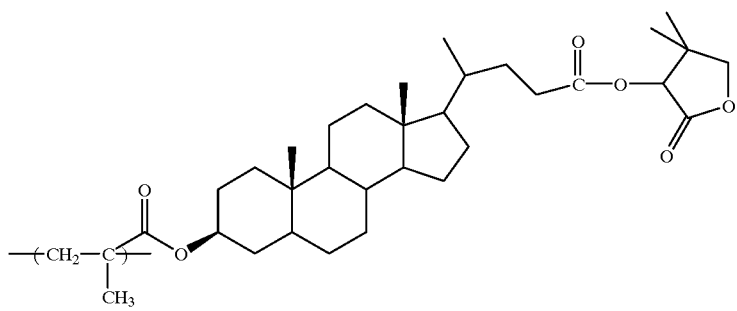
(a119)
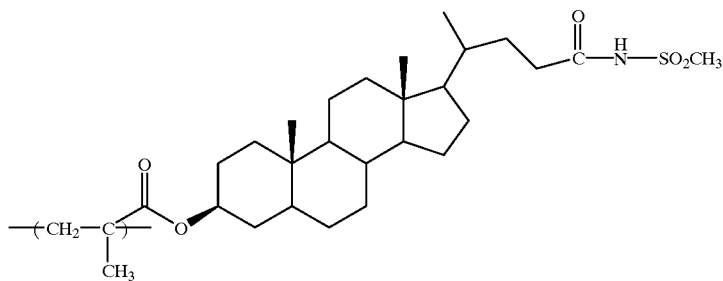
(a120)

-continued
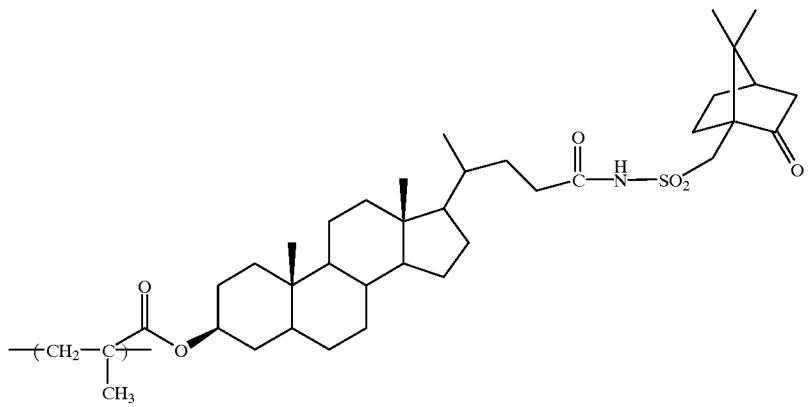
(a121)
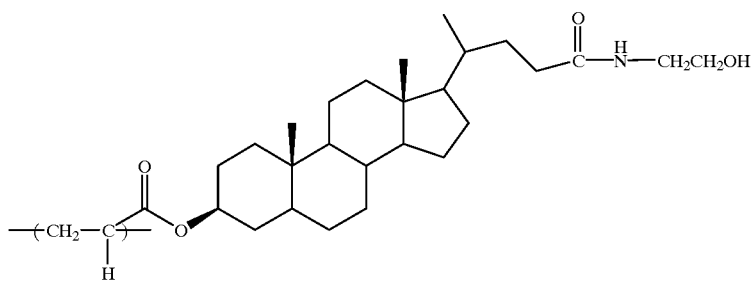
(a122)
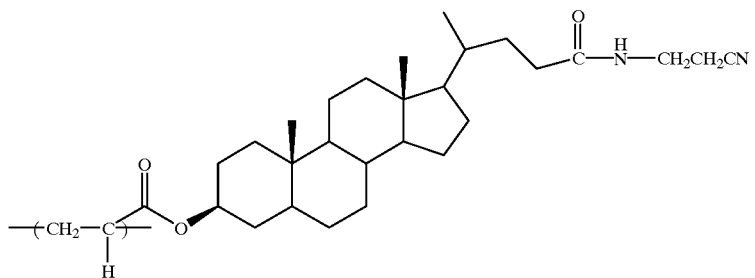
(a123)
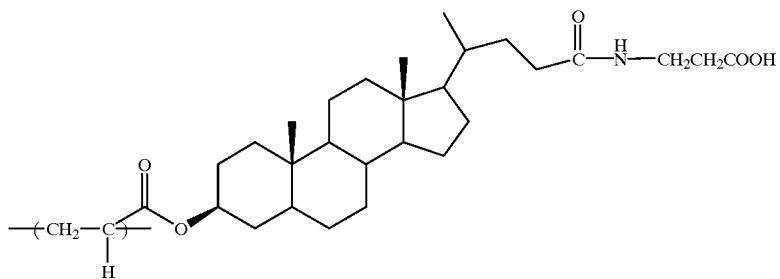
(a124)
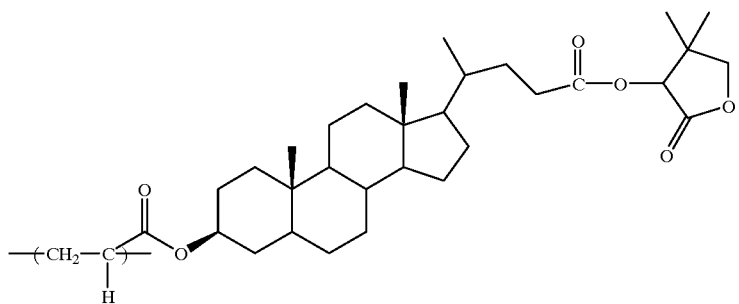
(a125)

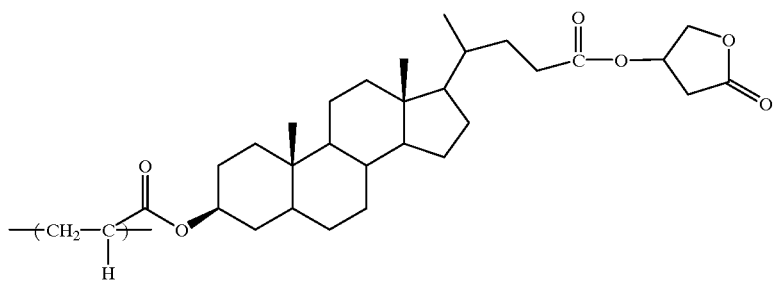
(a126)
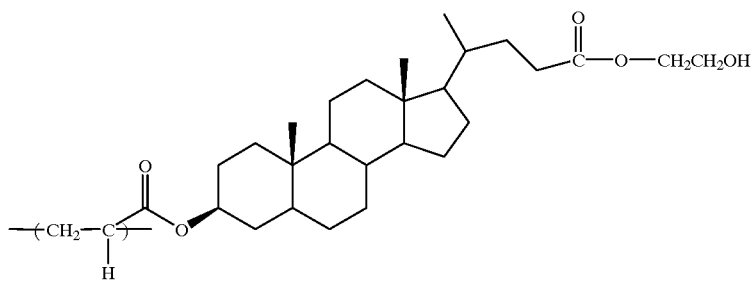
(a127)
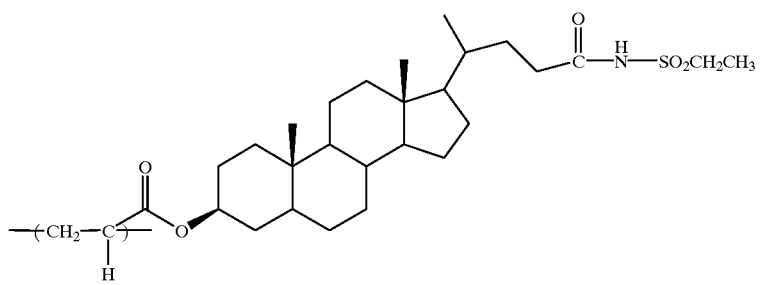
(a128)
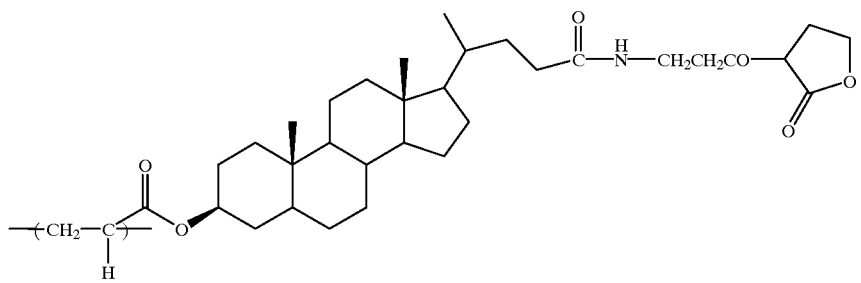
(a129)
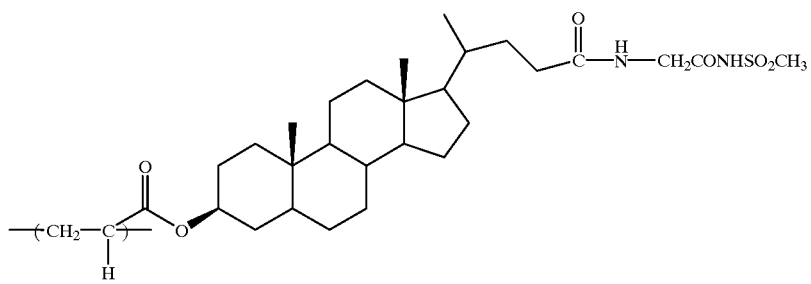
(a130)

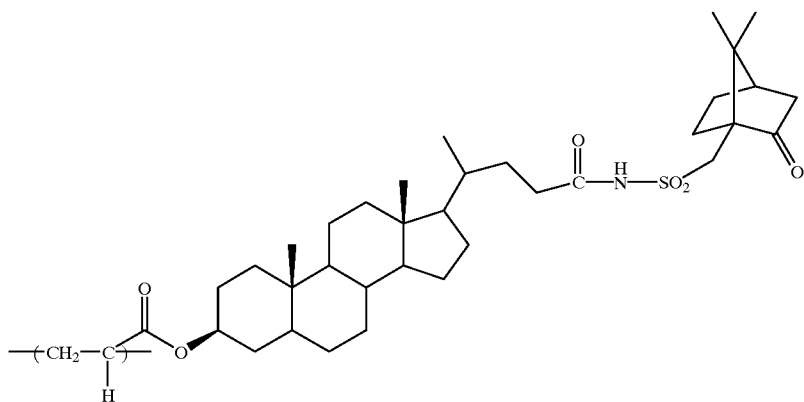
(a131)
Specific examples of the repeating structural units represented by general formulae (VII) to (XI) as repeating units each having an acid-decomposable group are shown below as (b1) to (b42) and (b-43) to (b-122). However, the present invention should not be construed as being limited thereto.
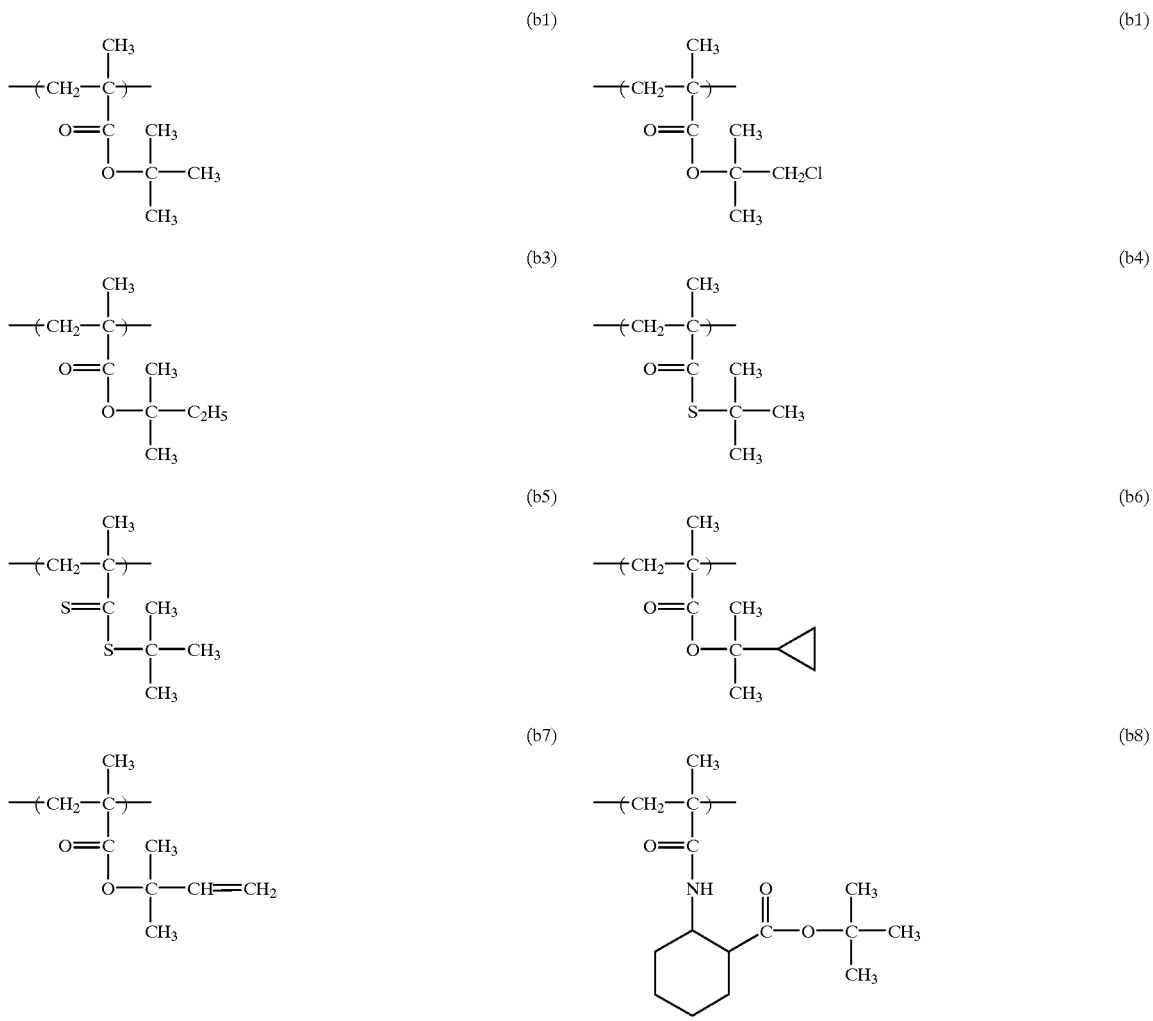

(b9) 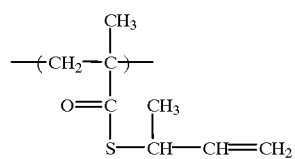
(b10) 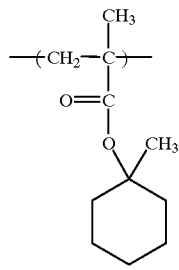
(b11) 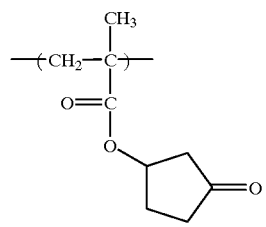
(b12) 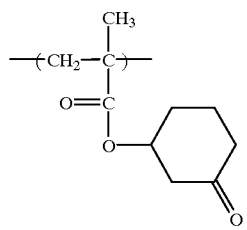
(b13) 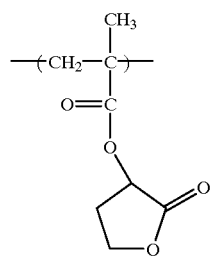
(b14) 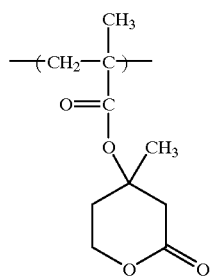
(b15) 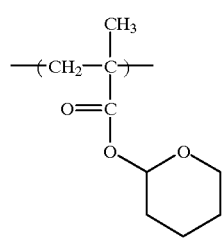
(b16) 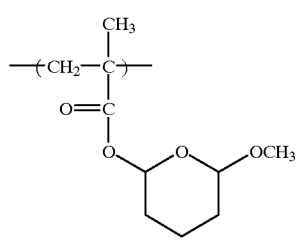
(b17) 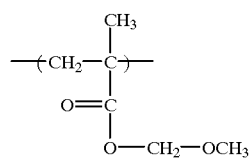
(b18) 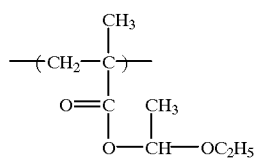
(b19) 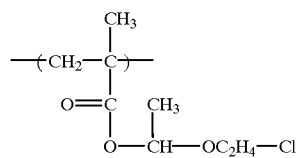
(b20) 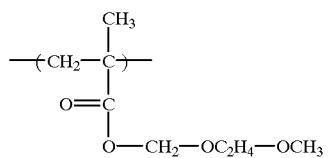
(b21) 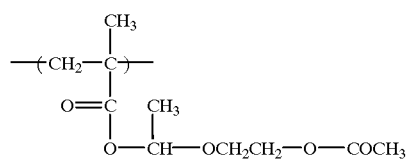
(b22) 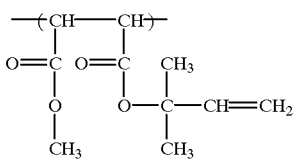

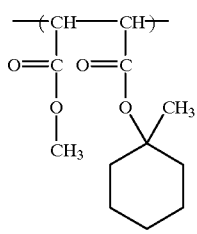 (b23)
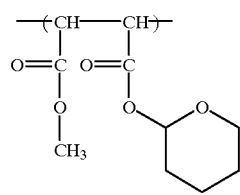 (b24)
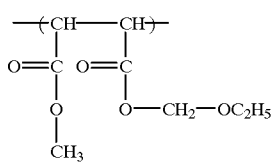 (b25)
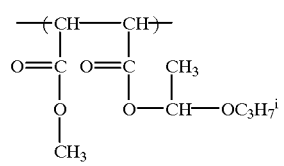 (b26)
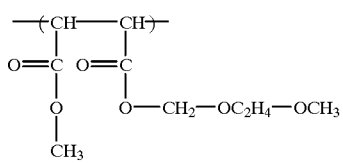 (b27)
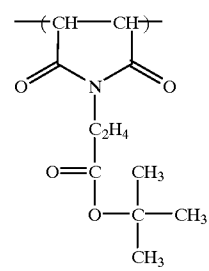 (b28)
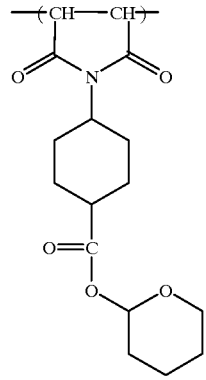 (b29)
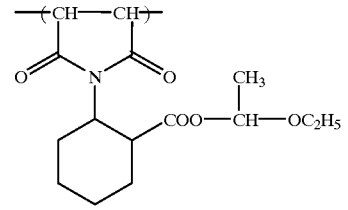 (b30)
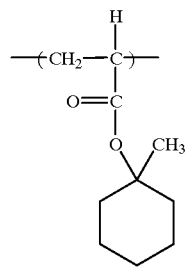 (b31)
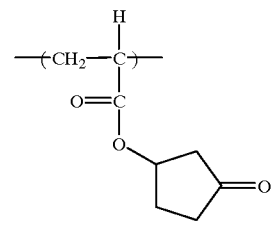 (b32)

(b33) 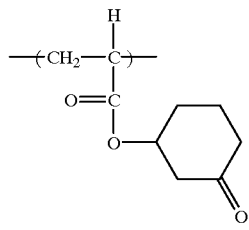
(b34) 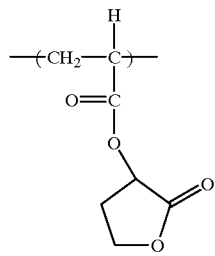
(b35) 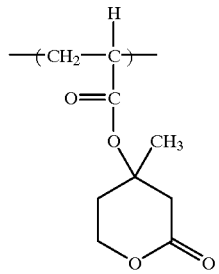
(b36) 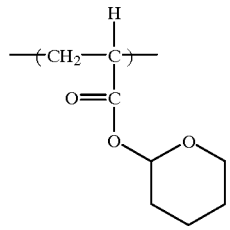
(b37) 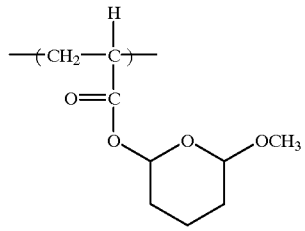
(b38) 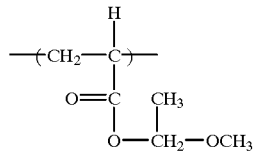
(b39) 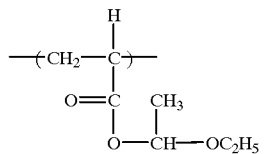
(b40) 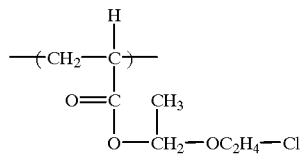
(b41) 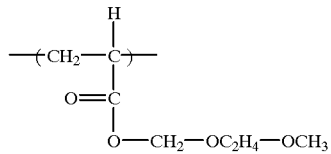
(b42) 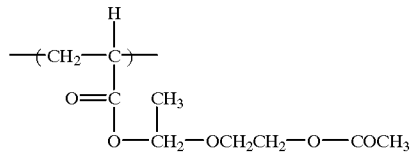
(b-43) 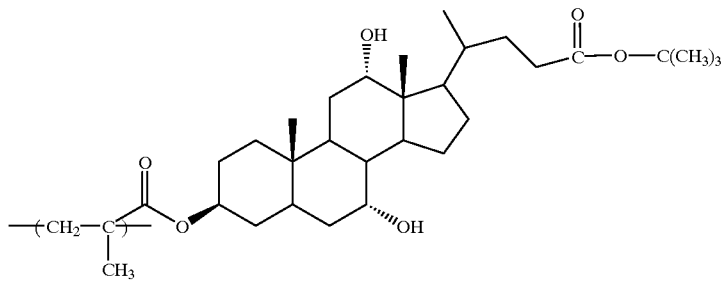

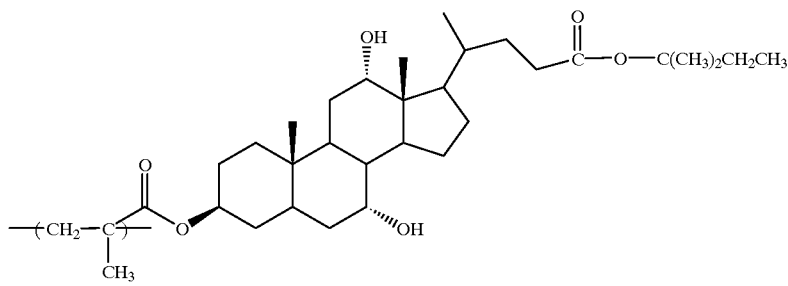
(b-44)
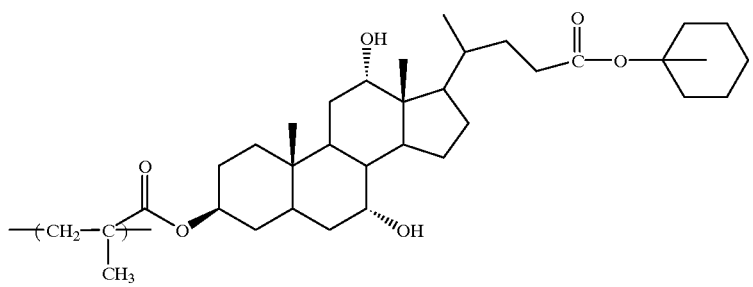
(b-45)
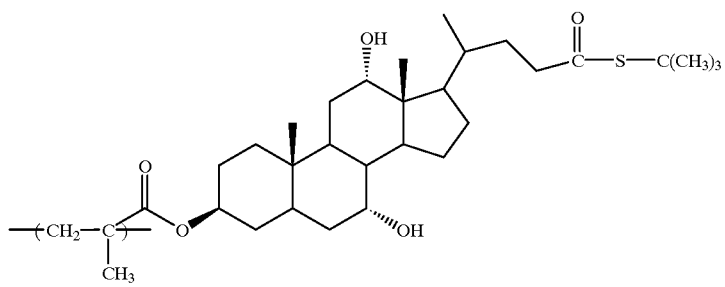
(b-46)
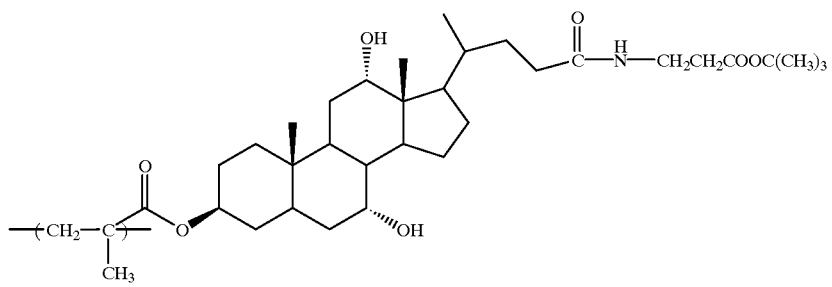
(b-47)
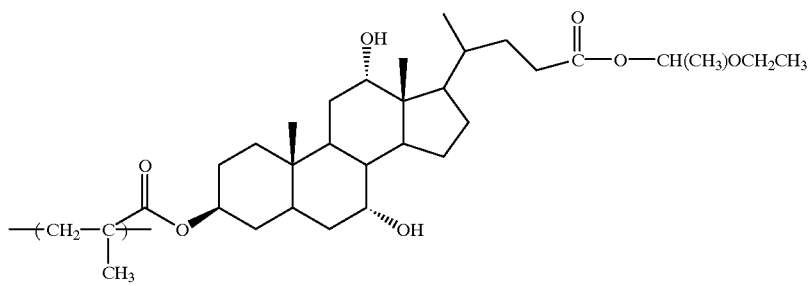
(b-48)

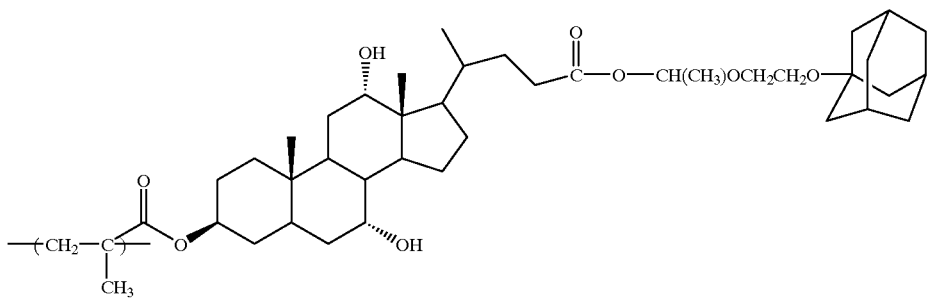
(b-49)
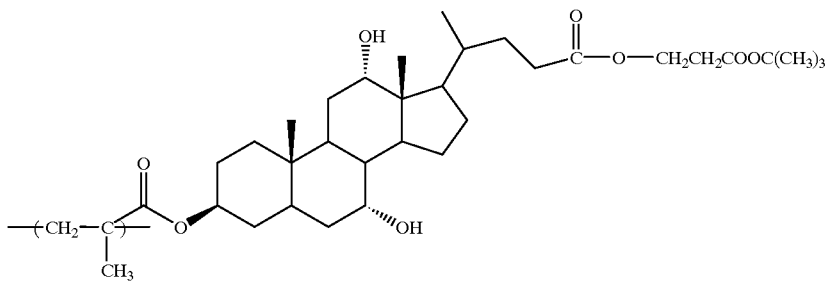
(b-50)
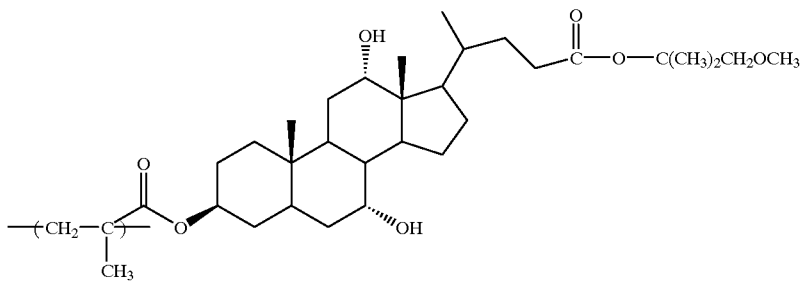
(b-51)
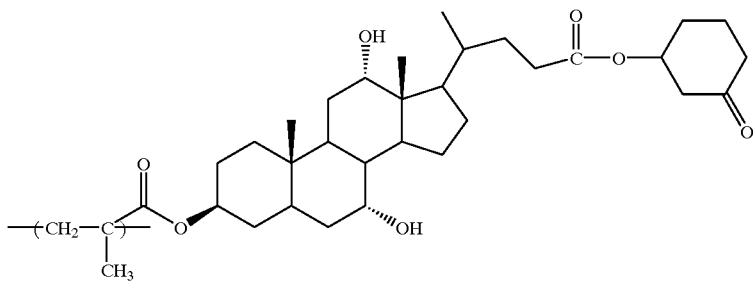
(b-52)
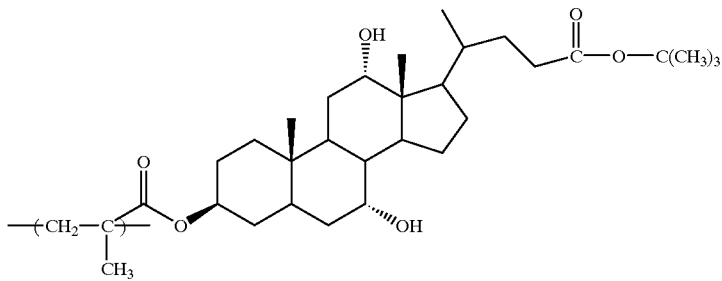
(b-53)

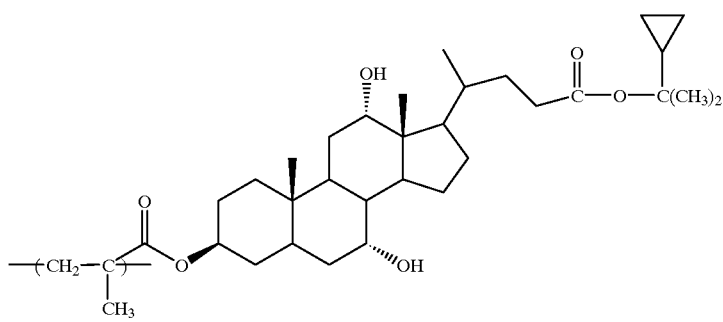
(b-54)
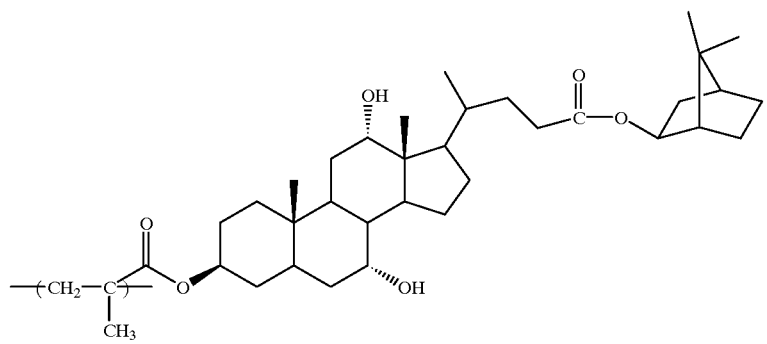
(b-55)
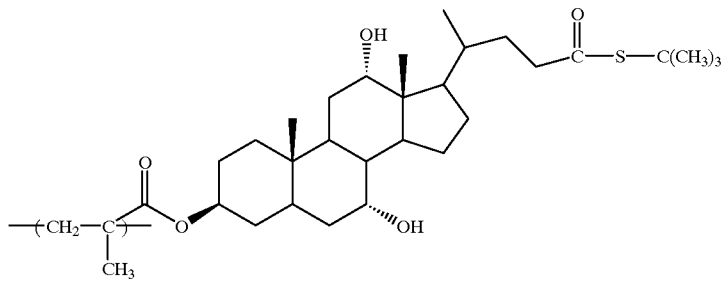
(b-56)
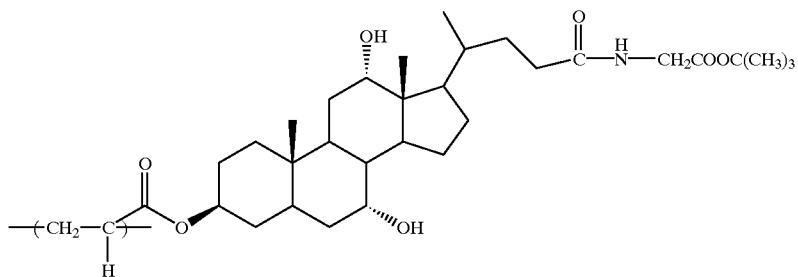
(b-57)
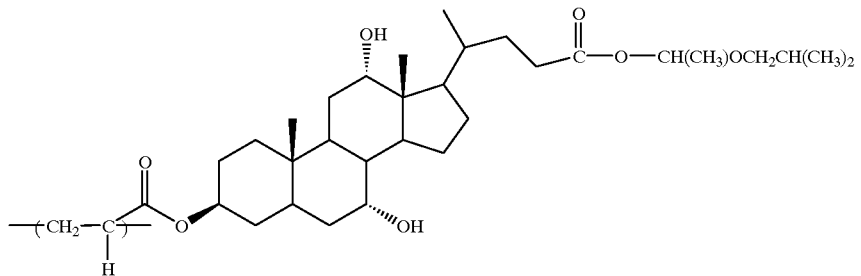
(b-58)

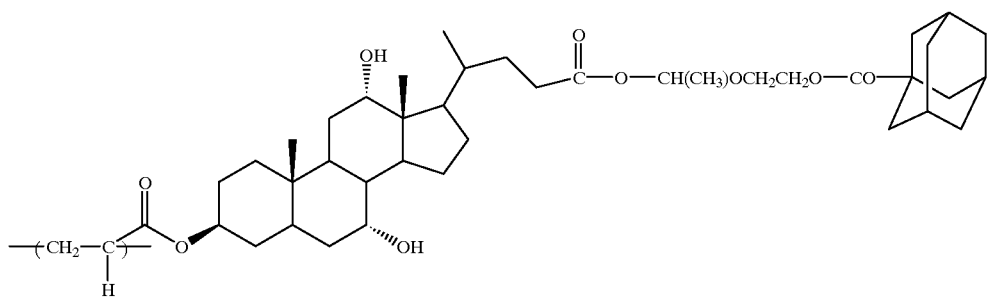
(b-59)
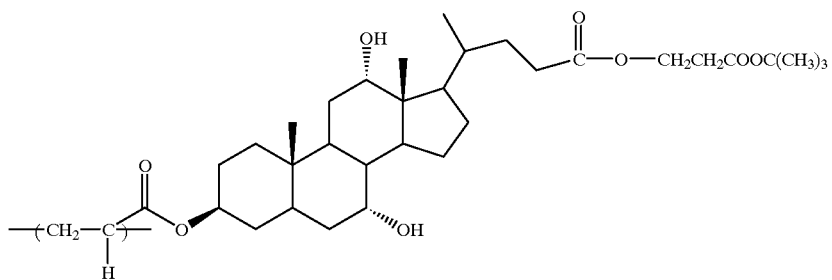
(b-60)
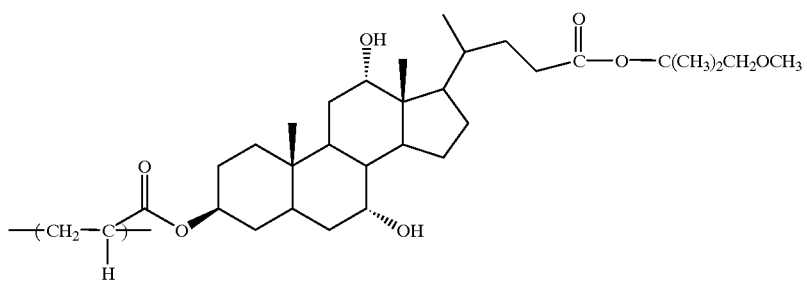
(b-61)
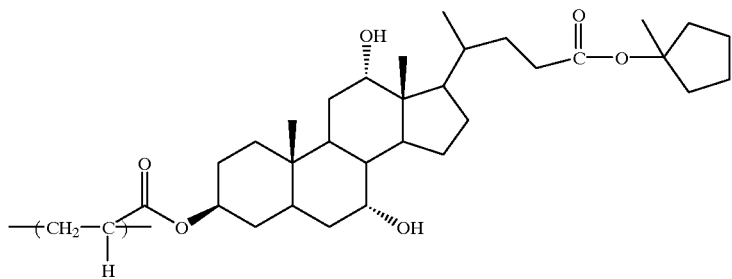
(b-62)
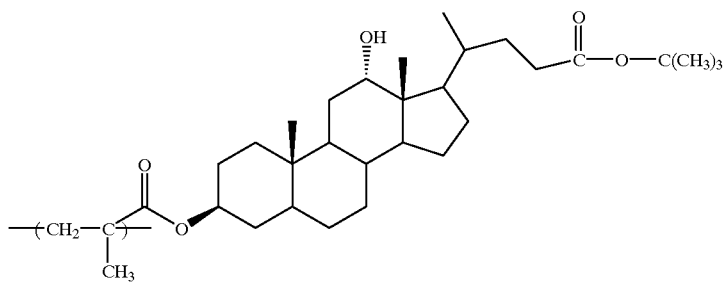
(b-63)

(b-64)
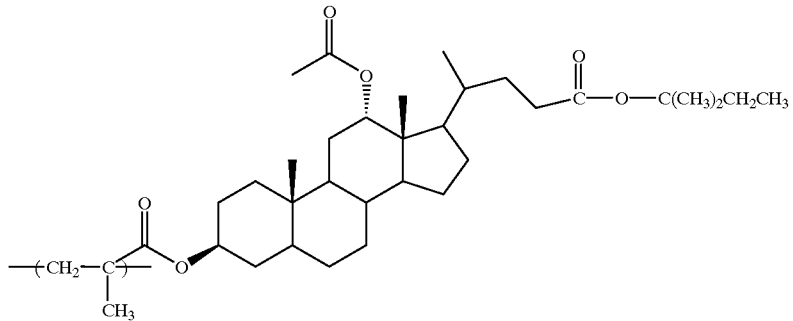
(b-65)
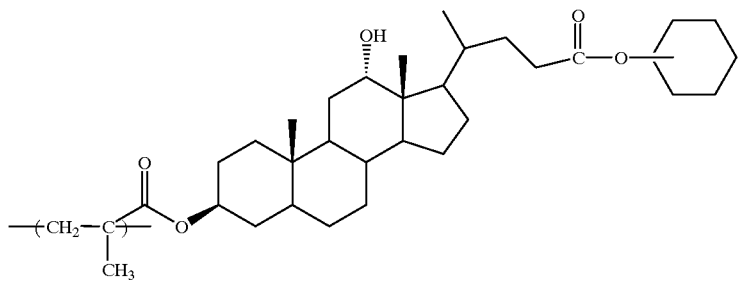
(b-66)
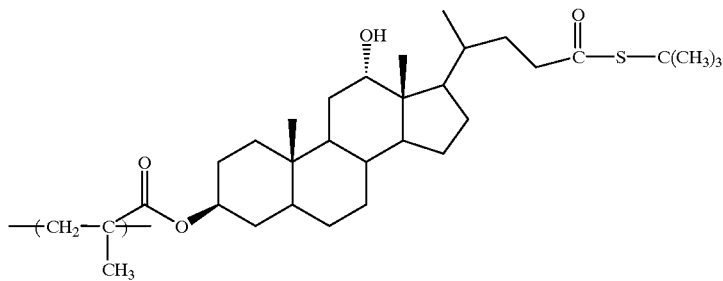
(b-67)
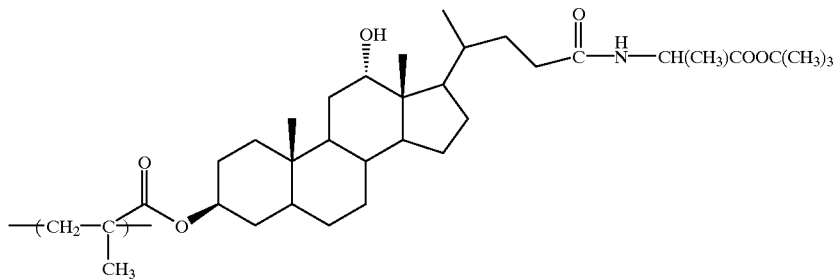
(b-68)
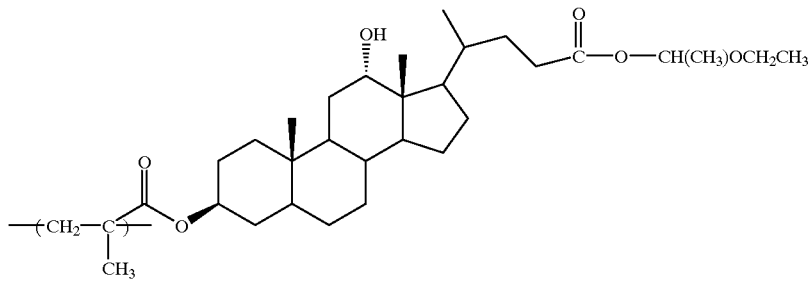

(b-69)
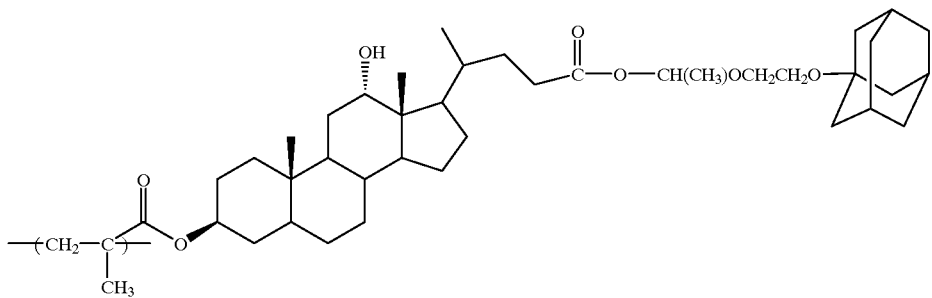
(b-70)
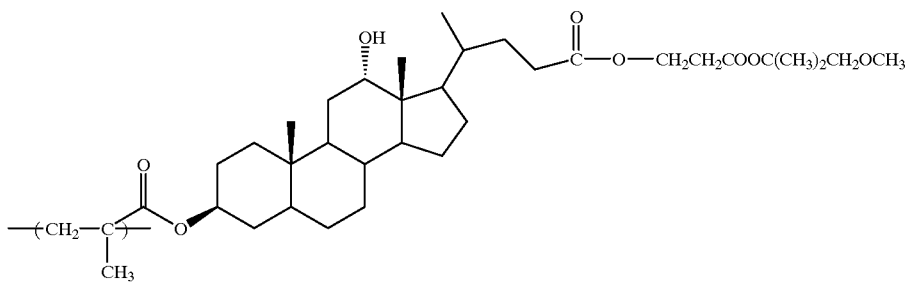
(b-71)
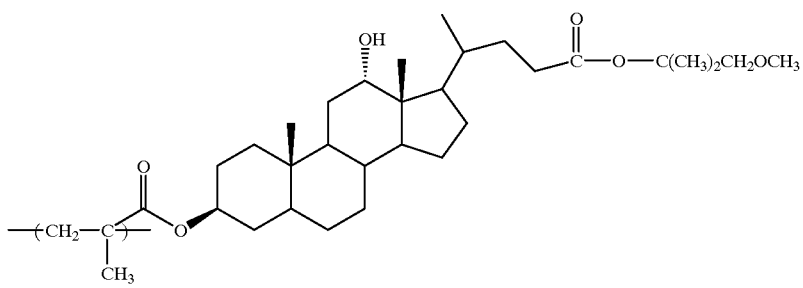
(b-72)
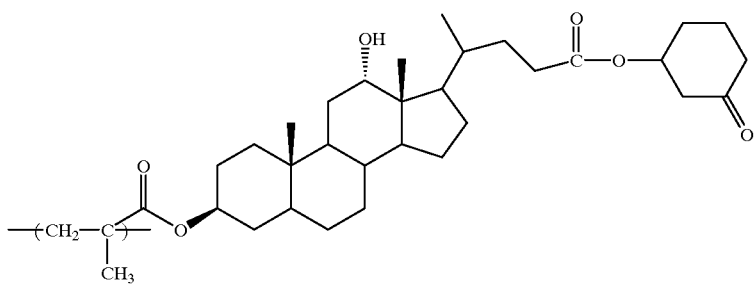
(b-73)
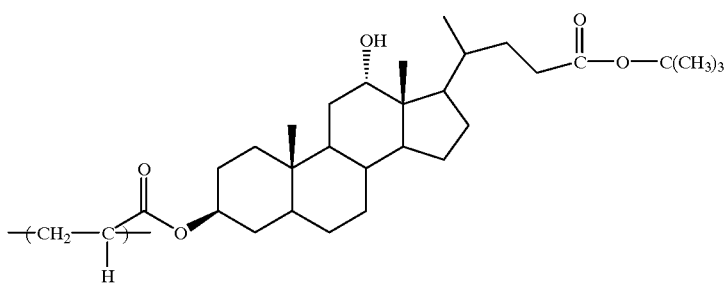

(b-74)
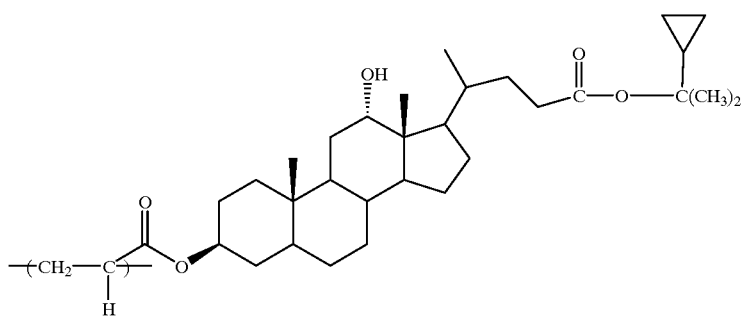
(b-75)
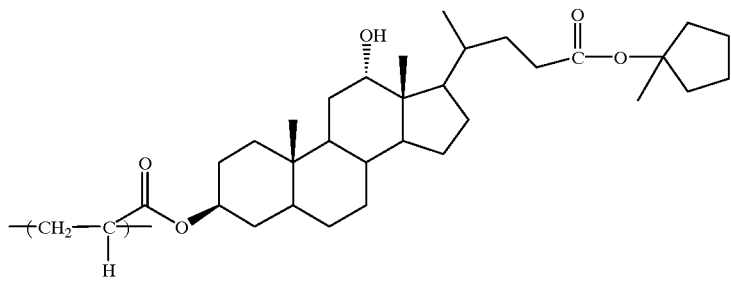
(b-76)
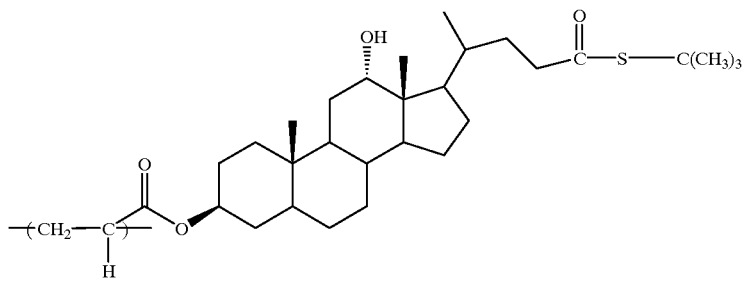
(b-77)
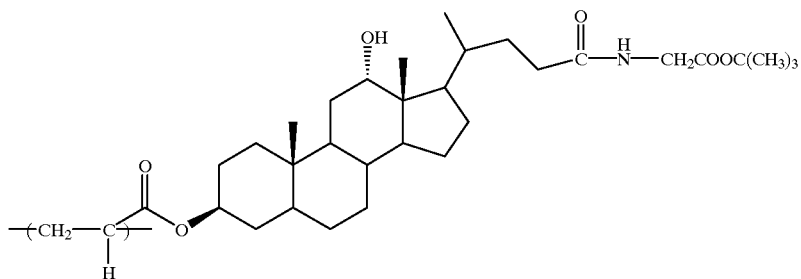
(b-78)
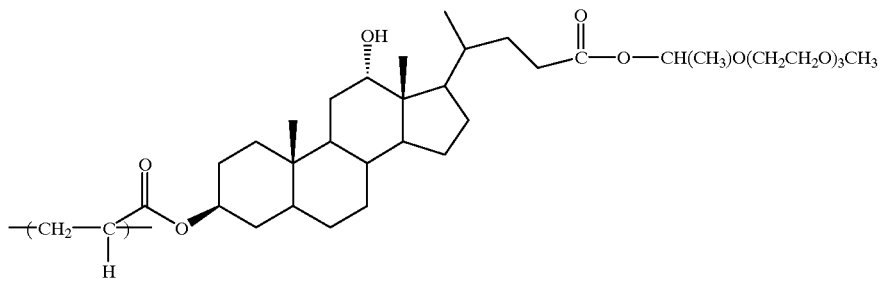

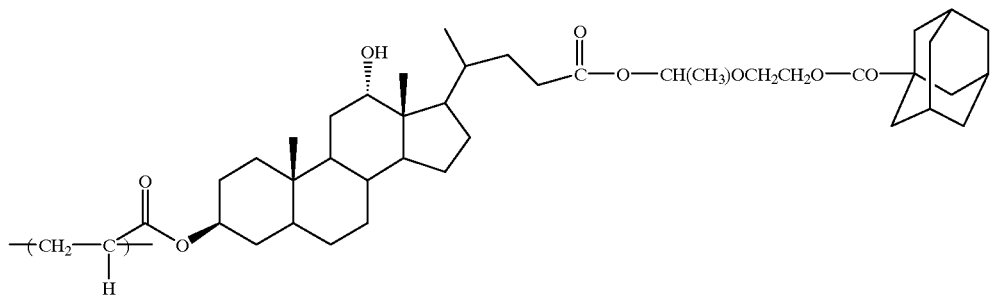
(b-79)
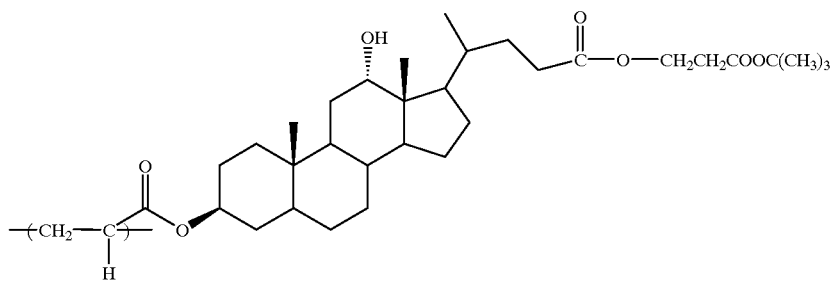
(b-80)
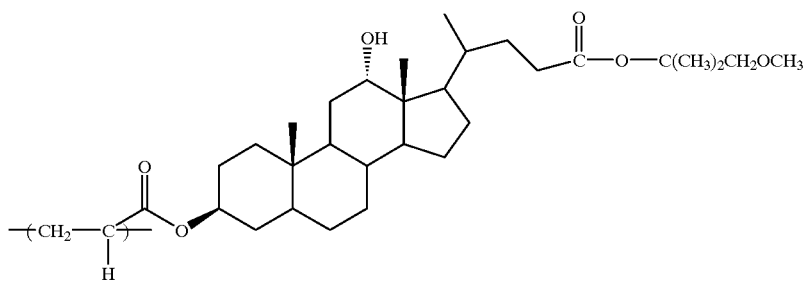
(b-81)
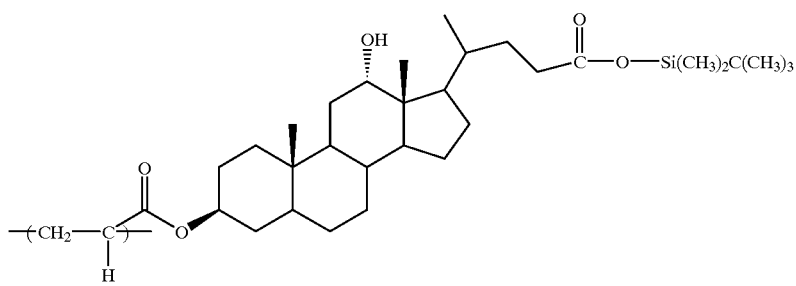
(b-82)
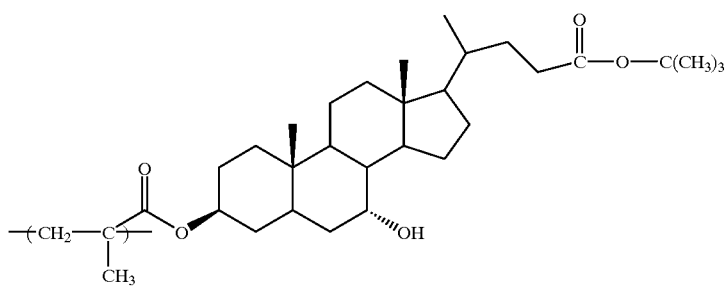
(b-83)

(b-84)
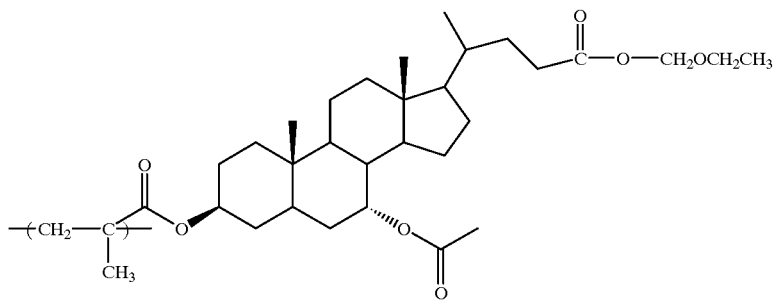
(b-85)
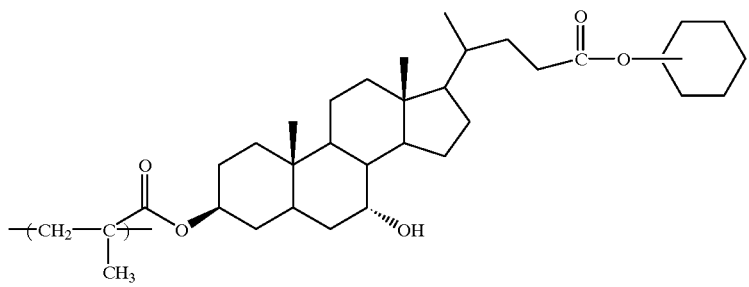
(b-86)
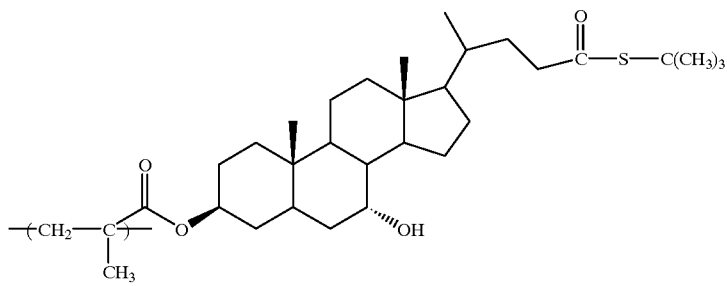
(b-87)
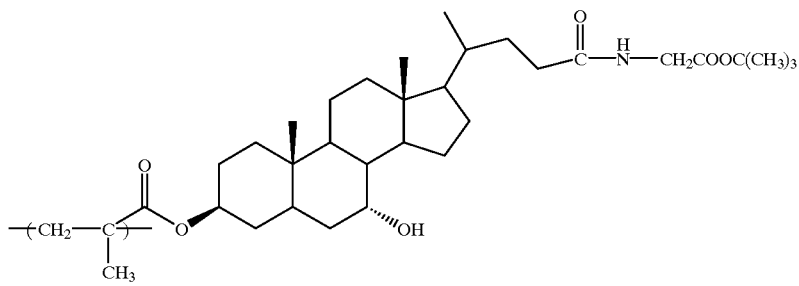
(b-88)
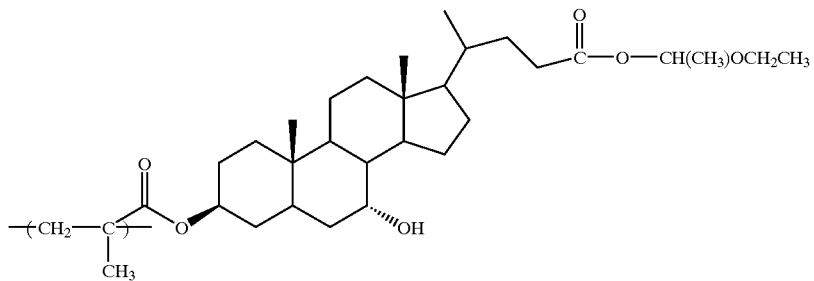

(b-89)
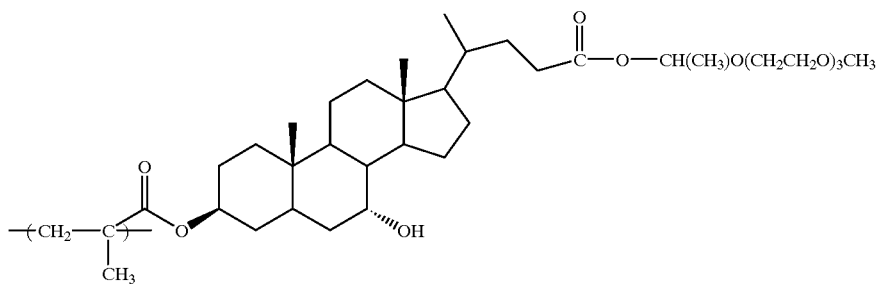
(b-90)
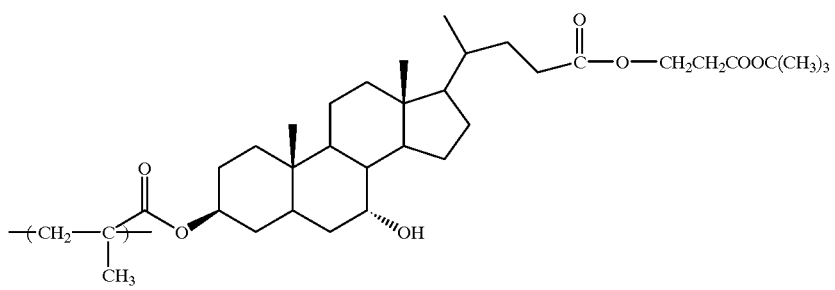
(b-91)
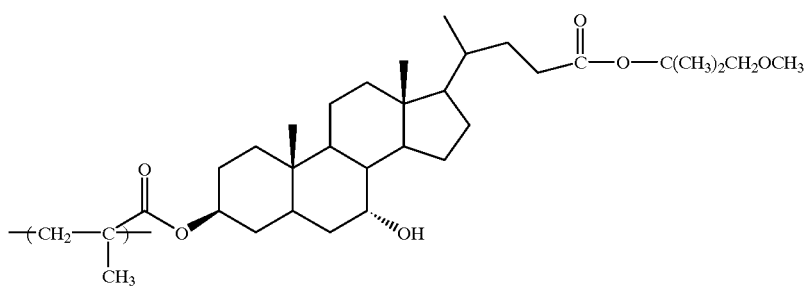
(b-92)
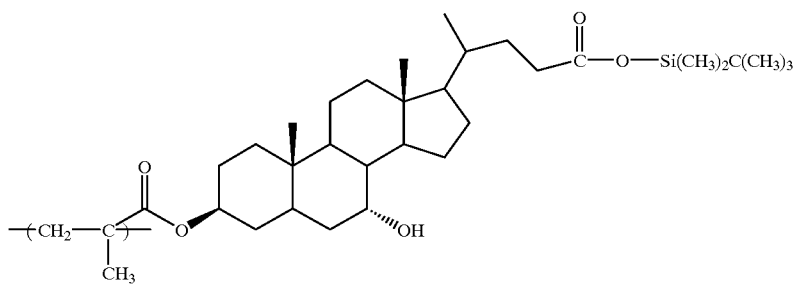
(b-93)
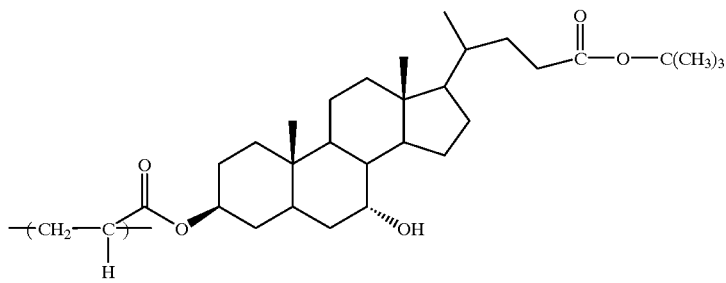

(b-94)
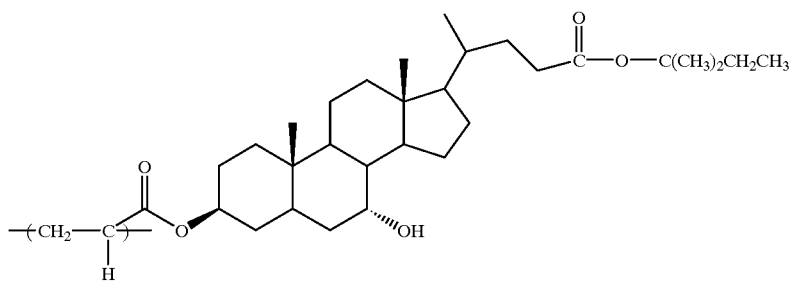
(b-95)
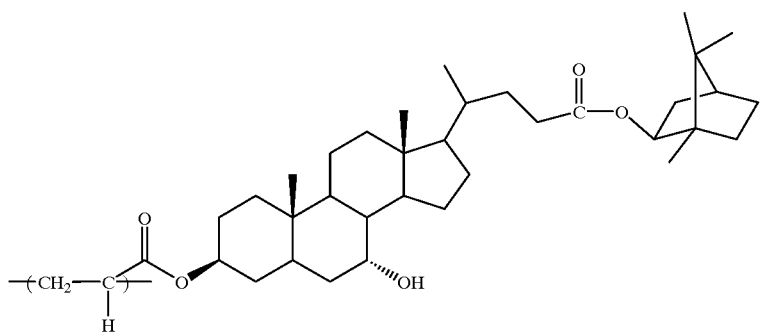
(b-96)
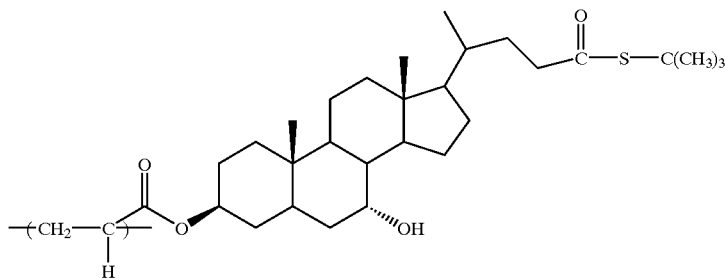
(b-97)
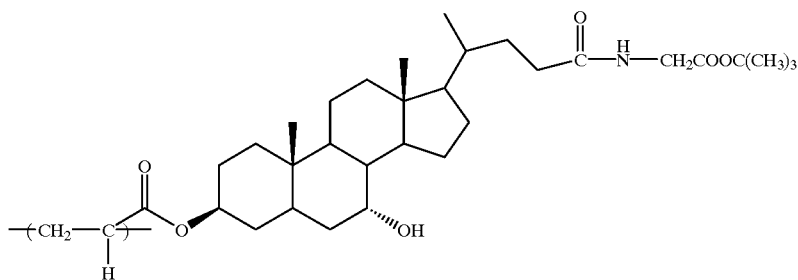
(b-98)
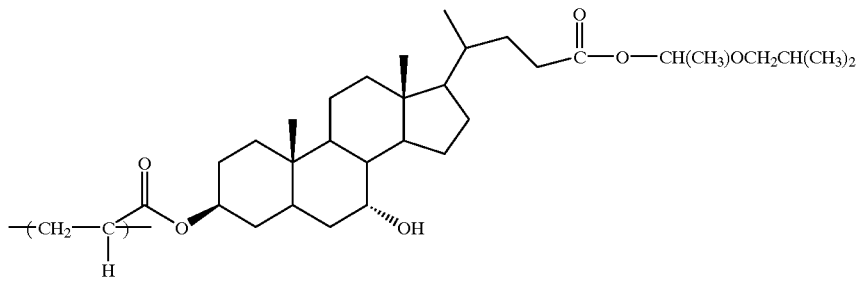

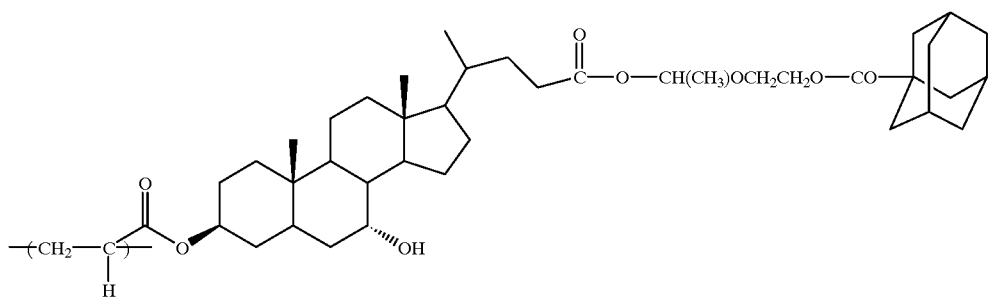
(b-99)
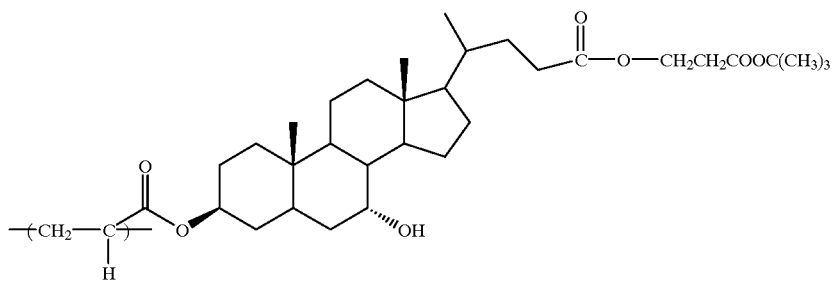
(b-100)
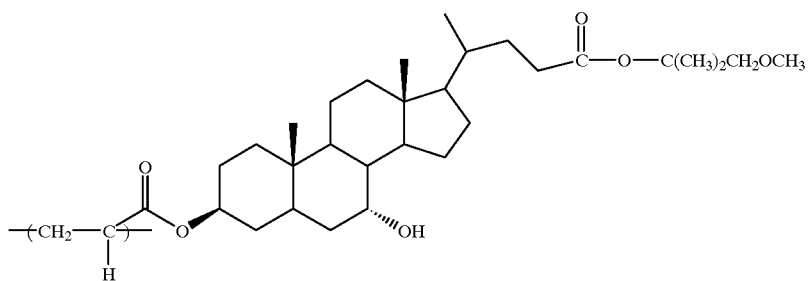
(b-101)
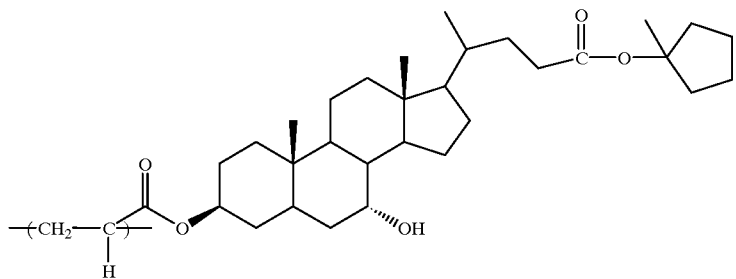
(b-102)
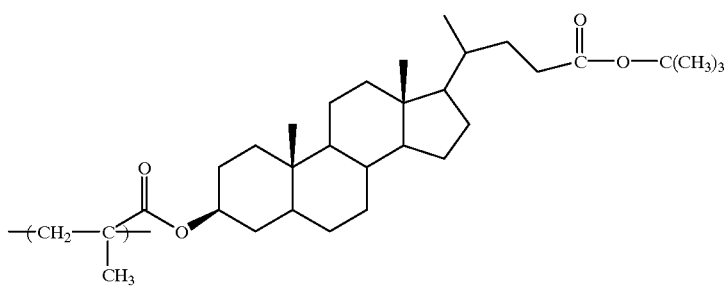
(b-103)

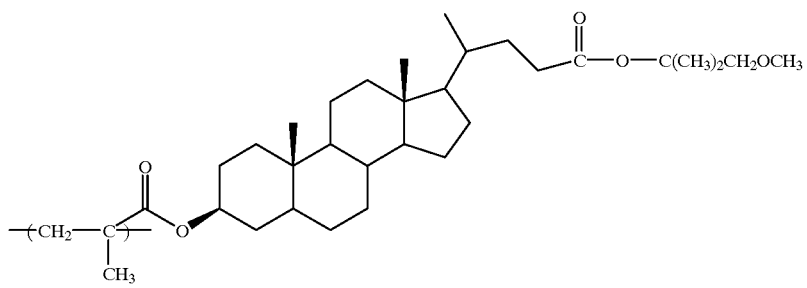
(b-104)
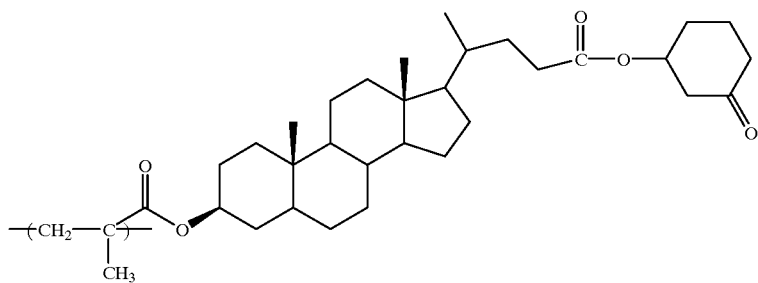
(b-105)
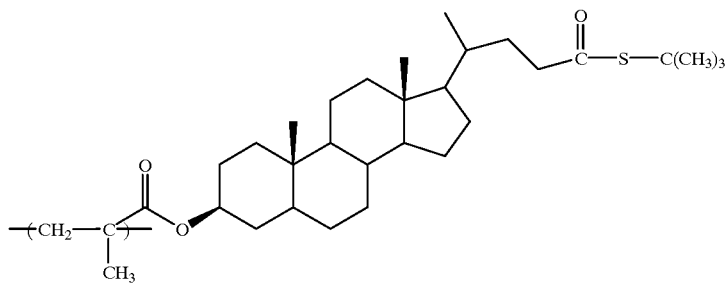
(b-106)
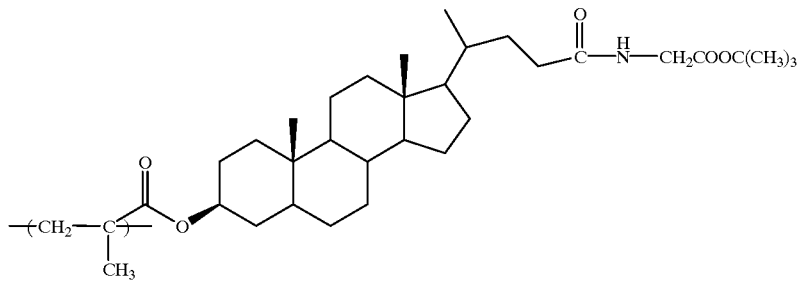
(b-107)
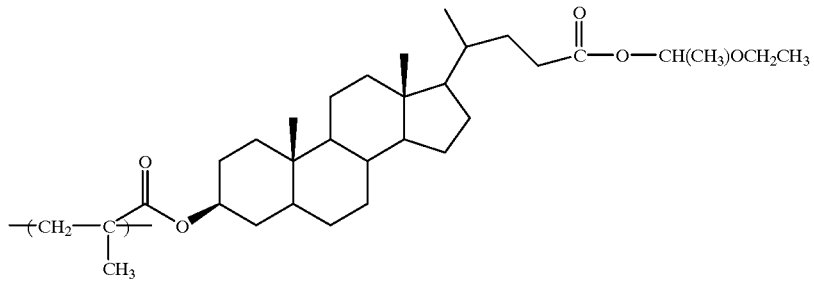
(b-108)

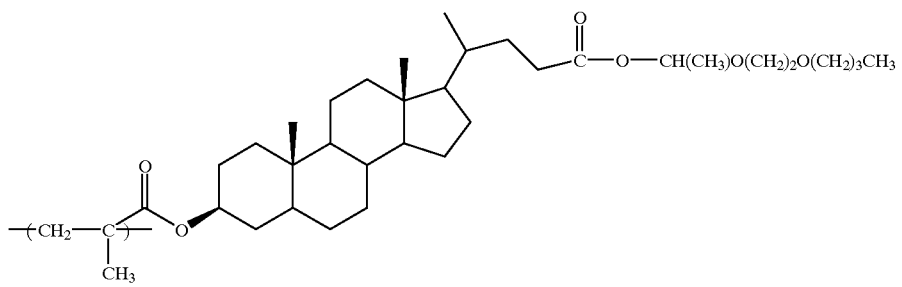
(b-109)
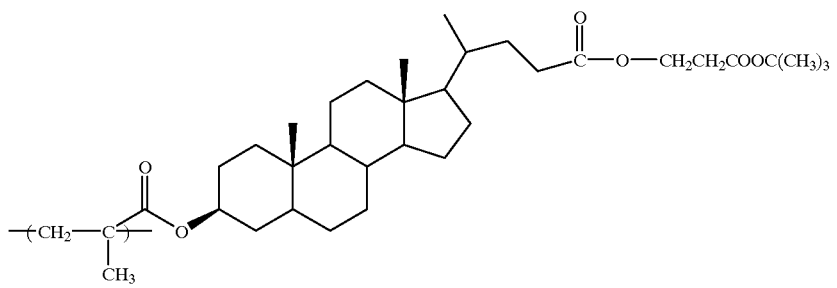
(b-110)
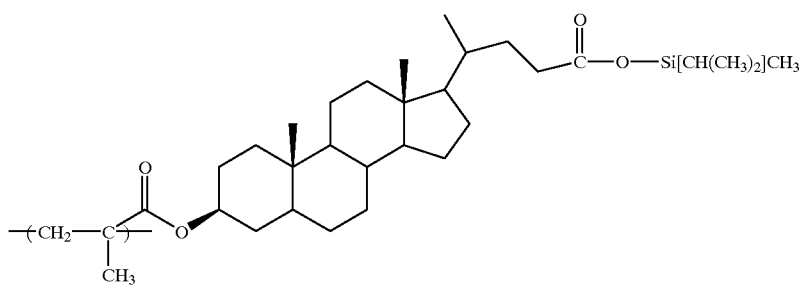
(b-111)
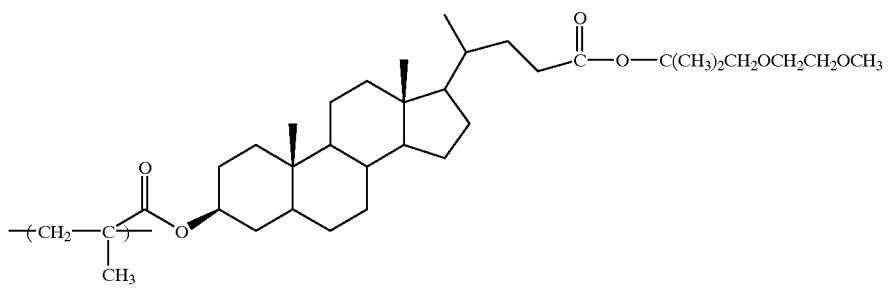
(b-112)
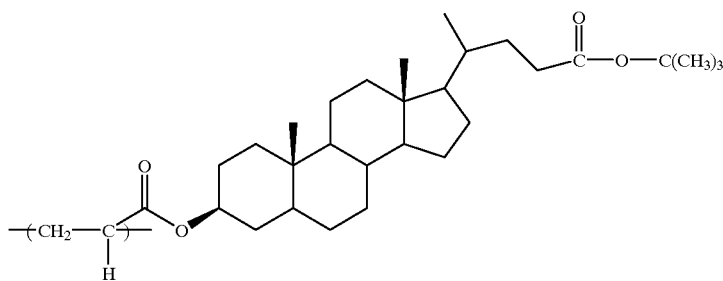
(b-113)

(b-114)
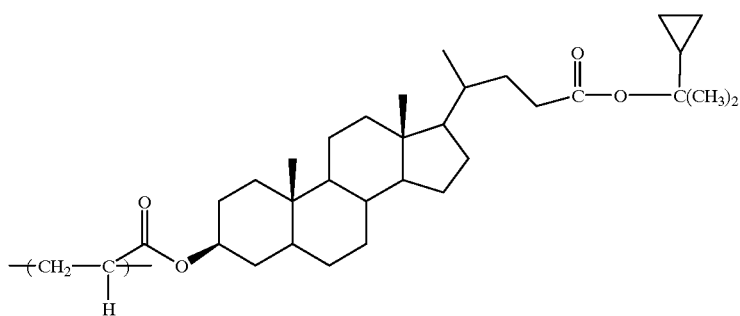
(b-115)
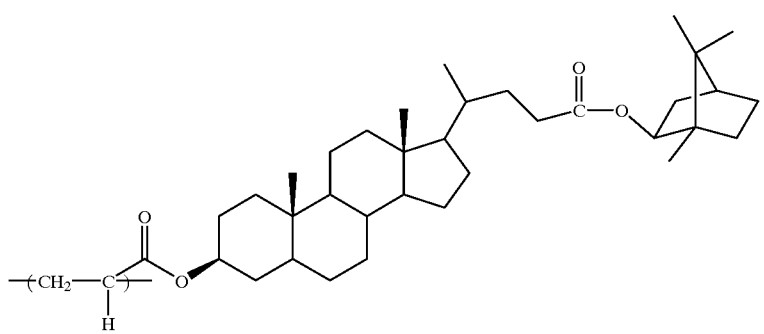
(b-116)
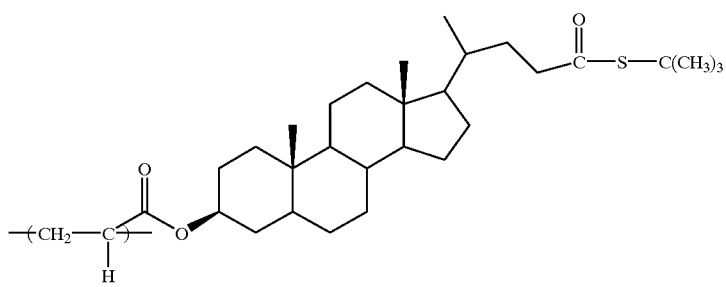
(b-117)
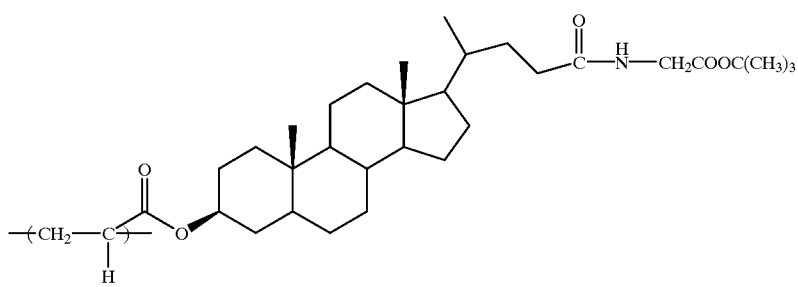
(b-118)
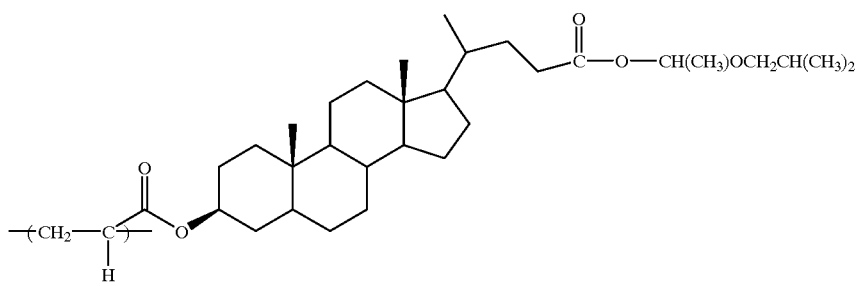

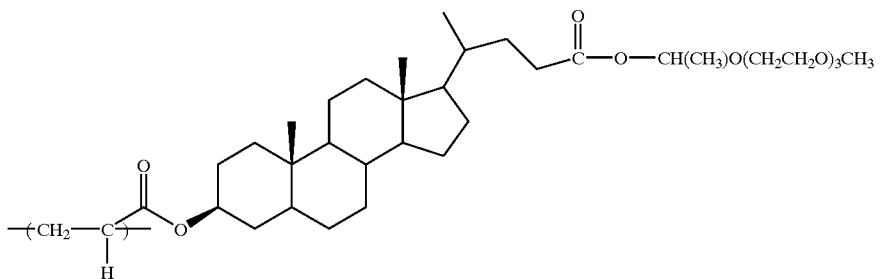
(b-119)

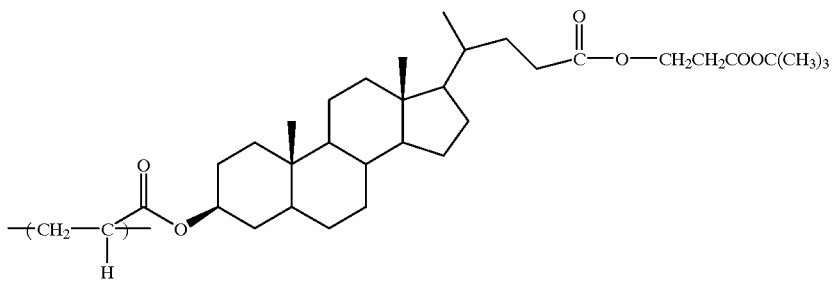
(b-120)

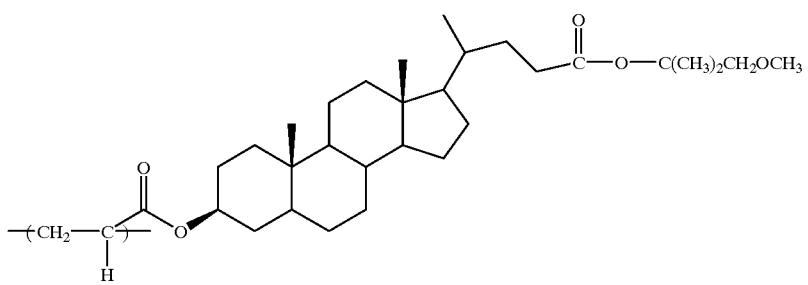
(b-121)

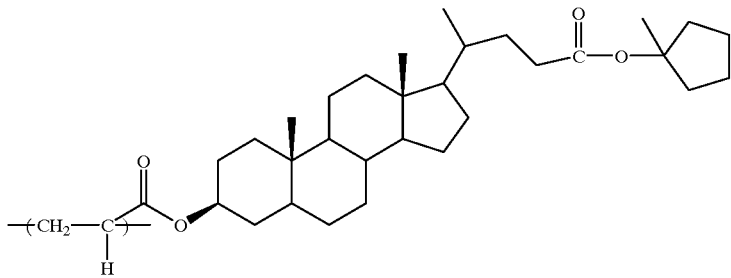
(b-122)

In the resin according to the present invention, carboxyl groups may be contained in the repeating structural units each having a group represented by general formula (I), (II), or (III), or may be contained in repeating structural units each having an acid-decomposable group, or may be contained in other repeating structural units. Carboxyl groups may be contained in two or more kinds of such units.

Preferred repeating structural units each having a carboxyl group are repeating structural units represented by general formulae (X) to (XII).

The content of the repeating structural units (preferably represented by at least one of general formulae (X) to (XII)) each having a carboxyl group in the resin according to the present invention is regulated while taking account of performances such as alkali developability, adhesion to substrates, and sensitivity. However, the content thereof is preferably from 0 to 60% by mole, more preferably from 0 to 40% by mole, most preferably from 0 to 20% by mole, based on all repeating units. The above content of carboxyl-containing repeating structural units means the amount of all carboxyl-containing repeating structural units in the resin, including the repeating structural units each represented by general formula (I), (II), or (III) and containing a carboxyl group and the repeating structural units each containing an acid-decomposable group and a carboxyl group.

Specific examples of the repeating structural units represented by general formulae (X) to (XII) are shown below as (c1) to (c18). However, the present invention should not be construed as being limited thereto.

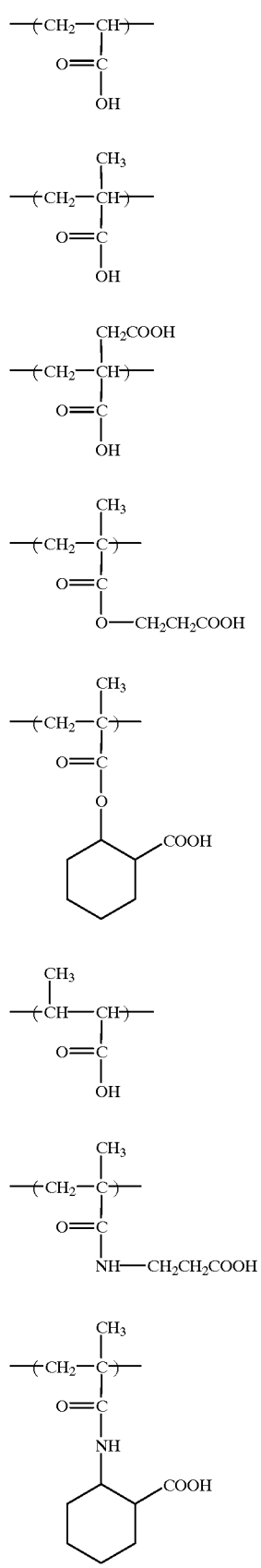
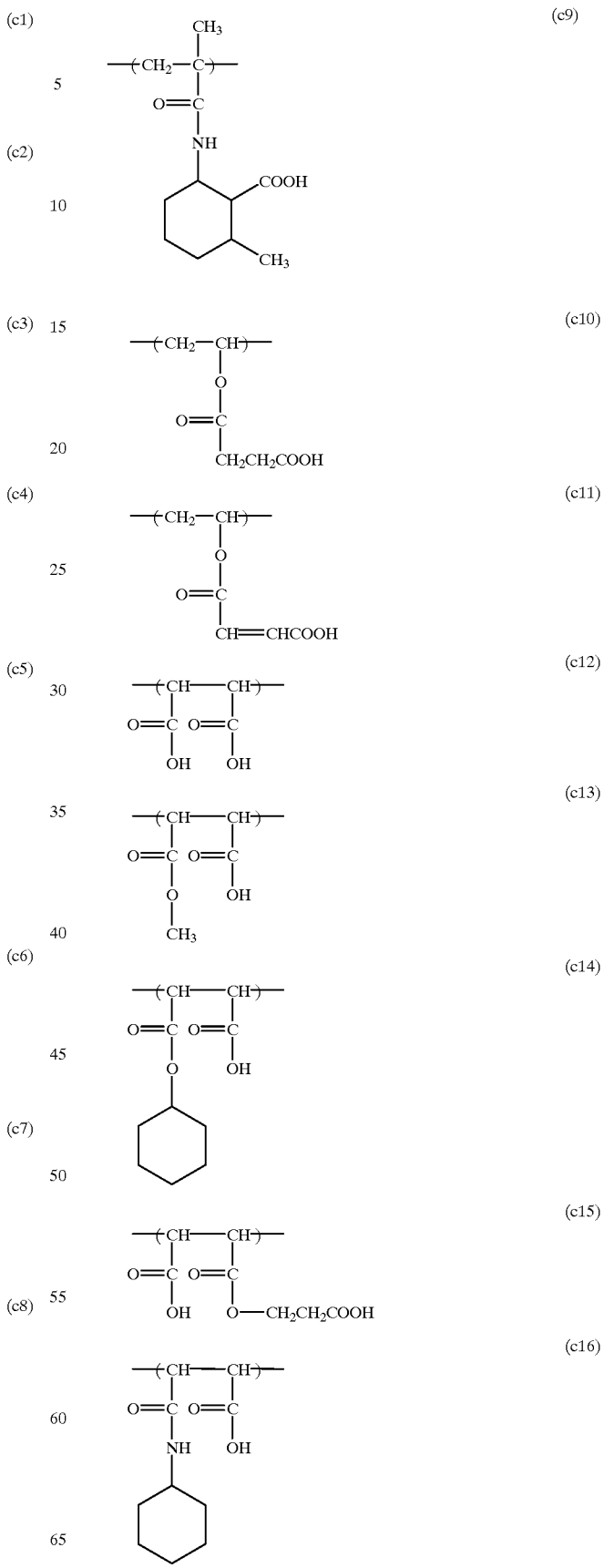

(c17)

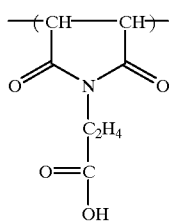

(c18)

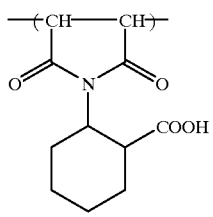

Especially preferred repeating units each containing a group represented by general formula (I), (II), or (III) according to the present invention are units represented by general formula (IV). The resin according to the present invention is preferably made up of: units represented by general formula (IV) alone; a combination of units represented by general formulae (IV) and (VII); a combination of units represented by general formulae (IV) and (X); or a combination of units represented by general formulae (IV), (VII), and (X).

The resin may further contain units derived from one or more other polymerizable monomers such as those shown below.

For the purpose of improving the performance of the resin of component (B) in the present invention, other polymerizable monomers may be copolymerized as long as the transparency of the resin to 220-nm and shorter-wavelength rays and the dry etching resistance thereof are not significantly impaired by the copolymerization.

Examples of usable comonomers include compounds having one addition-polymerizable unsaturated bond which are selected from acrylic esters, acrylamide and analogues thereof, methacrylic esters, methacrylamide and analogues thereof, allyl compounds, vinyl ethers, vinyl esters, styrene and analogues thereof, and crotonic esters.

Specific examples of such comonomers include acrylic esters such as alkyl acrylates (the alkyl group preferably has 1 to 10 carbon atoms) (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, and tetrahydrofurfuryl acrylate) and aryl acrylates (e.g., phenyl acrylate and hydroxyphenyl acrylate); methacrylic esters such as alkyl methacrylates (the alkyl group preferably has 1 to 10 carbon atoms) (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, and tetrahydrofurfuryl methacrylate) and aryl methacrylates (e.g., phenyl methacrylate, hydroxyphenyl methacrylate, cresyl methacrylate, and naphthyl methacrylate); acrylamide and analogues thereof such as N-alkylacrylamides (examples of the alkyl group include those having 1 to 10 carbon atoms, such as methyl, ethyl, propyl, butyl, t-butyl, heptyl, octyl, cyclohexyl, benzyl, hydroxyethyl, and benzyl), N-arylacrylamides (examples of the aryl group include phenyl, tolyl, nitrophenyl, naphthyl, cyanophenyl, hydroxyphenyl, and carboxyphenyl), N,N-dialkylacrylamides (examples of the alkyl groups include those having 1 to 10 carbon atoms, such as methyl, ethyl, butyl, isobutyl, ethylhexyl, and cyclohexyl), N,N-arylacrylamides (examples of the aryl groups include phenyl), N-methyl-N-phenylacrylamide, N-hydroxyethyl-N-methylacrylamide, and N-2-acetamidoethyl-N-acetylacrylamide; methacrylamide and analogues thereof such as N-alkylmethacrylamides (examples of the alkyl group include those having 1 to 10 carbon atoms, such as methyl, ethyl, t-butyl, ethylhexyl, hydroxyethyl, and cyclohexyl), N-arylmethacrylamides (examples of the aryl group include phenyl, hydroxyphenyl, and carboxyphenyl), N,N-dialkylmethacrylamides (examples of the alkyl groups include ethyl, propyl, and butyl), N,N-diarylmethacrylamides (examples of the aryl groups include phenyl), N-hydroxyethyl-N-methylmethacrylamide, N-methyl-N-phenylmethacrylamide, and N-ethyl-N-phenylmethacrylamide; allyl compounds such as allyl esters (e.g., allyl acetate, allyl caproate, allyl caprylate, allyl laurate, allyl palmitate, allyl stearate, allyl benzoate, allyl acetoacetate, and allyl lactate) and allyloxyethanol; vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether) and vinyl aryl ethers (e.g., vinyl phenyl ether, vinyl tolyl ether, vinyl chlorophenyl ether, vinyl 2,4-dichlorophenyl ether, vinyl naphthyl ether, and vinyl anthranyl ether); vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, and vinyl naphthoate; styrene and analogues thereof such as alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene), alkoxystyrenes (e.g., methoxystyrene, 4-methoxy-3-methylstyrene, and dimethoxystyrene), halogenostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene), hydroxystyrenes (e.g., 4-hydroxystyrene, 3-hydroxystyrene, 2-hydroxystyrene, 4-hydroxy-3-methylstyrene, 4-hydroxy-3,5-dimethylstyrene, 4-hydroxy-3-methoxystyrene, and 4-hydroxy-3-(2-hydroxybenzyl)styrene), and carboxystyrenes; crotonic esters such as alkyl crotonates (e.g., butyl crotonate, hexyl crotonate, and glycerol monocrotonate); dialkyl itaconates (e.g., dimethyl itaconate, diethyl itaconate, and dibutyl itaconate); dialkyl maleates or fumarates (e.g., dimethyl maleate and bibutyl fumarate); and other monomers including maleic anhydride, maleimide, acrylonitrile, methacrylonitrile, and maleonitrile. Besides the above monomers, other addition-polymerizable unsaturated compounds which can be generally copolymerized may be used.

Preferred comonomers among these are those which improve alkali solubility. Specifically, preferred comonomers include monomers having one or more carboxyl groups, such as carboxystyrenes, N-(carboxyphenyl)acrylamide, and N-(carboxyphenyl)methacrylamide, monomers having one or more phenolic hydroxyl groups, such as hydroxystyrenes, N-(hydroxyphenyl)acrylamide, N-(hydroxyphenyl)methacrylamide, hydroxyphenyl acrylate, and hydroxyphenyl methacrylate, maleimide, and the like.

The content of such other polymerizable monomers in the resin for use in the present invention is preferably 50% by mole or lower, more preferably 30% by mole or lower, based on all repeating units.

The resin of component (B) for use in the present invention, which comprises repeating structural units (preferably represented by at least one of general formulae (IV) to (VI)) each having a group represented by general formula (I), (II), or (III) and repeating structural units (preferably represented by at least one of general formulae (VII) to (IX)) each having an acid-decomposable group and optionally further contains carboxyl-containing repeating structural units (preferably represented by at least one of general formulae (X) to (XII)) or other polymerizable monomers, is synthesized by the radical, cationic, or anionic polymerization of unsaturated monomers respectively corresponding to those structures.

More specifically, the monomers are mixed according to the preferred composition shown above, and polymerized in an appropriate solvent at a monomer concentration of about from 10 to 40% by weight in the presence of a polymerization catalyst, if desired with heating.

The resin of component (B) in the present invention has a molecular weight of 2,000 or higher, preferably from 3,000 to 1,000,000, more preferably from 5,000 to 200,000, most preferably from 20,000 to 100,000, in terms of weight-average molecular weight ($M_w$; calculated for standard polystyrene). Since higher molecular weights improve performances such as heat resistance but result in a decrease in developability, etc., the molecular weight of the resin is regulated to a value in the preferred range so as to balance these performances. The dispersion index ($M_w/M_n$) thereof is preferably from 1.0 to 5.0, more preferably from 1.0 to 3.0. The smaller the dispersion index, the better the heat resistance and image performances ttern profile, defocus latitude, etc.).

In the present invention, the addition amount of the above-described resin of component (B) in the photosensitive composition is from 50 to 99.7% by weight, preferably from 70 to 99% by weight, based on all solid components.

Compound Represented by General Formula (CI) or (CII):

Besides the resin described above and a photo-acid generator, the first positive photosensitive composition of the present invention further contains a compound represented by general formula (CI) or (CII) as one of the main basic constituent components.

In general formula (CI), X represents an oxygen atom, a sulfur atom, —N($R_{53}$)—, or a single bond.

Examples of the alkyl group represented by each of $R_{51}$, $R_{52}$, and R53 in general formula (CI) include those having 1 to 8 carbon atoms, such as methyl, ethyl, n-propyl, isopropyl, n-butyl, isobutyl, sec-butyl, t-butyl, hexyl, 2-ethylhexyl, and octyl.

q1 represents an integer of from 0 to 10, preferably from 0 to 7, more preferably from 0 to 5.

In general formula (CI), —C(=O)—O—R' is a group which decomposes by the action of an acid (referred to also as "acid-decomposable group").

Examples of R' in the above acid-decomposable group include tertiary alkyl groups such as t-butyl, methoxy-t-butyl, and t-amyl, an isobornyl group, optionally substituted 1-alkoxyethyl groups such as 1-ethoxyethyl, 1-butoxyethyl, 1-isobutoxyethyl, 1-cyclohexyloxyethyl, and 1-[2-(n-butoxy)ethoxy]ethyl, alkoxymethyl groups such as 1-methoxymethyl and 1-ethoxymethyl, tetrahydropyranyl, tetrahydrofuranyl, trialkylsilyl groups such as trimethylsilyl, t-butyldimethylsilyl, and diisopropylmethylsilyl, and 3-oxocyclohexyl.

R represents a residue having a valency of n1 and comprising either an internally crosslinked hydrocarbon group or a naphthalene ring. Examples of the residue having a valency of n1 and comprising an internally crosslinked hydrocarbon group include adamantane, norbornane, tricyclodecane, tetracycloundecane, pinene, terpenes, steroids, and the like which each has n1 bond for external linkage.

Examples of the residue having a valency of n1 and comprising a naphthalene ring include naphthalene rings each having n1 bond for external linkage.

The internally crosslinked hydrocarbon groups and naphthalene rings shown above each may have one or more substituents in any positions other than that where the bond for external linkage is present. Preferred examples of the substituents include halogen atoms, cyano, alkyl groups having 1 to 4 carbon atoms, alkoxy groups having 1 to 4 carbon atoms, acyl groups having 1 to 4 carbon atoms, acyloxy groups having 1 to 4 carbon atoms, and alkoxycarbonyl groups having 2 to 5 carbon atoms.

Examples of the alkyl group represented by $R_{60}$ in general formula (CII) include those having 1 to 8 carbon atoms, such as methyl, ethyl, n-propyl, isopropyl, n-butyl, isobutyl, sec-butyl, t-butyl, hexyl, 2-ethylhexyl, and octyl.

In general formula (CII), —O—$R_{61}$ is a group which decomposes by the action of an acid (referred to also as "acid-decomposable group").

Examples of $R_{61}$ in the above acid-decomposable group include tertiary alkyl groups such as t-butyl, methoxy-t-butyl, and t-amyl, optionally substituted 1-alkoxyethyl groups such as 1-ethoxyethyl, 1-butoxyethyl, 1-isobutoxyethyl, 1-cyclohexyloxyethyl, and 1-[2-(n-butoxy)ethoxy]ethyl, alkoxymethyl groups such as 1-methoxymethyl and 1-ethoxymethyl, tertiary alkoxycarbonyl groups such as t-butoxycarbonyl and t-amyloxycarbonyl, tetrahydropyranyl, tetrahydrofuranyl, trialkylsilyl groups such as trimethylsilyl, t-butyldimethylsilyl, and diisopropylmethylsilyl, and 3-oxocyclohexyl.

The compounds represented by general formulae (CI) and (CII) for use in the present invention each can be synthesized by reacting a corresponding carboxylic acid or carboxylic acid derivative, e.g., an acid chloride, or a corresponding naphthol derivative with a compound represented by R'—OH or R'—X (halogen) or with a corresponding olefin, or by reacting a naphthol derivative with a dialkoxycarbonyl ether.

Although dissolution inhibitors comprising compounds represented by general formulae (CI) and (CII) can be used alone in the positive photosensitive composition of the present invention, a mixture of two or more thereof may be used.

The content of one or more compounds represented by general formula (CI) or (CII) in the positive photosensitive composition of the present invention is generally from 1 to 40% by weight, preferably from 3 to 30% by weight, based on all solid components.

Specific examples of the compounds represented by general formula (CI) and those represented by general formula (CII) are given below as (CI-1) to (CI-108) and as (CII-1) to (CII-29) and (CII-39) to (CII-52), respectively. However, the compounds usable in the present invention should not be construed as being limited thereto.

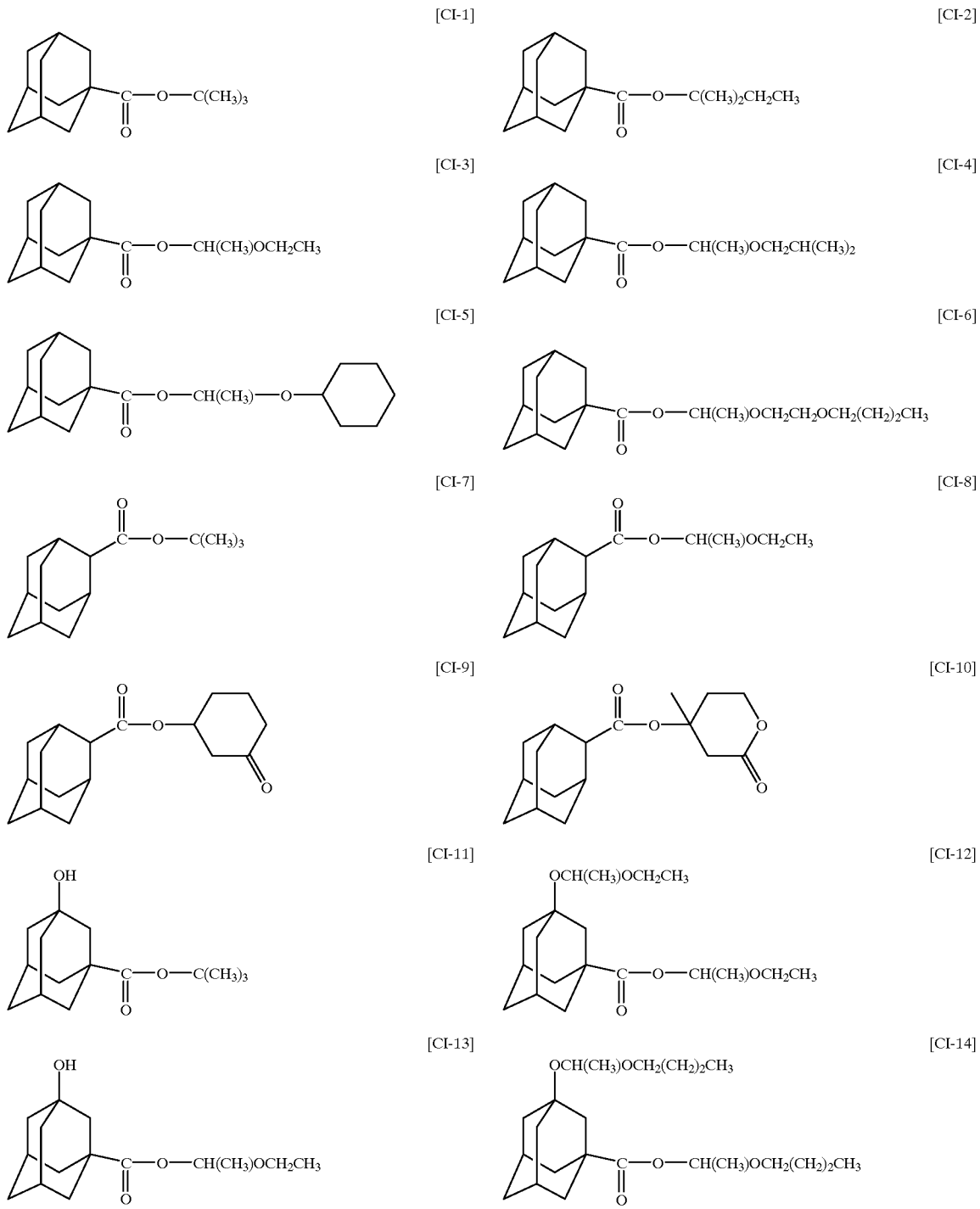

-continued
[CI-15]
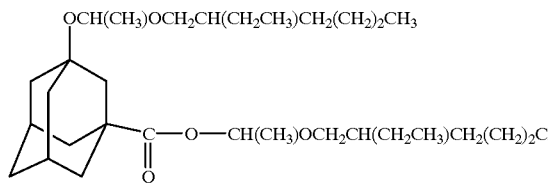
[CI-16]
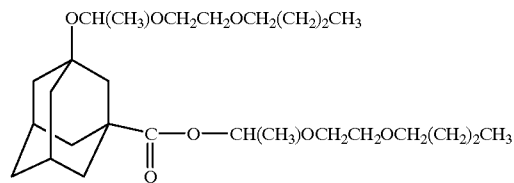
[CI-17]
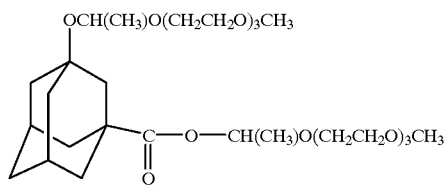
[CI-18]
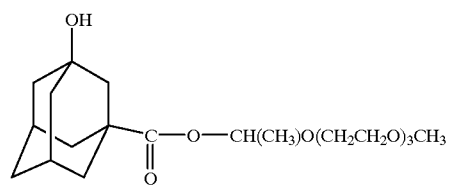
[CI-19]
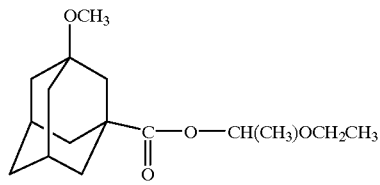
[CI-20]
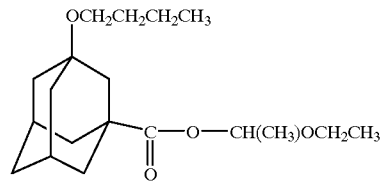
[CI-21]
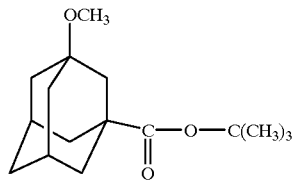
[CI-22]
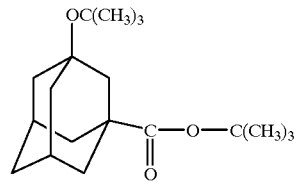
[CI-23]
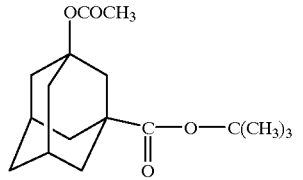
[CI-24]
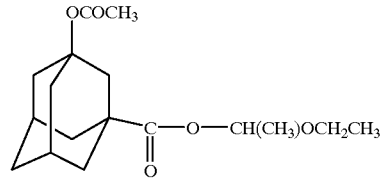
[CI-25]
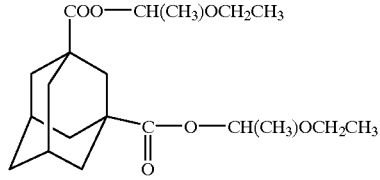
[CI-26]
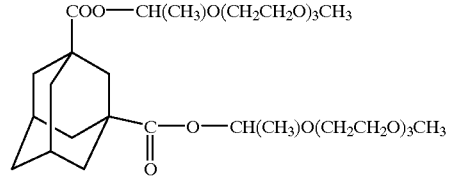
[CI-27]
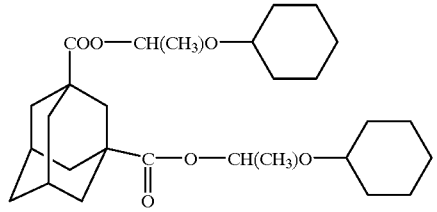
[CI-28]
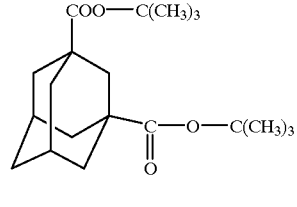

-continued
[CI-29]
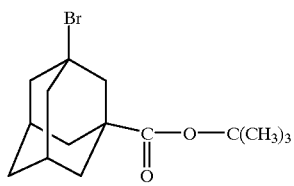
[CI-30]
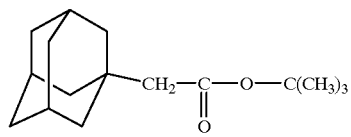
[CI-31]
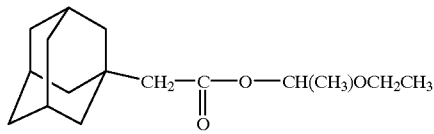
[CI-32]
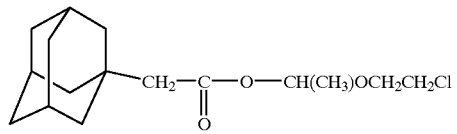
[CI-33]
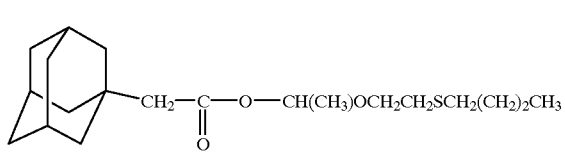
[CI-34]
[CI-35]
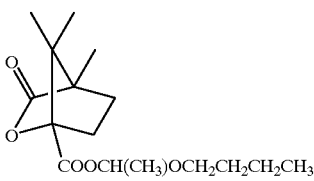
[CI-36]
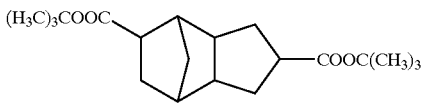
[CI-37]
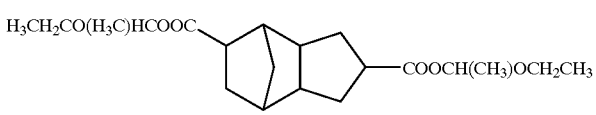
[CI-38]
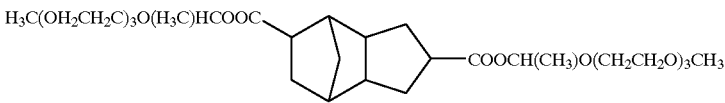
[CI-39]
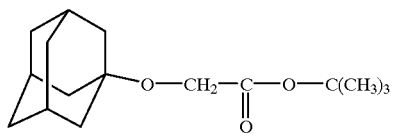
[CI-40]
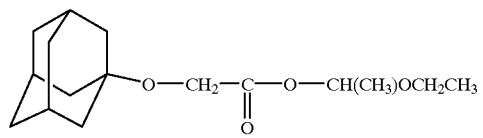
[CI-41]
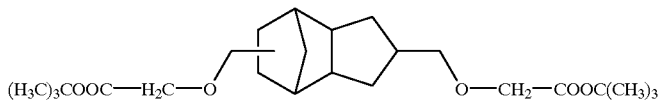
[CI-42]
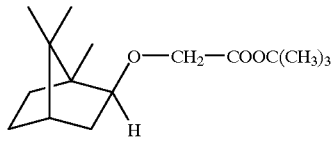
[CI-43]
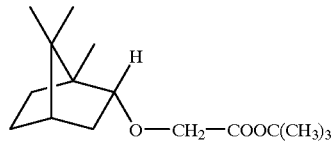

-continued
[CI-44]
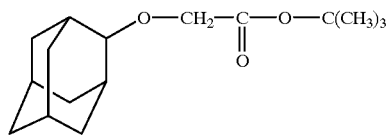
[CI-45]
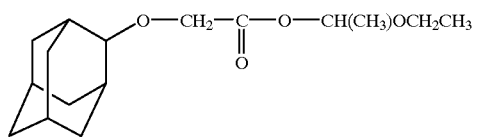
[CI-46]
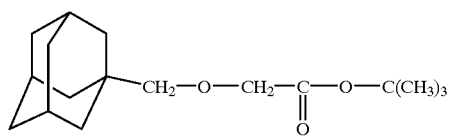
[CI-47]
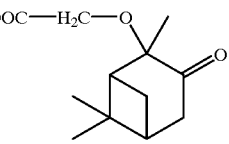
[CI-48]
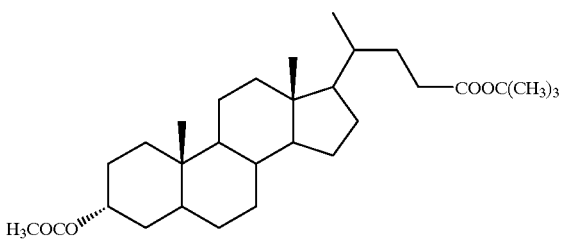
[CI-49]
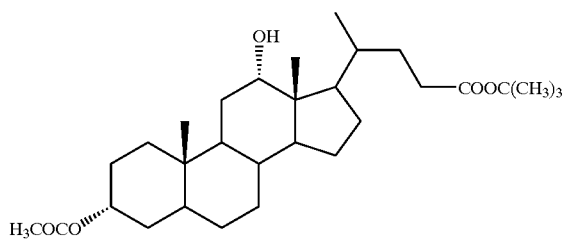
[CI-50]
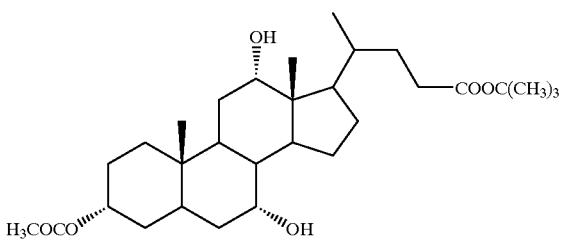
[CI-51]
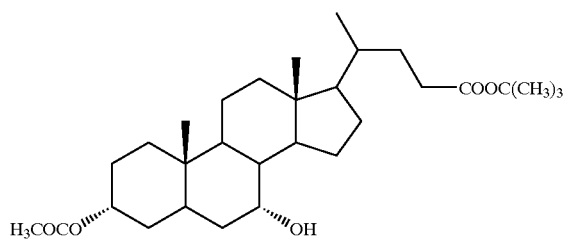
[CI-52]
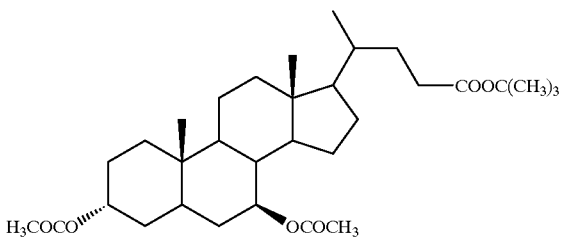
[CI-53]
[CI-54]
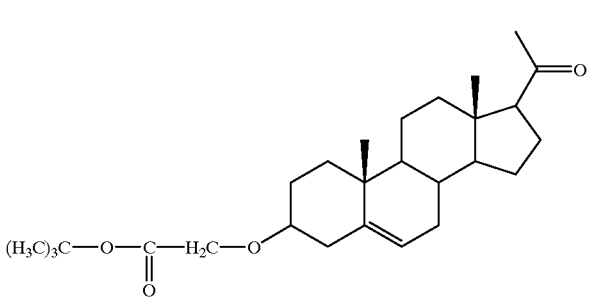

-continued
[CI-55]
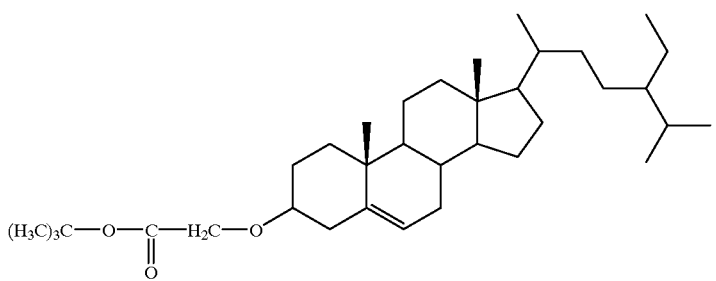
[CI-56]
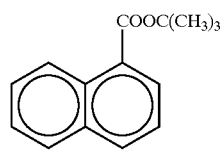
[CI-57]
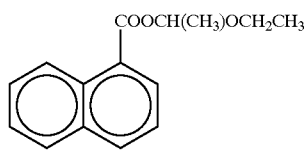
[CI-58]
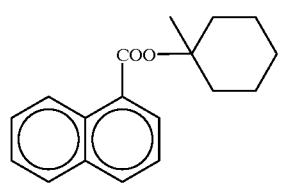
[CI-59]
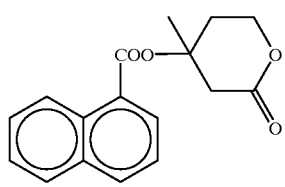
[CI-60]
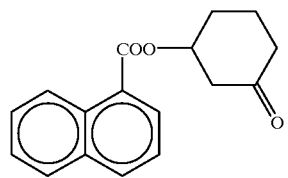
[CI-61]
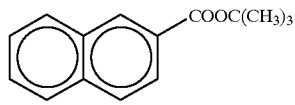
[CI-62]
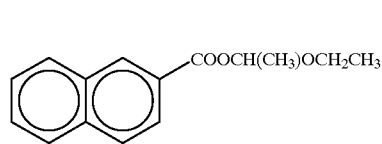
[CI-63]
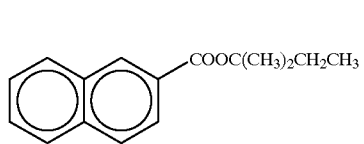
[CI-64]
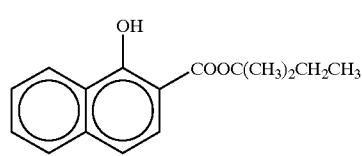
[CI-65]
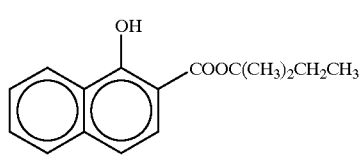
[CI-66]
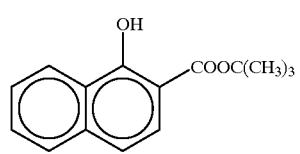
[CI-67]
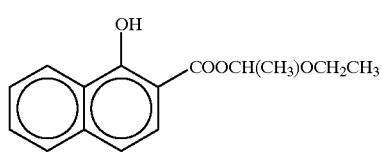
[CI-68]
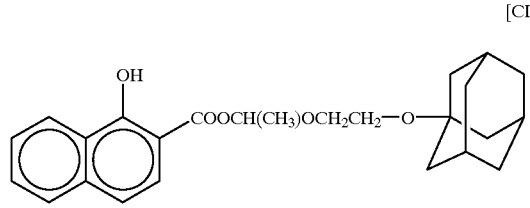
[CI-69]
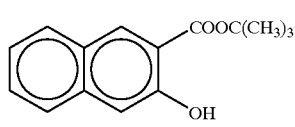

-continued
[CI-70] 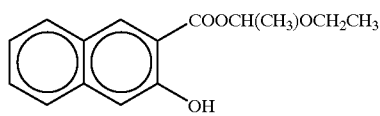
[CI-71] 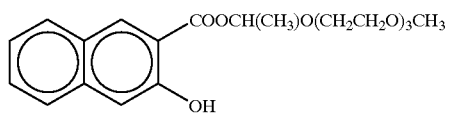
[CI-72] 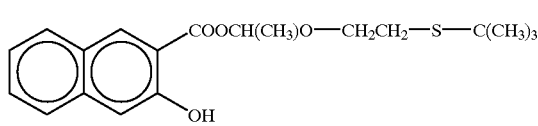
[CI-73] 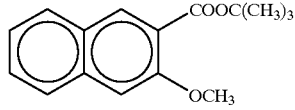
[CI-74] 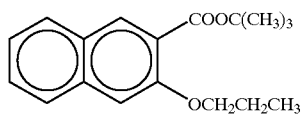
[CI-75] 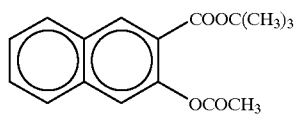
[CI-76] 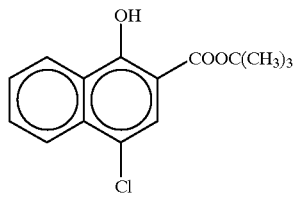
[CI-77] 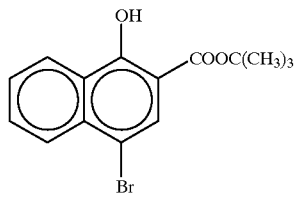
[CI-78] 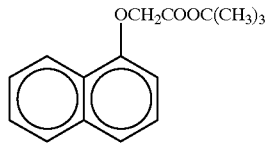
[CI-79] 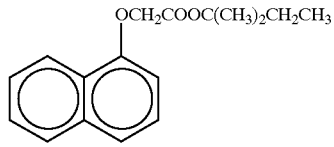
[CI-80] 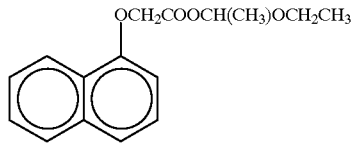
[CI-81] 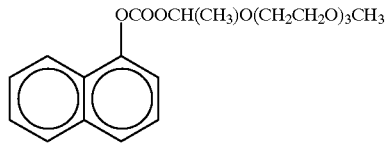
[CI-82] 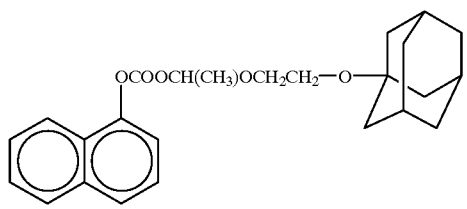
[CI-83] 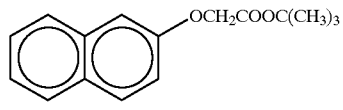
[CI-84] 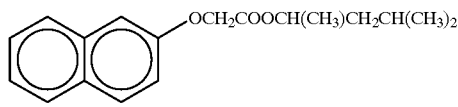
[CI-85] 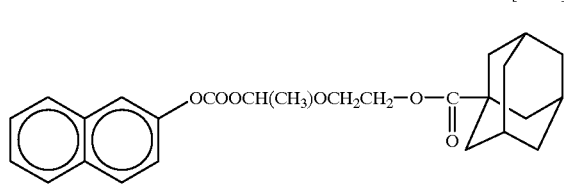
[CI-86] 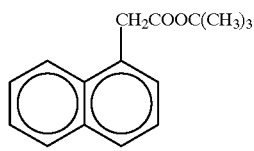
[CI-87] 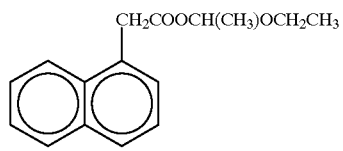

-continued
[CI-88] 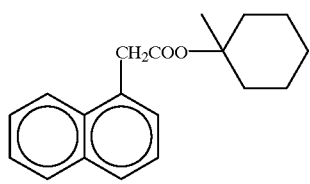
[CI-89] 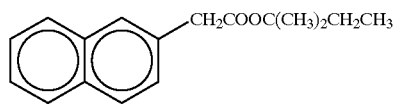
[CI-90] 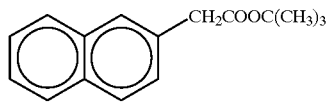
[CI-91] 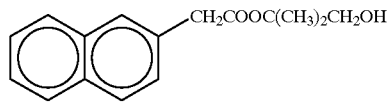
[CI-92] 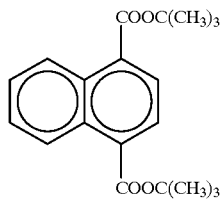
[CI-93] 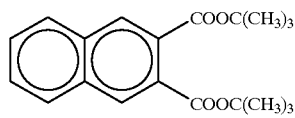
[CI-94] 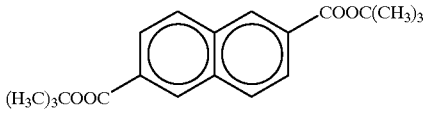
[CI-95] 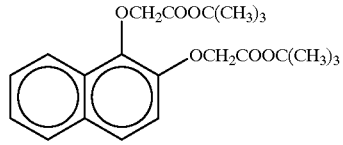
[CI-96] 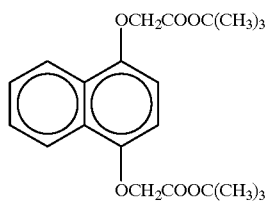
[CI-97] 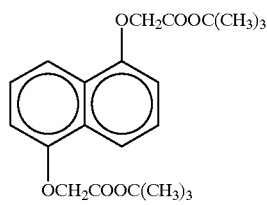
[CI-98] 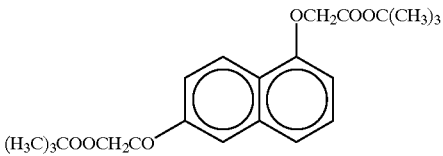
[CI-99] 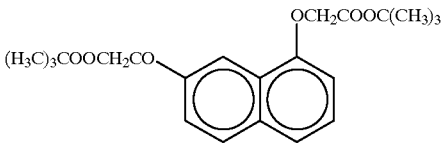
[CI-100] 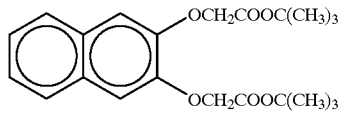
[CI-101] 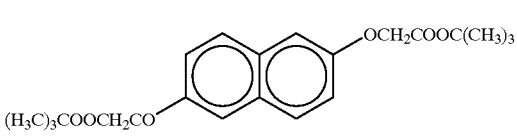
[CI-102] 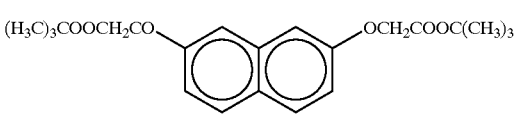
[CI-103] 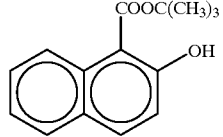
[CI-104] 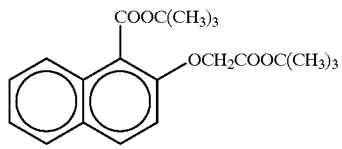
[CI-105] 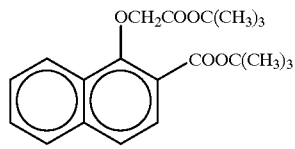

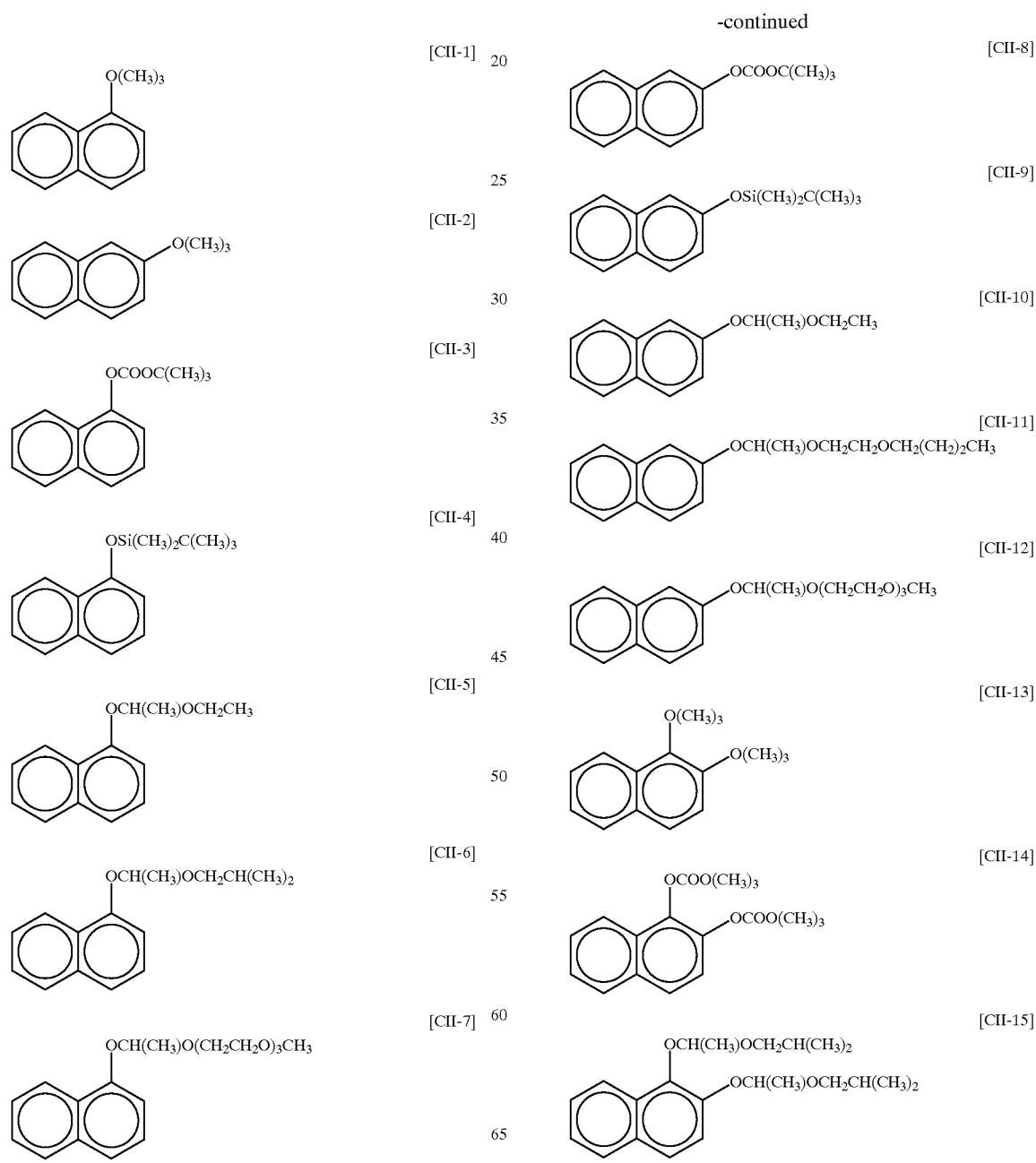

[CII-16] 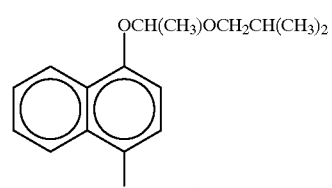
[CII-17] 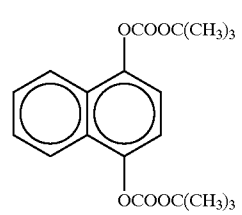
[CII-18] 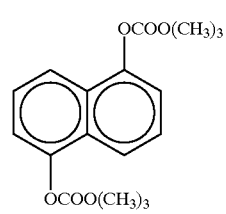
[CII-19] 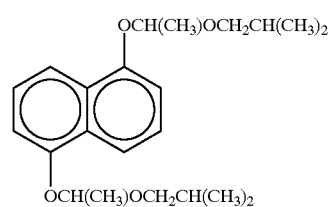
[CII-20] 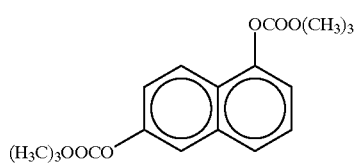
[CII-21] 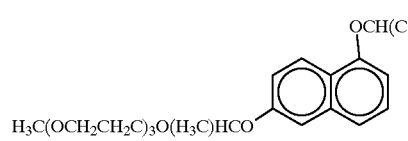
[CII-22] 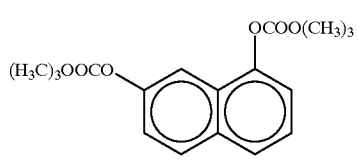
[CII-23] 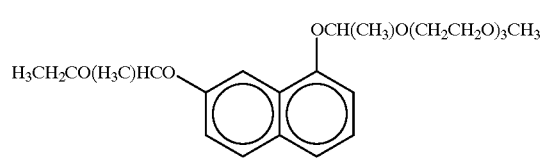
[CII-24] 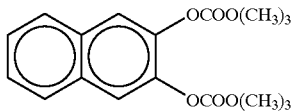
[CII-25] 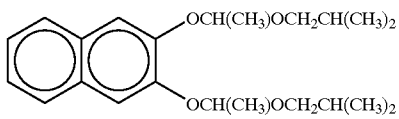
[CII-26] 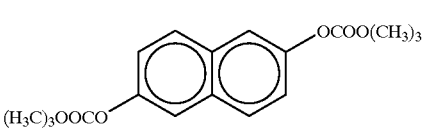
[CII-27] 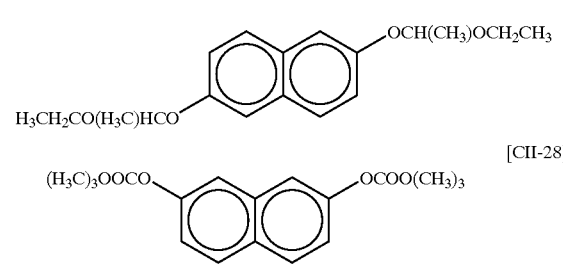
[CII-28] 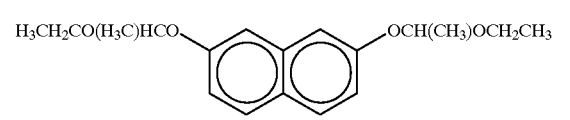
[CII-29] 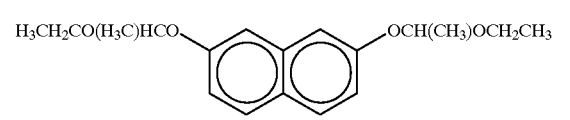
[CII-39] 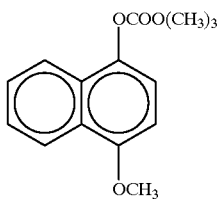
[CII-40] 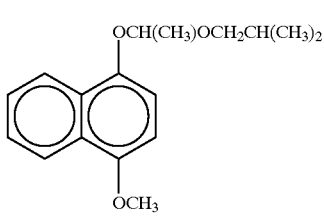
[CII-41] 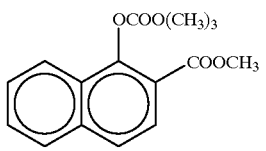
[CII-42] 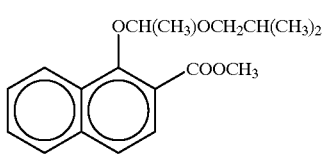

-continued

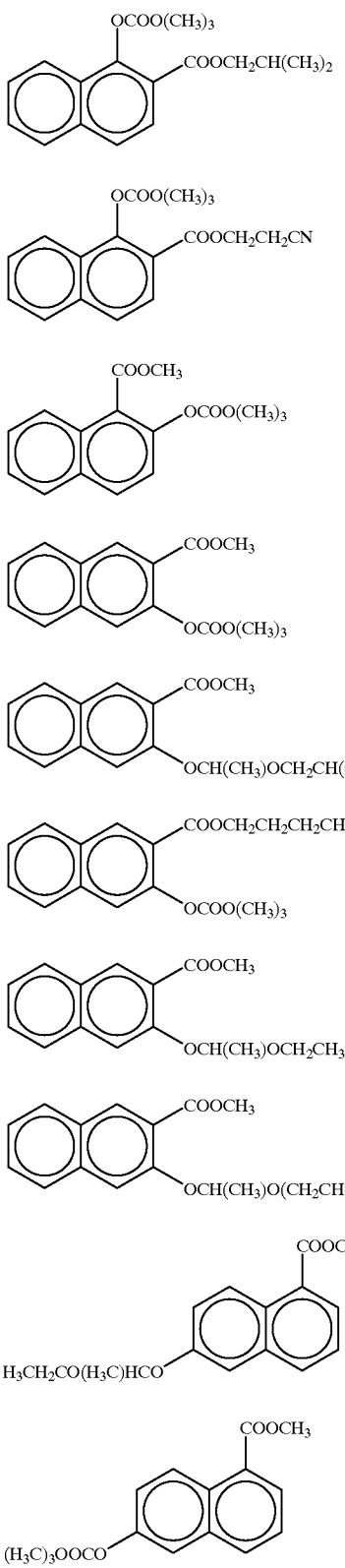

The second positive photosensitive composition of the present invention comprises, as basic main constituent components, the resin described above, a photo-acid generator, and either (i) a low-molecular compound comprising one or more hydrophilic functional groups and an internally crosslinked hydrocarbon group having from 5 to 30 carbon atoms (abbreviated as "compound (i)") or (ii) a naphthalene compound having one or more hydrophilic functional groups and from 10 to 30 carbon atoms (abbreviated as compound (ii)).

Examples of the hydrophilic functional groups in compound (i) include hydroxy, carboxyl, and sulfo groups. Preferred among these are hydroxy and carboxyl.

Examples of the internally crosslinked hydrocarbon group in compound (i) include adamantane, norbornane, tricyclodecane, tetracycloundecane, pinene, terpenes, and steroids.

The number of carbon atoms of the internally crosslinked hydrocarbon group in compound (i) is from 5 to 30, preferably from 6 to 28, more preferably from 8 to 27, most preferably from 10 to 25. Internally crosslinked hydrocarbon groups each having less than 5 carbon atoms are unsuitable in that resistance to dry etching, which is an essential resist performance, is impaired. On the other hand, internally crosslinked hydrocarbon groups each having more than 30 carbon atoms are unsuitable in that the results are, e.g., development residues and an increased number of development defects, the diminution of which is an effect of the present invention.

Examples of compound (i) include cyclohexylcarboxylic acid, 1,2-cyclohexyldicarboxylic acid, cyclopentylacetic acid, 1-adamantanol, 2-adamantanol, 1-adamantanemethanol, 2-adamantanemethanol, 1,3-diadamantanol, 1-adamantanecarboxylic acid, 2-adamantanecarboxylic acid, 1,3-adamantanedicarboxylic acid, 3-hydroxy-1-adamantanecarboxylic acid, 3-methoxy-1-adamantanecarboxylic acid, 3-ethoxy-1-adamantanecarboxylic acid, 3-butoxy-1-adamantanecarboxylic acid, 3-acetoxy-1-adamantanecarboxylic acid, 3-bromo-1-adamantanecarboxylic acid, 1-adamantaneacetic acid, 2-adamantaneacetic acid, 1,3-adamantanediacetic acid, 3-methyl-2-norbornanemethanol, myrtanol, camphoric acid, cis-bicyclo[3.3.0]octane-2-carboxylic acid, 2-hydroxy-3-pinanone, camphonic acid, 3-hydroxy-4,7,7-trimethylbicyclo[2.2.1]heptane-2-acetic acid, 1,5-decalindiol, 4,8-bis(hydroxy)tricyclo[5.2.1.0$^{20}$]decane, borneol, 1-noradamantanecarboxylic acid, 2-noradamantanecarboxylic acid, 2,3-norbornanedicarboxylic acid, tricyclodecanedicarboxylic acid, bornaneacetic acid, 2,3-norbornanediol, 1,3-norbornanediol, 2,5-norbornanediol, 2,6-norbornanediol, 4-pentylbicyclo[2.2.2]octane-1-carboxylic acid, pinanediol, cholic acid, chenodeoxycholic acid, dehydrocholic acid, deoxycholic acid, lithocholic acid, taurocholic acid, ursocholic acid, 3-acetoxycholic acid, 3-acetoxydeocholic acid, 3-butylcarbonyloxycholic acid, and 3-butylcarbonyloxydeoxycholic acid.

These compounds (i) can be used alone or in combination of two or more thereof.

Preferred among these compounds (i) are 1-adamantanecarboxylic acid, 2-adamantanecarboxylic acid, 1,3-adamantanedicarboxylic acid, 3-hydroxy-1-adamantanecarboxylic acid, 3-methoxy-1-adamantanecarboxylic acid, 3-ethoxy-1-adamantanecarboxylic acid, 3-butoxy-1-adamantanecarboxylic acid, 3-acetoxy-1-adamantanecarboxylic acid, 3-bromo-1-adamantanecarboxylic acid, 1-adamantaneacetic acid, 2-adamantaneacetic acid, 1,3-adamantanediacetic acid, cis-bicyclo[3.3.0]octane-2-carboxylic acid, tricyclodecanedicarboxylic acid, 4-pentylbicyclo[2.2.2]octane-1-carboxylic acid, 3-acetoxycholic acid, 3-acetoxydeocholic acid, 3-butylcarbonyloxycholic acid, and 3-butylcarbonyloxydeoxycholic acid.

In compound (ii), the number of carbon atoms is from 10 to 30, preferably from 10 to 28, more preferably from 10 to 25, most preferably from 10 to 22. Naphthalene compounds each having less than 10 carbon atoms are unsuitable in that resistance to dry etching, which is an essential resist performance, is impaired. On the other hand, naphthalene compounds each having more than 30 carbon atoms are unsuitable in that the results are, e.g., development residues and an increased number of development defects, the diminution of which is an effect of the present invention.

Examples of the hydrophilic functional groups in compound (ii) include the same hydrophilic groups as those enumerated hereinabove with regard to compound (i).

Examples of compound (ii) include 1-naphthalenemethanol, 2-naphthalenemethanol, 1-naphthol, 2-naphthol, 1-naphthalenecarboxylic acid, 2-naphthalenecarboxylic acid, 1-hydroxy-2-naphthalenecarboxylic acid, 3-hydroxy-2-naphthalenecarboxylic acid, 1-methoxy-2-naphthalenecarboxylic acid, 1-butoxy-2-naphthalenecarboxylic acid, 3-methoxy-2-naphthalenecarboxylic acid, 3-ethoxy-2-naphthalenecarboxylic acid, 3-butoxy-2-naphthalenecarboxylic acid, 1-acetoxy-2-naphthalenecarboxylic acid, 3-acetoxy-2-naphthalenecarboxylic acid, 8-methoxycarbonyl-1-naphthalenecarboxylic acid, 8-ethoxycarbonyl-1-naphthalenecarboxylic acid, 8-cyclohexyl-1-naphthalenecarboxylic acid, 8-bornylcarbonyl-1-naphthalenecarboxylic acid, 8-(1-adamantyl)carbonyl-1-naphthalenecarboxylic acid, 4-chloro-1-hydroxy-2-naphthalenecarboxylic acid, 4-bromo-1-hydroxy-2-naphthalenecarboxylic acid, 4-chloro-1-oxy-2-naphthalenecarboxylic acid, 1-acetamido-2-naphthalenecarboxylic acid, 3-sulfonylamido-2-naphthalenecarboxylic acid, (1-naphthoxy)acetic acid, (2-naphthoxy)acetic acid, 1-naphthylacetic acid, 2-naphthylacetic acid, 1,2-naphthalenedimethanol, 1,3-naphthalenedimethanol, 1,4-naphthalenedimethanol, 1,5-naphthalenedimethanol, 1,6-naphthalenedimethanol, 1,7-naphthalenedimethanol, 1,8-naphthalenedimethanol, 2,3-naphthalenedimethanol, 2,6-naphthalenedimethanol, 2,7-naphthalenedimethanol, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, 2,7-dihydroxynaphthalene, (1,2-naphthoxy)diacetic acid, (1,3-naphthoxy)diacetic acid, (1,4-dinaphthoxy)diacetic acid, (1,5-naphthoxy)diacetic acid (1,6-naphthoxy)diacetic acid, (1,7-naphthoxy)diacetic acid, (1,8-naphthoxy)diacetic acid, (2,3-naphthoxy)diacetic acid, (2,6-naphthoxy)diacetic acid, (2,7-naphthoxy)diacetic acid, 1,2-naphthalenedicarboxylic acid, 1,3-naphthalenedicarboxylic acid, 1,4-naphthalenedicarboxylic acid, 1,5-naphthalenedicarboxylic acid, 1,6-naphthalenedicarboxylic acid 1,7-naphthalenedicarboxylic acid, 1,8-naphthalenedicarboxylic acid, 2,3-naphthalenedicarboxylic acid, 2,6-naphthalenedicarboxylic acid, 2,7-naphthalenedicarboxylic acid, 1,2-naphthyldiacetic acid, 1,3-naphthyldiacetic acid, 1,4-naphthyldiacetic acid, 1,5-naphthyldiacetic acid, 1,6-naphthyldiacetic acid, 1,7-naphthyldiacetic acid, 1,8-naphthyldiacetic acid, 2,3-naphthyldiacetic acid, 2,6-naphthyldiacetic acid, and 2,7-naphthyldiacetic acid; and 3-hydroxy-1,8-dicarboxynaphthalene, 4-hydroxy-2-carboxynaphthalene, 5-hydroxy-2-carboxynaphthalene, 6-hydroxy-2-carboxynaphthalene, 7-hydroxy-2-carboxynaphthalene, 8-hydroxy-2-carboxynaphthalene, 2-hydroxycarboxynaphthalene, 3-hydroxycarboxynaphthalene, 4-hydroxycarboxynaphthalene, 5-hydroxycarboxynaphthalene, 6-hydroxycarboxynaphthalene, 7-hydroxycarboxynaphthalene, 8-hydroxycarboxynaphthalene, 1-carboxy-2-naphthoxyacetic acid, 3-carboxy-2-naphthoxyacetic acid, 4-carboxy-2-naphthoxyacetic acid, 5-carboxy-2-naphthoxyacetic acid, 6-carboxy-2-naphthoxyacetic acid, 7-carboxy-2-naphthoxyacetic acid, 8-carboxy-2-naphthoxyacetic acid, 2-carboxynaphthoxyacetic acid, 3-carboxynaphthoxyacetic acid, 4-carboxy naphthoxyacetic acid, 5-carboxynaphthoxyacetic acid, 6-carboxynaphthoxyacetic acid, 7-carboxynaphthoxyacetic acid, and 8-carboxynaphthoxyacetic acid. These compounds (ii) can be used alone or in combination of two or more thereof.

Preferred among these compounds (ii) are 1-naphthol, 2-naphthol, 1-naphthalenecarboxylic acid, 2-naphthalenecarboxylic acid, 1-hydroxy-2-naphthalenecarboxylic acid, 3-hydroxy-2-naphthalenecarboxylic acid, 1-methoxy-2-naphthalenecarboxylic acid, 1-butoxy-2-naphthalenecarboxylic acid, 3-methoxy-2-naphthalenecarboxylic acid, 3-ethoxy-2-naphthalenecarboxylic acid, 3-butoxy-2-naphthalenecarboxylic acid, (1-naphthoxy)acetic acid, (2-naphthoxy)acetic acid, 1-naphthylacetic acid, 2-naphthylacetic acid, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, 2,7-dihydroxynaphthalene, 4-hydroxy-2-carboxynaphthalene, 5-hydroxy-2-carboxynaphthalene, 6-hydroxy-2-carboxynaphthalene, 7-hydroxy-2-carboxynaphthalene, 8-hydroxy-2-carboxynaphthalene, 2-hydroxycarboxynaphthalene, 3-hydroxycarboxynaphthalene, 4-hydroxycarboxynaphthalene, 5-hydroxycarboxynaphthalene, 6-hydroxycarboxynaphthalene, 7-hydroxycarboxynaphthalene, and 8-hydroxycarboxynaphthalene.

In the positive photosensitive composition of the present invention, the compounds (i) and (ii) described above each functions as a dissolution accelerator in a developing solution. Although these compounds, which are low-molecular compounds having a molecular weight of 1,000 or lower, can be used alone, these may be used as a mixture of two or more thereof.

In the positive photosensitive composition of the present invention, the addition amount of the dissolution accelerating compound(s) consisting of at least one of compounds (i) and (ii) described above is preferably from 0.5 to 40% by weight, more preferably from 1 to 30% by weight, most preferably from 2 to 25% by weight, based on the resin according to the present invention. Addition amounts thereof exceeding 40% by weight are undesirable in that the results are severer development residues and a new drawback that pattern deformation occurs during development.

The photo-acid generator (A) for use in the first and second compositions of the present invention is a compound which generates an acid upon irradiation with actinic rays or a radiation.

Examples of the compound for use in the present invention which decomposes and generates an acid upon irradiation with actinic rays or a radiation include photoinitiators for cationic photopolymerization, photoinitiators for radical photopolymerization, photodecolorants for dyes, optical color changes, and compounds which generate an acid by the action of known lights used for microresists (e.g., ultraviolet rays having wavelengths of from 400 to 200 nm and far ultraviolet rays, especially preferably g-ray, h-ray, i-ray, and KrF excimer laser light) or of ArF excimer laser light, electron beams, X-rays, molecular beams, or ion beams. These photo-acid generators may be suitably used alone or as a mixture of two or more thereof.

Other examples of the compound for use in the present invention which generates an acid upon irradiation with actinic rays or a radiation include onium salts such as: the diazonium salts described in, e.g., S. I. Schlesinger, *Photogr. Sci. Eng.*, 18, 387 (1974) and T. S. Bal et al., *Polymer*, 21, 423 (1980); the ammonium salts described in, e.g., U.S. Pat. Nos. 4,069,055 and 4,069,056, U.S. Reissued Pat. No. 27,992, and Japanese Patent Application No. 3-140,140; the phosphonium salts described in, e.g., D. C. Necker et al., *Macromolecules*, 17, 2468 (1984), C. S. Wen et al., *Teh, Proc. Conf. Rad. Curing ASIA*, p.478 Tokyo, October (1988), and U.S. Pat. Nos. 4,069,055 and 4,069,056; the iodonium salts described in, e.g., J. V. Crivello et al., *Macromorecules*, 10 (6), 1307 (1977), *Chem. & Eng. News*, November 28, p.31 (1988), European Patent 104,143, U.S. Pat. Nos. 339,049 and 410,201, JP-A-2-150,848, and JP-A-2-296,514; the sulfonium salts described in, e.g., J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromorecules*, 14 (5), 1141 (1981), J. V. Crivello et al., *J. Polymer Sci., Polymer Chem. Ed.*, 17, 2877 (1979), European Patents 370,693, 3,902,114, 233,567, 297,443, and 297,442, U.S. Pat. Nos. 4,933,377, 161,811, 410,201, 339, 049, 4,760,013, 4,734,444, and 2,833,827, German Patents 2,904,626, 3,604,580, and 3,604,581, JP-A-7-28237, and JP-A-8-27102; the selenonium salts described in, e.g., J. V. Crivello et al., *Macromorecules*, 10 (6), 1307 (1977) and J. V. Crivello et al., *J. Polymer Sci., Polymer Chem. Ed.*, 17, 1047 (1979); and the arsonium salts described in, e.g., C. S. Wen et al., *Teh, Proc. Conf. Rad. Curing ASIA*, p.478 Tokyo, October (1988). Examples thereof further include the organohalogen compounds described in, e.g., U.S. Pat. No. 3,905,815, JP-B-46-4605 (the term "JP-B" as used herein means an "examined Japanese patent publication"), JP-A-48-36281, JP-A- 55-32070, JP-A-60-239736, JP-A-61-169835, JP-A-61-169837, JP-A-62-58241, JP-A-62-212401, JP-A-63-70243, and JP-A-63-298339; the organometallic compound/organic halide combinations described in, e.g., K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), and JP-A-2-161445; the photo-acid generators having an o-nitrobenzyl type protective group described in, e.g., S. Hayase et al., *J. Polymer Sci.*, 25, 753 (1987), E. Reichmanis et al., *J. Pholymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290, 750, 046,083, 156,535, 271,851, and 0,388, 343, U.S. Pat. Nos. 3,901,710 and 4,181,531, JP-A-60-198538, and JP-A-53-133022; compounds which photodecompose to generate a sulfonic acid and are represented by the iminosulfonates and the like described in, e.g., M. Tunooka et al., *Polymer Preprints*, Japan, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints*, Japan, 37 (3), European Patents 0,199, 672, 84,515, 199,672, 044,115, and 0,101,122, U.S. Pat. Nos. 618,564, 4,371,605, and 4,431,774, JP-A-64-18143, JP-A-2-245756, and Japanese Patent Application No. 3-140109; the disulfone compounds described in, e.g., JP-A-61-166544 and JP-A-2-71270; and the diazoketosulfone and diazodisulfone compounds described in, e.g., JP-A-3-103854, JP-A-3-103856, and JP-A-4-210960.

Further, a compound obtained by incorporating such groups or compounds which generate an acid by the action of light into the backbone or side chains of a polymer can be used. Examples of this polymeric compound are given in, e.g., M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds which generate an acid by the action of light as described in, e.g., V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, and European Patent 126,712.

Among the compounds enumerated above which generate an acid upon irradiation with actinic rays or a radiation, especially effective compounds are explained below.

(1) Trihalomethyl-substituted oxazole derivatives represented by the following general formula (PAG1) and trihalomethyl-substituted s-triazine derivatives represented by the following general formula (PAG2).

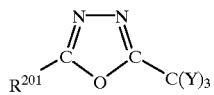

(PAG1)

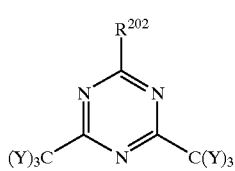

(PAG2)

In the above formulae, $R^{201}$ represents a substituted or unsubstituted aryl or alkenyl group; $R^{202}$ represents a substituted or unsubstituted aryl, alkenyl, or alkyl group or —$C(Y)_3$; and Y represents a chlorine or bromine atom.

Specific examples thereof are given below, but the compounds represented by general formula (PAG1) or (PAG2) should not be construed as being limited thereto.

(PAG1-1) 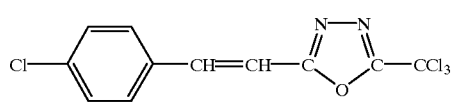
(PAG1-2) 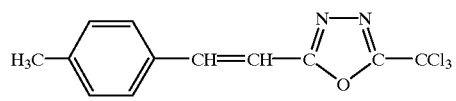
(PAG1-3) 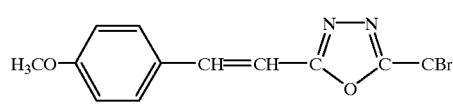
(PAG1-4) 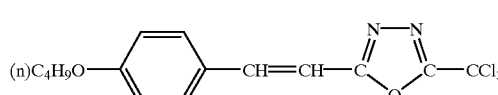
(PAG1-5) 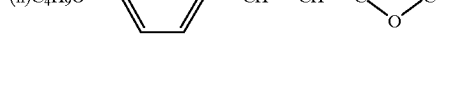
(PAG1-6) 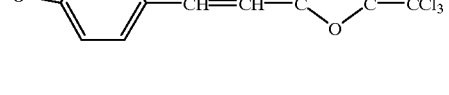
(PAG1-7) 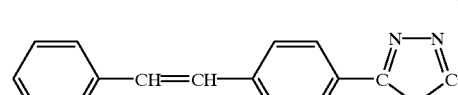
(PAG1-8) 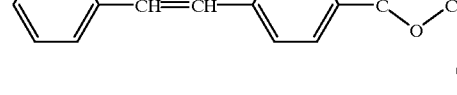
(PAG2-1) 
(PAG2-2) 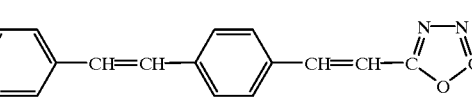
(PAG2-3) 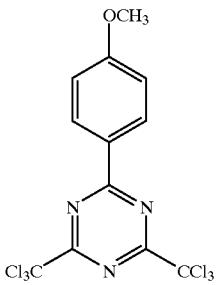
(PAG2-4) 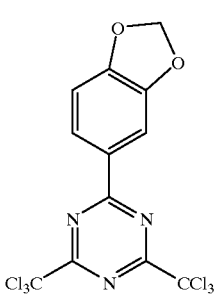
(PAG2-5) 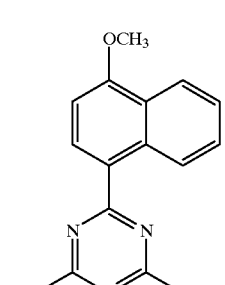
(PAG2-6) 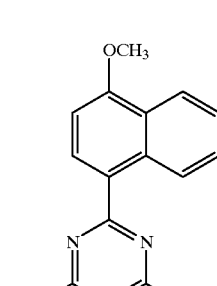
(PAG2-7) 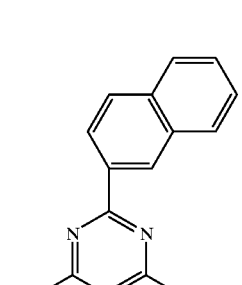

(PAG2-8)

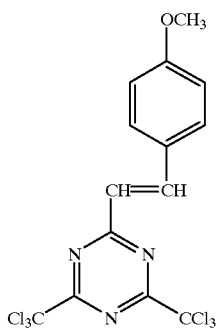

(PAG2-9)

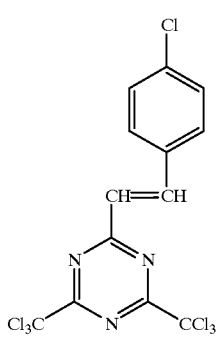

(PAG2-10)

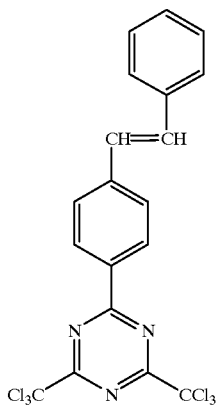

(2) Iodonium salts represented by the following general formula (PAG3) and sulfonium salts represented by the following general formula (PAG4).

(PAG3)

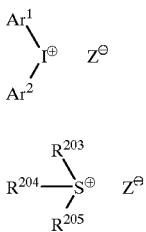

(PAG4)

$R^{204}-\underset{R^{205}}{\overset{R^{203}}{S^{\oplus}}}\ Z^{\ominus}$

In the above formulae, $Ar^1$ and $Ar^2$ each independently represents a substituted or unsubstituted aryl group. Preferred substituents include alkyl groups, haloalkyl groups, cycloalkyl groups, aryl groups, alkoxy groups, nitro, carboxyl, alkoxycarbonyl groups, hydroxy, mercapto, and halogen atoms.

$R^{203}$, $R^{204}$, and $R^{205}$ each independently represents a substituted or unsubstituted alkyl or aryl group, and preferably represents an aryl group having 6 to 14 carbon atoms, an alkyl group having 1 to 8 carbon atoms, or a substitution derivative of either. Preferred substituents for the aryl group include alkoxy groups having 1 to 8 carbon atoms, alkyl groups having 1 to 8 carbon atoms, nitro, carboxyl, hydroxy, and halogen atoms. Preferred substituents for the alkyl group include alkoxy groups having 1 to 8 carbon atoms, carboxyl, and alkoxycarbonyl groups.

$Z^-$ represents a counter anion. Examples thereof include perfluoroalkanesulfonate anions, pentafluorobenzenesulfonate anions, sulfonate anions of fused aromatics such as a naphthalene-1-sulfonate anion, anthraquinonesulfonate anions, and dyes containing a sulfonate group. Specific examples thereof include $BF_4^-$, $AsF_6^-$, $PF_6^-$, $SbF_6^-$, $SiF_6^{2-}$, $ClO_4^-$, and $CF_3SO_3^-$. However, $Z^-$ is not limited to these.

Two of $R^{203}$, $R^{204}$, and $R^{205}$ may be bonded to each other through a single bond or substituent thereof. $Ar^1$ and $Ar^2$ may be bonded to each other likewise.

Specific examples of the compounds represented by general formulae (PAG3) and (PAG4) are given below, but the compounds should not be construed as being limited thereto.

(PAG3-1)

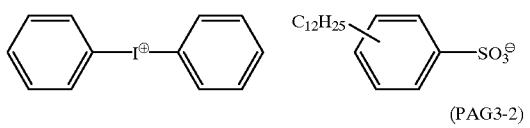

(PAG3-2)

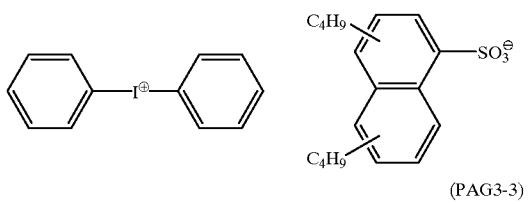

(PAG3-3)

(PAG3-4)

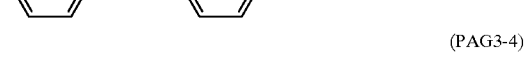

(PAG3-5)

(PAG3-6)

(PAG3-7)

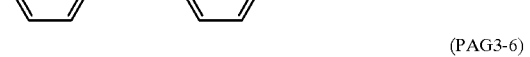

-continued
(PAG3-8)
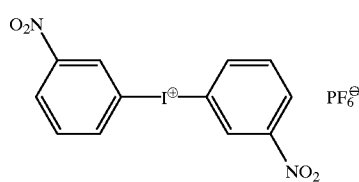
(PAG3-9)
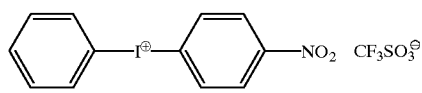
(PAG3-10)
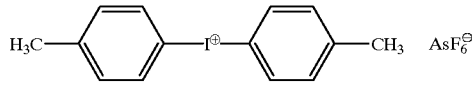
(PAG3-11)
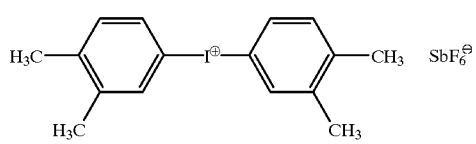
(PAG3-12)
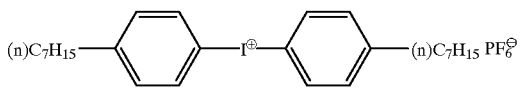
(PAG3-13)
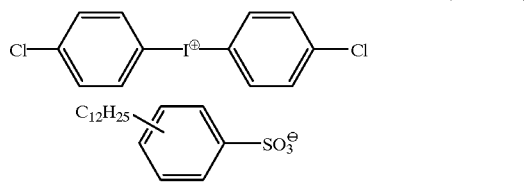
(PAG3-14)
(PAG3-15)
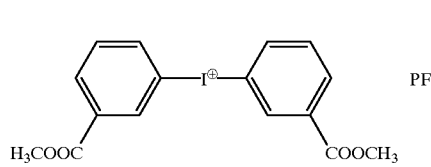
(PAG3-16)
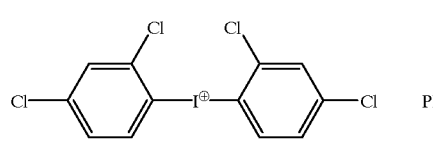
(PAG3-17)
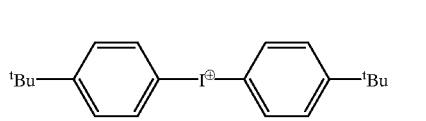
-continued
(PAG3-18)
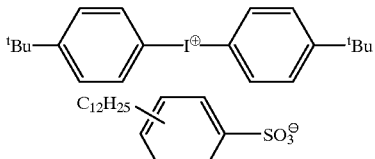
(PAG3-19)
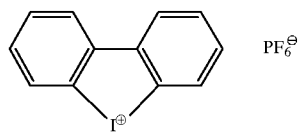
(PAG3-20)
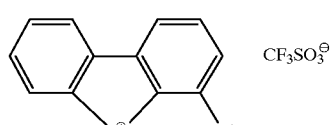
(PAG3-21)
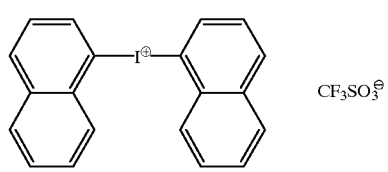
(PAG3-22)
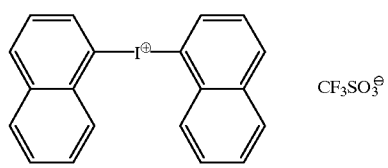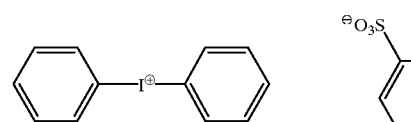
(PAG3-23)
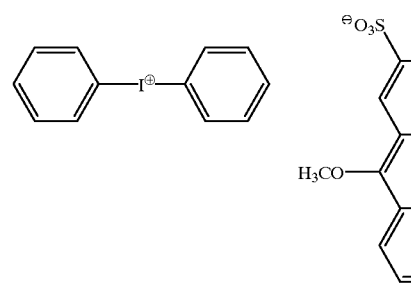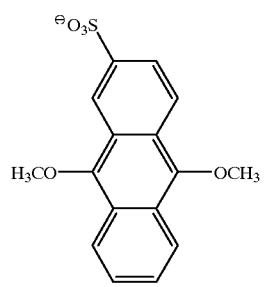
(PAG3-24)
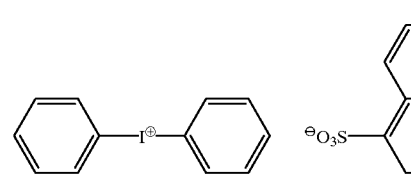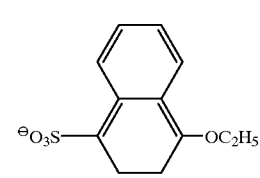
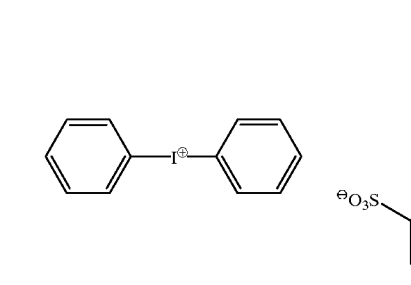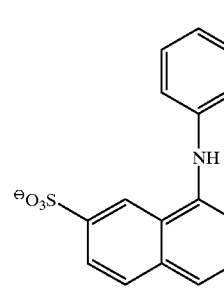

(PAG3-25)
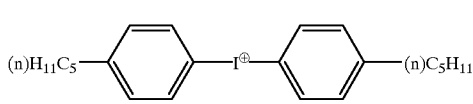
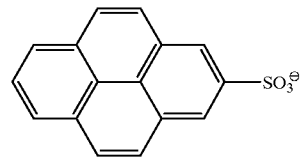
(PAG3-26)
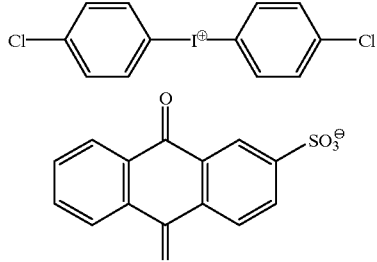
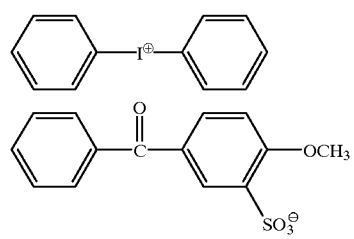
(PAG3-27)
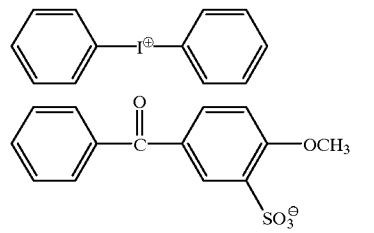
(PAG4-1)
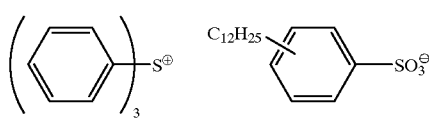
(PAG4-2)
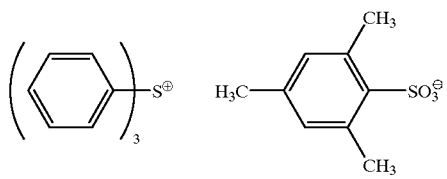
(PAG4-3)
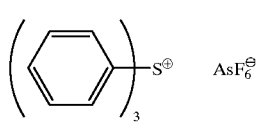
(PAG4-4)
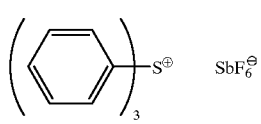
(PAG4-5)
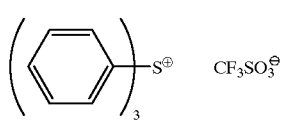
(PAG4-6)
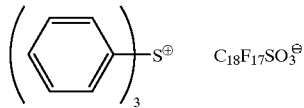
(PAG4-7)
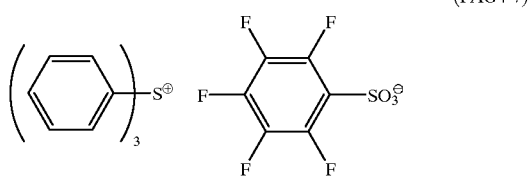
(PAG4-8)
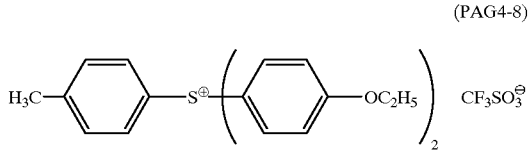
(PAG4-9)
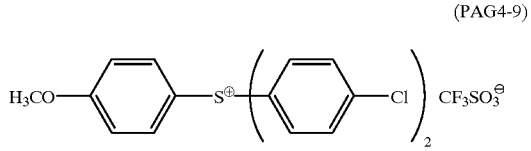
(PAG4-10)
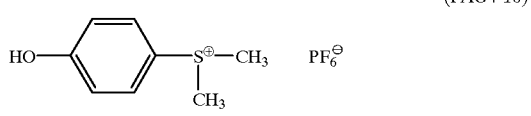
(PAG4-11)
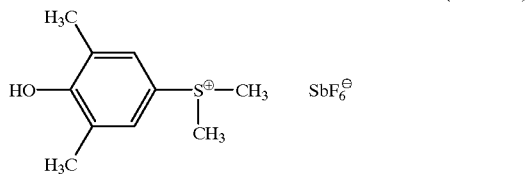
(PAG4-12)
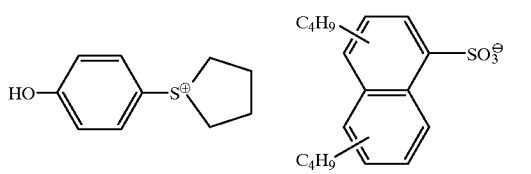
(PAG4-13)
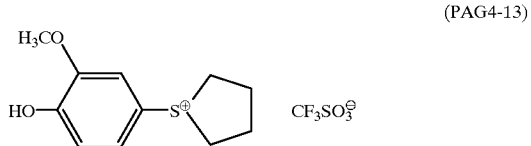
(PAG4-14)

(PAG4-15) 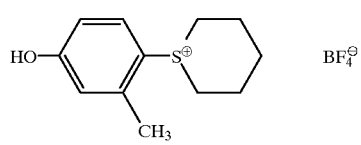
(PAG4-16) 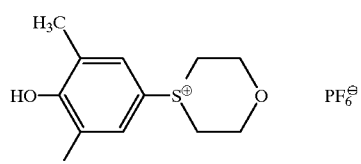
(PAG4-17) 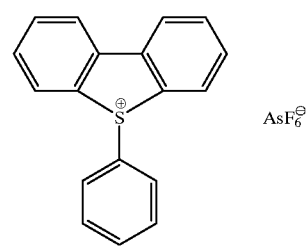
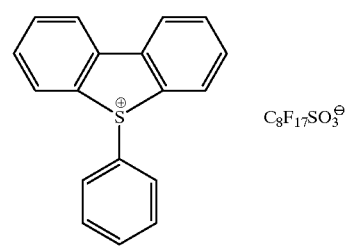
(PAG4-18) 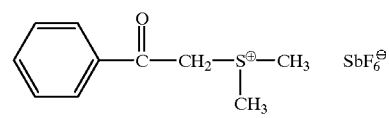
(PAG4-19) 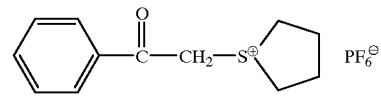
(PAG4-20) 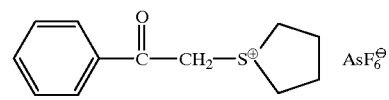
(PAG4-21) 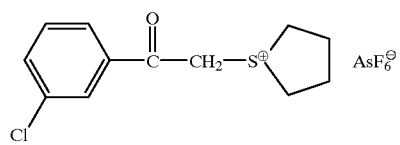
(PAG4-22) 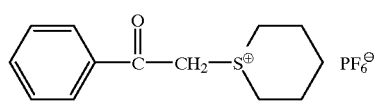
(PAG4-23)
(PAG4-24) 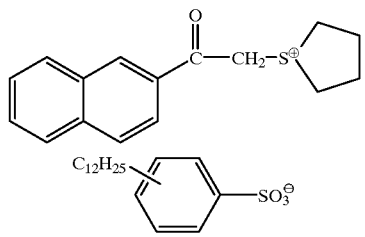
(PAG4-25) 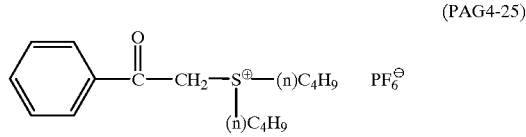
(PAG4-26) 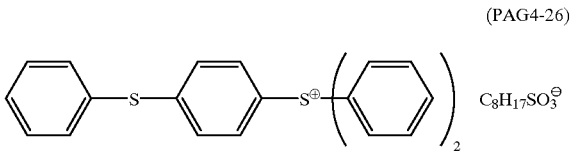
(PAG4-27) 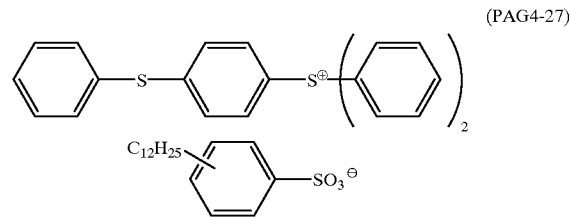
(PAG4-28) 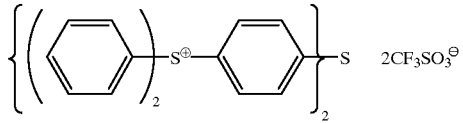
(PAG4-29) 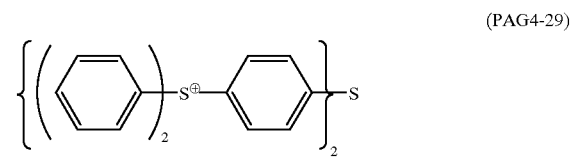
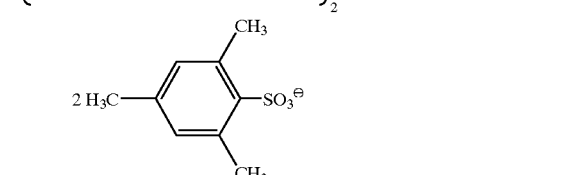
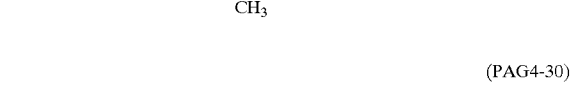
(PAG4-30) 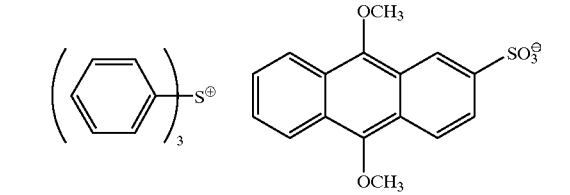

(PAG4-31)

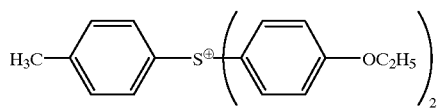

(PAG4-32)

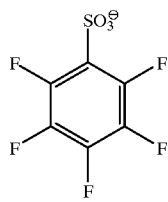

(PAG4-33)

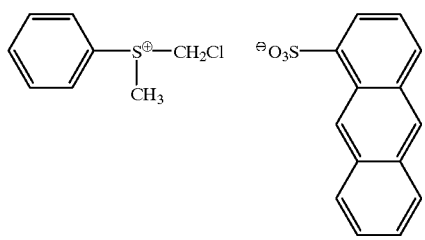

(PAG4-34)

The onium salts represented by general formulae (PAG3) and (PAG4) are known. They can be synthesized, for example, by the methods described in, e.g., J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivatives represented by the following general formula (PAG5) and iminosulfonate derivatives represented by the following general formula (PAG6).

(PAG5)

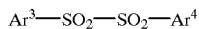

(PAG6)

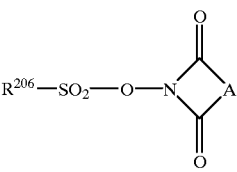

In the above formulae, $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene, or arylene group.

Specific examples thereof are given below, but the compounds represented by general formula (PAG5) or (PAG6) should not be construed as being limited thereto.

(PAG5-1)

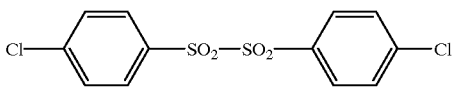

(PAG5-2)

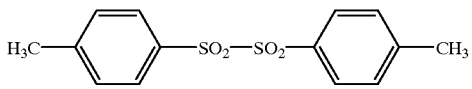

(PAG5-3)

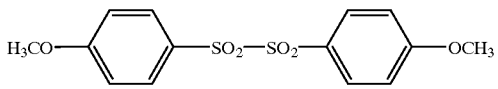

(PAG5-4)

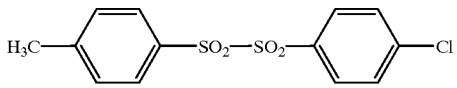

(PAG5-5)

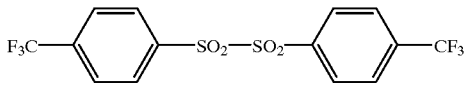

(PAG5-6)

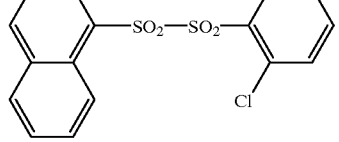

(PAG5-7)

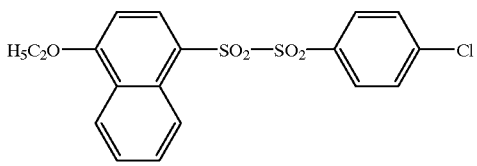

(PAG5-8)
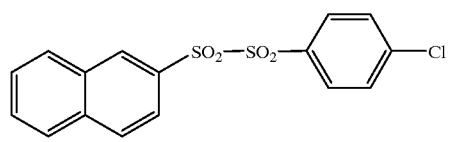
(PAG5-9)
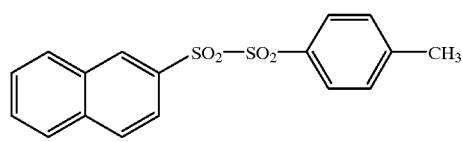
(PAG5-10)
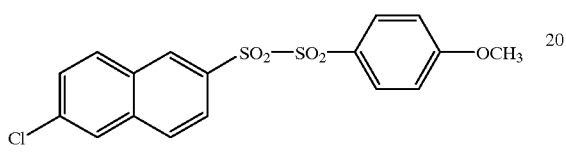
(PAG5-11)
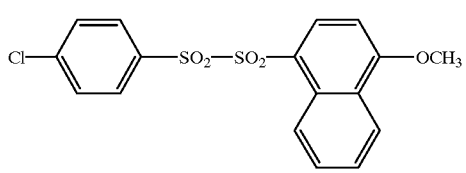
(PAG5-12)
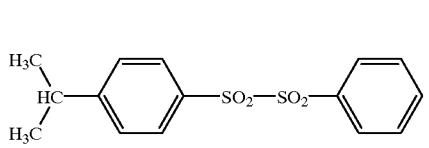
(PAG5-13)
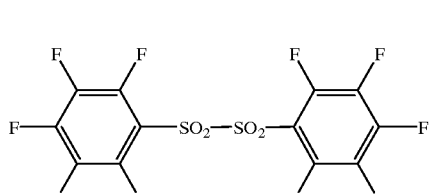
(PAG5-14)
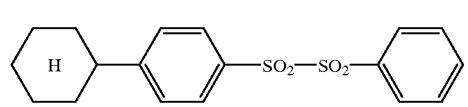
(PAG5-15)
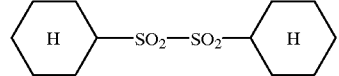
(PAG6-1)
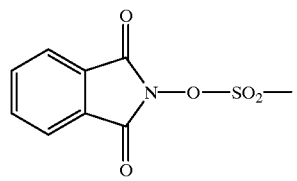
(PAG6-2)
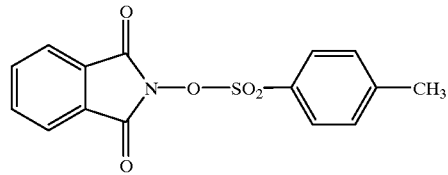
(PAG6-3)
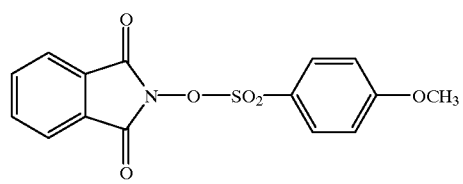
(PAG6-4)
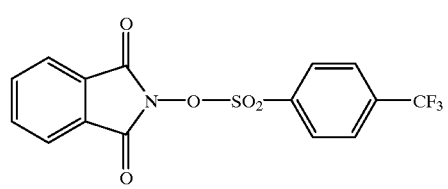
(PAG6-5)
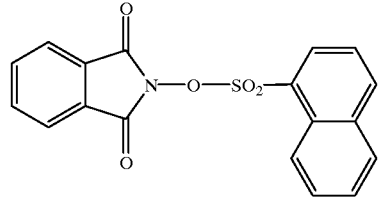
(PAG6-6)
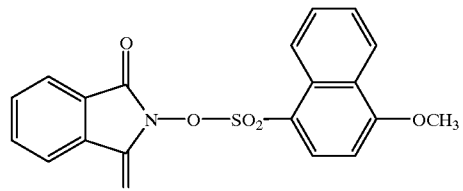
(PAG6-7)
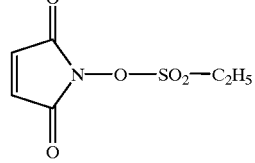
(PAG6-8)
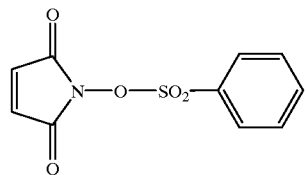

(PAG6-9)
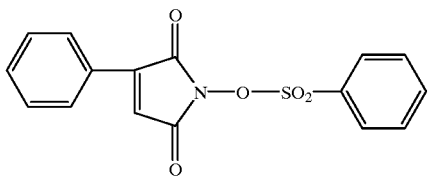

(PAG6-10)
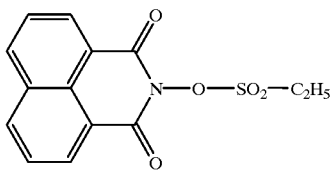

(PAG6-11)
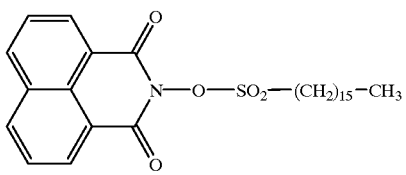

(PAG6-12)
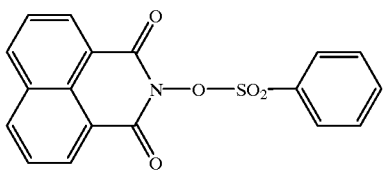

(PAG6-13)
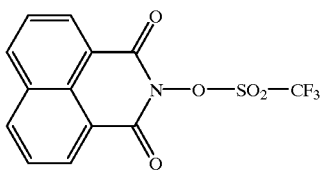

(PAG6-14)
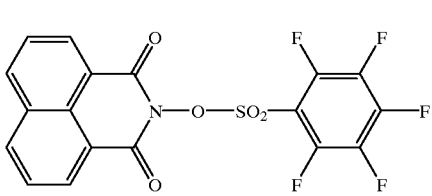

(PAG6-15)
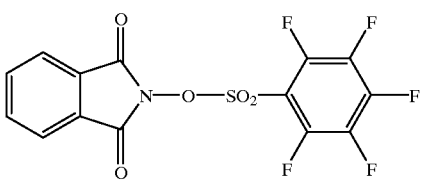

(PAG6-16)
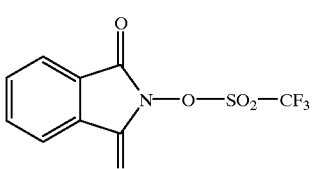

(PAG6-17)
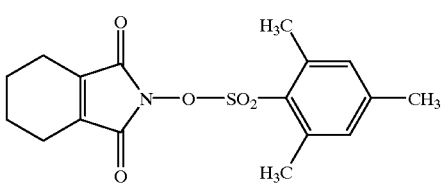

(PAG6-18)
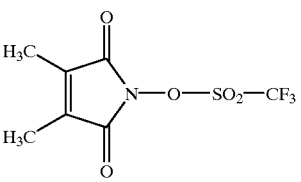

(PAG6-19)
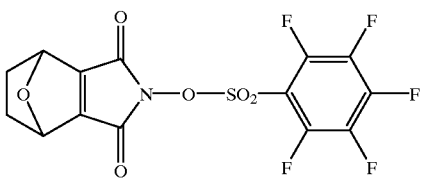

These compounds which decompose and generate an acid upon irradiation with actinic rays or a radiation are used in an addition amount of generally from 0.001 to 40% by weight, preferably from 0.01 to 20% by weight, more preferably from 0.1 to 5% by weight, based on the total amount of the photosensitive composition (excluding the solvent used for application). If the addition amount of the compounds which decompose and generate an acid upon irradiation with actinic rays or a radiation is smaller than 0.001% by weight, the result is too low sensitivity. On the other hand, addition amounts thereof larger than 40% by weight are also undesirable in that the resist shows too intense light absorption, resulting in an impaired profile and a narrowed margin for processing (especially baking).

Other Ingredients Usable in the Invention:

The first positive photosensitive composition of the present invention may optionally further contain other ingredients such as, e.g., acid-decomposable dissolution inhibitive compounds, dyes, plasticizers, surfactants, photosensitizers, organic basic compounds, and compounds which accelerate dissolution in a developing solution.

The compounds capable of accelerating dissolution in a developing solution which are usable in the present invention are low-molecular compounds having a molecular weight of 1,000 or lower and containing either at least two phenolic hydroxyl groups or at least one carboxyl group. In the case of compounds having one or more carboxyl groups, these compounds are preferably alicyclic or aliphatic compounds.

The addition amount of these dissolution accelerating compounds is preferably from 2 to 50% by weight, more preferably from 5 to 30% by weight, based on the resin according to the present invention. Addition amounts thereof exceeding 50% by weight are undesirable in that the results are severer development residues and a new drawback that pattern deformation occurs during development.

Such phenolic compounds having a molecular weight of 1,000 or lower can be easily synthesized by persons skilled in the art by reference to the methods described in, e.g., JP-A-4-122938, JP-A-2-28531, U.S. Pat No. 4,916,210, and European Patent 219,294.

Examples of the phenolic compounds are given below, but the phenolic compounds usable in the present invention should not be construed as being limited thereto.

The examples thereof include resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensation resins, phloroglucide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl)cyclohexane, 4,4-(α-methylbenzylidene)bisphenol, α,α',α''-tris(4-hydroxyphenyl)-1,3,5-triisopropylbenzene, α,α',α''-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, and α,α,α',α'-tetrakis(4-hydroxyphenyl)-p-xylene.

Other Ingredients Usable in the Invention:

The second positive photosensitive composition of the present invention may optionally further contain other ingredients such as dyes, plasticizers, surfactants, photosensitizers, and organic basic compounds.

Preferred organic basic compounds usable in the present invention are compounds which are more strongly basic than phenol. Among these, nitrogen-containing basic compounds are more preferred.

Preferred chemical environments include structures represented by the following formulae (A) to (E).

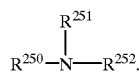

(A)

In formula (A), $R^{250}$, $R^{252}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

(B)

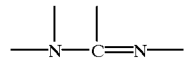

(C)

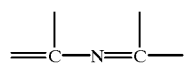

(D)

(E)

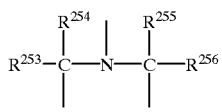

(In formula (E), $R^{253}$, $R^{254}$, $R^{255}$, and $R^{256}$ may be the same or different and each represents an alkyl group having 1 to 6 carbon atoms.)

More preferred organic basic compounds are nitrogen-containing basic compounds having, per molecule, two or more nitrogen atoms having different chemical environments. Especially preferred are compounds containing both at least one substituted or unsubstituted amino group and at least one nitrogen-containing ring structure and compounds having at least one alkylamino group. Preferred examples of such compounds include substituted or unsubstituted guanidine, substituted or unsubstituted aminopyridine, substituted or unsubstituted aminoalkylpyridines, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of especially preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the organic basic compounds usable in the present invention should not be construed as being limited to these examples.

Those nitrogen-containing basic compounds may be used alone or in combination of two or more thereof. The use amount of the nitrogen-containing basic compounds is generally from 0.001 to 10 parts by weight, preferably from 0.01 to 5 parts by weight, per 100 parts by weight of the photosensitive resin composition (excluding the solvent). If the amount thereof is smaller than 0.001 part by weight, the effect of the addition of the nitrogen-containing basic compounds cannot be obtained. On the other hand, amounts thereof exceeding 10 parts by weight tend to result in reduced sensitivity and impaired development resistance of unexposed areas.

Dyes suitable for use in the present invention are oil-soluble dyes and basic dyes. Examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries Ltd.), crystal violet (CI 42555), methyl violet (CI 42535), rhodamine B (CI 45170B), malachite green (CI 42000), and methylene blue (CI 52015).

Photosensitizers such as those enumerated below can be further added in order to improve the efficiency of acid generation in exposure. Preferred examples of photosensitizers include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, acridine orange, benzoflavin, Setoflavine T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonylbis(5,7-dimethoxycarbonylcoumarin), and coronene. However, the photosensitizers usable in the present invention should not be construed as being limited to these examples.

Those photosensitizers can be used also as light absorbers for absorbing the far ultraviolet emitted by a light source. In this case, the light absorber reduces light reflection from the substrate and lessens the influence of multiple reflection within the resist film, thereby producing the effect of diminishing standing wave marks.

For application to a substrate, the photosensitive compositions of the present invention are used in the form of a solution in a solvent in which the ingredients described above dissolve. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as a mixture of two or more thereof.

Surfactants can be added to the solvent. Examples of the surfactants include nonionic surfactants such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan/fatty acid esters, e.g., sorbitan monolaurate, sorbitan monopalmitate, sorbitan monostearate, sorbitan monooleate, sorbitan trioleate, and sorbitan tristearate, and polyoxyethylene-sorbitan/fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as F-Top EF301, EF303, and EF352 (manufactured by New Akita Chemical Company), Megafac F171 and F173 (manufactured by Dainippon Ink & Chemicals, Inc.), Fluorad FC430 and FC431 (manufactured by Sumitomo 3M Ltd.), Asahi Guard AG710 and Surflon S-382, SC101, SC102, SC103, SC104, SC105, and SC106 (manufactured by Asahi Glass Co., Ltd.); organosiloxane polymer KP341 (manufactured by Shin-Etsu Chemical Co., Ltd.); and acrylic or methacrylic (co) polymers Polyflow No. 75 and No. 95 (manufactured by Kyoeisha Chemical Co., Ltd.). The incorporation amount of these surfactants is generally 2 parts by weight or smaller, preferably 1 part by weight or smaller, per 100 parts by weight of the solid ingredients of the composition of the present invention.

These surfactants may be added alone or in combination of two or more thereof.

A satisfactory resist pattern can be obtained by applying the photosensitive compositions described above on a substrate such as those for use in the production of precision integrated-circuit elements (e.g., silicon/silicon dioxide coating) by an appropriate coating means, e.g., a spinner or coater, exposing the coating to light through a given mask, and then baking and developing the coating. Preferred examples of the exposure light include far ultraviolet rays having wavelengths of 250 nm and shorter, more preferably 220 nm and shorter. Specific examples thereof include KrF excimer laser light (248 nm), ArF excimer laser light (193 nm), $F_2$ excimer laser light (157 nm), X-rays, and electron beams.

As a developing solution for the photosensitive compositions of the present invention, use can be made of an alkaline aqueous solution of an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide or tetraethylammonium hydroxide, a cyclic amine, e.g., pyrrole or piperidine, or the like.

The alkaline aqueous solution for use as a developing solution may contain an appropriate amount of an alcohol and a surfactant.

The present invention will be explained below in more detail by reference to Examples, but the invention should not be construed as being limited thereto.

Synthesis Example (1) Synthesis of Monomer a Corresponding to Repeating Unit (a37)

Into a 2-L three-necked flask were introduced 75 g of deoxycholic acid and 1 L of dimethylformamide. The contents were stirred at room temperature to dissolve the acid. Thereto was added 19.2 g of triethylamine. Ethoxymethyl chloride was further added dropwise thereto. After the addition, the resultant mixture was stirred for 3 hours to completely react the same. After completion of the reaction, the solvent was distilled off under reduced pressure and the residue was extracted with ethyl acetate and water. The ethyl acetate solution obtained was dehydrated and then concentrated again to obtain 70 g of ethoxymethyl-protected deoxycholic acid.

The protected acid obtained was redissolved in 2 L of THF, and the resultant solution was introduced into a 3-L three-necked flask together with 100 g of triphenylphosphine. Thereto was further added 33 g of methacrylic acid. Thereafter, 66 g of diethyl azobiscarboxylate was added dropwise. After completion of the addition, the resultant mixture was stirred as it was for 16 hours. The reaction mixture obtained was concentrated and then extracted with ethyl acetate and an aqueous sodium bicarbonate solution. The resultant ethyl acetate layer was filtered, concentrated, and then redissolved in acetone. An aqueous hydrochloric acid solution was added to the acetone solution to hydrolyze the reaction product. After completion of the reaction, the reaction mixture was neutralized, concentrated, and then purified by silica gel column chromatography. As a result, 45 g of monomer a, having the following structure, was obtained as the target compound.

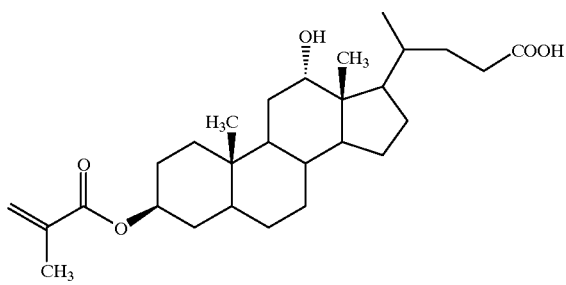

(2) Synthesis of Monomer b Corresponding to Repeating Unit (a48)

Monomer b, having the following structure, was synthesized in the same manner as in Synthesis Example (1), except that acrylic acid was used in place of methacrylic acid.

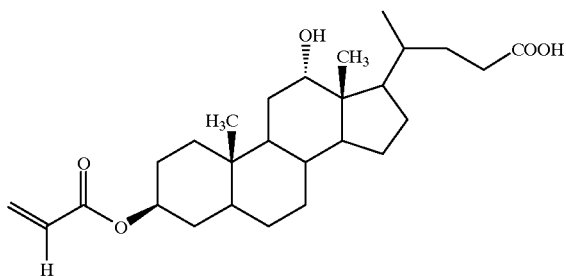

(3) Synthesis of Resin A

In 80 g of THF were dissolved 11.1 g of monomer a obtained above, 3.5 g of the propyl ester of monomer a, 1.9 g of t-butyl acrylate, and 1.2 g of V-65, manufactured by Wako Pure Chemical Industries, Ltd. This solution was dropped over 2 hours into a reactor containing 10 g of THF heated to 50° C. in a nitrogen stream. After completion of the dropwise addition, the contents were stirred as they were for 6 hours. The resultant reaction mixture was allowed to cool to room temperature and poured into 3 L of water to conduct crystallization. The particles precipitated were taken out by filtration. Thus, 17 g of resin A was recovered.

The weight-average molecular weight of resin A obtained was measured by GPC and calculated for standard polystyrene, and was found to be 13,200.

(4) Synthesis of Resin B

In 80 g of THF were dissolved 10.6 g of monomer b obtained above, 4.2 g of the cyanoethyl ester of monomer b, 1.9 g of t-butyl acrylate, and 0.8 g of V-65, manufactured by Wako Pure Chemical Industries, Ltd. This solution was dropped over 2 hours into a reactor containing 10 g of THF heated at 50° C. in a nitrogen stream. After completion of the dropwise addition, the contents were stirred as they were for 2 hours. Subsequently, 0.4 g of V-65 was further added and this mixture was further stirred for 4 hours. The resultant reaction mixture was allowed to cool to room temperature and poured into 3 L of water to conduct crystallization. The particles precipitated were taken out by filtration. Thus, 15 g of resin B was recovered.

The weight-average molecular weight of resin B obtained was measured by GPC and calculated for standard polystyrene, and was found to be 10,300.

(5) Synthesis of Resin C

In 80 g of THF were dissolved 10.2 g of monomer b obtained above, 5.4 g of the ethyl ester of monomer b, 2.0 g of t-butyl acrylate, and 0.8 g of V-65, manufactured by Wako Pure Chemical Industries, Ltd. This solution was dropped over 2 hours into a reactor containing 10 g of THF heated at 50° C. in a nitrogen stream. After completion of the dropwise addition, the contents were stirred as they were for 2 hours. Subsequently, 0.4 g of V-65 was further added and this mixture was further stirred for 4 hours. The resultant reaction mixture was allowed to cool to room temperature and poured into 3 L of water to conduct crystallization. The particles precipitated were taken out by filtration. Thus, 16 g of resin C was recovered.

The weight-average molecular weight of resin C obtained was measured by GPC and calculated for standard polystyrene, and was found to be 11,100.

EXAMPLES 1 TO 10

The resin synthesized in a Synthesis Example above and shown in Table 1 was mixed in an amount of 1.2 g with 0.25 g of triphenylsulfonium triflate and the dissolution inhibitor shown in Table 1, the addition amount of the dissolution inhibitor being shown also in the table. The resultant mixture was dissolved in propylene glycol monoethyl ether acetate in such a proportion as to result in a solid content of 14% by weight. This solution was filtered through a 0.1-$\mu$m microfilter to prepare a positive photoresist composition solution.

TABLE 1

| | Resin | Dissolution Inhibitor (amount, g) | |
|---|---|---|---|
| Example 1 | A | CI-1 | (0.25) |
| Example 2 | B | CI-28 | (0.23) |
| Example 3 | C | CI-41 | (0.27) |
| Example 4 | B | CI-50 | (0.30) |
| Example 5 | B | CI-73 | (0.28) |
| Example 6 | B | CI-101 | (0.20) |
| Example 7 | B | CII-4 | (0.28) |
| Example 8 | A | CII-18 | (0.25) |
| Example 9 | B | CII-28 | (0.22) |
| Example 10 | C | CII-41 | (0.26) |
| Comparative Example 1 | R1 | CI-1 | (0.25) |
| Comparative Example 2 | R2 | CII-4 | (0.28) |
| Comparative Example 3 | A | — | (—) |

Comparative Example 1

A positive photoresist composition solution was prepared in the same manner as in Example 1, except that the poly(tricyclo[$5.2.1.0^{2.6}$] decanyl acrylate-co-tetrahydropyranyl methacrylate-co-methacrylic acid) shown as Polymeric Compound (R1) in paragraph (0043), Example 1 in JP-A-9-265177 was used in place of the resin used in Example 1.

Comparative Example 2

A positive photoresist composition solution was prepared in the same manner as in Example 7, except that Copolymer (R2) (50% methyl methacrylate, 28% t-butyl methacrylate, and 22% methacrylic acid) shown in paragraph (0024), Example 1 in JP-A-8-15865 was used in place of the resin used in Example 7.

Comparative Example 3

A positive photoresist composition solution was prepared in the same manner as in Example 1, except that dissolution inhibitor (CI-1) was omitted.

Evaluation Test

Each of the positive photoresist composition solutions obtained was applied to a silicon wafer with a spin coater and dried at 120° C. for 90 seconds to form a positive photoresist film having a thickness of about 0.5 μm. The resist film was exposed to ArF excimer laser light (193 nm). After the exposure, each resist film was heated at 130° C. for 90 seconds, subsequently developed with a 2.38% aqueous solution of tetramethylammonium hydroxide, and then rinsed with distilled water to obtain resist pattern profiles.

Pattern Profile

The resist pattern profiles obtained above were examined with a scanning electron microscope to evaluate 0.25-μm profiles. The patterns having rectangular profiles are indicated by "A", while those having tapered, T-top, or rounded-top profiles are indicated by "B".

Adhesion to Substrate (Minimum Width of Residual Lines)

The resist pattern profiles obtained above were examined with a scanning electron microscope to evaluate the adhesion in terms of the width of the narrowest residual lines. In resist patterns having higher adhesion, even lines having smaller widths remain unpeeled. In contrast, in resist patterns having poor adhesion, narrower lines are unable to be adherent to the substrate surface and peel off.

Number of Cracks

Each resist film having a thickness of 0.5 μm deposited on a 4-inch bare silicon substrate was dried at 130° C. for 90 seconds. Thereafter, using stepper NSR-1505EX, a large rectangular pattern of 1 mm×3 mm in the resist film was exposed in 50 shots in various exposure amounts varying from 2 mJ/cm$^2$ to 100 mJ/cm$^2$ at an interval of 2 mJ/cm$^2$. After the exposure, the resist film was heated at 130° C. for 90 seconds and then developed with 2.38% TMAH solution. The exposed pattern which had completely dissolved away at the smallest exposure amount was determined, and the patterns in five shots next to that pattern were examined with an optical microscope to count the number of cracks.

The results of the above evaluations are shown in Table 2.

TABLE 2

| | Adhesion to Substrate, Minimum Width of Residual lines (μm) | Profile | Number of Cracks |
|---|---|---|---|
| Example 1 | 0.18 | A | none |
| Example 2 | 0.18 | A | none |
| Example 3 | 0.17 | A | none |
| Example 4 | 0.17 | A | none |
| Example 5 | 0.17 | A | none |
| Example 6 | 0.17 | A | none |
| Example 7 | 0.17 | A | none |
| Example 8 | 0.18 | A | none |
| Example 9 | 0.17 | A | none |
| Example 10 | 0.17 | A | none |
| Comparative Example 1 | 0.25 | B | 20 |
| Comparative Example 2 | 0.25 | B | 25 |
| Comparative Example 3 | 0.23 | A | 5 |

As apparent from the results given in Table 2, the positive photoresist compositions obtained in the Comparative Examples each had problems in adhesion to substrate, pattern profile, and the number of cracks. In contrast, the positive photoresist compositions of the present invention were on satisfactory levels with respect to all of these properties. Namely, these compositions according to the present invention were suitable for lithography employing far ultraviolet rays, including ArF excimer laser light, for exposure.

The present invention can provide a positive photoresist composition which is sufficiently suitable for use with a light having a wavelength range of especially from 170 to 220 nm, gives a resist film having excellent adhesion to substrates and high sensitivity and attaining a reduction in the number of cracks, and hence gives satisfactory resist pattern profiles.

EXAMPLES 11 TO 20

The resins shown in Table 3, synthesized in Synthesis Examples described above, each was mixed in an amount of 1.4 g with 0.18 g of triphenylsulfonium triflate and the dissolution accelerator shown in Table 3, the addition amount of the dissolution accelerator being shown also in the table. Each resultant mixture was dissolved in propylene glycol monoethyl ether acetate in such a proportion as to result in a solid content of 14% by weight. This solution was filtered through a 0.1-μm microfilter. Thus, positive photoresist composition solutions of Examples 11 to 20 were prepared.

TABLE 3

| | Resin | Dissolution Accelerator (amount, g) |
|---|---|---|
| Example 11 | A | 1-adamantanecarboxylic acid (0.15) |
| Example 12 | B | 3-ethoxy-1-adamantanecarboxylic acid (0.13) |
| Example 13 | C | Tricyclodecanedicarboxylic acid (0.10) |
| Example 14 | B | 3-acetoxycholic acid (0.12) |
| Example 15 | C | 2-naphthol (0.15) |
| Example 16 | B | 2-naphthalenecarboxylic acid (0.13) |
| Example 17 | C | 3-hydroxy-2-naphthalenecarboxylic acid (0.12) |
| Example 18 | A | 2-naphthlacetic acid (0.13) |
| Example 19 | B | 1,5-dihydroxynaphthalene (0.16) |
| Example 20 | C | 1,4-dihydroxynaphthalene (0.14) |
| Comparative Example 4 | A | — (—) |
| Comparative Example 5 | R1 | 1-adamantanecarboxylic acid (0.15) |

Comparative Example 4

A positive photoresist composition solution was prepared in the same manner as in Example 11, except that the 1-adamantanecarboxylic acid used as a dissolution accelerator was omitted.

Comparative Example 5

A positive photoresist composition solution was prepared in the same manner as in Example 11, except that the tricyclodecanyl methacrylate/t-butyl methacrylate/methacrylic acid copolymer (A-1) used as (Resin R1) in paragraph (0052), Example 1 in JP-A-9-274318 was used in place of the resin used in Example 11.

Evaluation Test

Each of the positive photoresist composition solutions obtained was applied to a silicon wafer with a spin coater and dried at 120° C. for 90 seconds to form a positive photoresist film having a thickness of about 0.5 μm. The resist film was exposed to ArF excimer laser light (193 nm). After the exposure, each resist film was heated at 130° C. for 90 seconds, subsequently developed with a 2.38% aqueous solution of tetramethylammonium hydroxide, and then rinsed with distilled water to obtain resist pattern profiles.

Sensitivity

Sensitivity is expressed in terms of the exposure amount necessary for reproducing a 0.30 μm mask pattern.

Adhesion to Substrate (Minimum Width of Residual Lines)

The resist pattern profiles obtained above were examined with a scanning electron microscope to evaluate the adhesion in terms of the width of the narrowest residual lines. In resist patterns having higher adhesion, even lines having smaller widths remain unpeeled. In contrast, in resist patterns having poor adhesion, narrower lines are unable to be adherent to the substrate surface and peel off.

Number of Development Defects

Each resist film having a thickness of 0.5 μm deposited on a 6-inch bare silicon substrate was dried with a vacuum holding type hot plate at 130° C. for 60 second. This dried resist film was exposed through a test mask bearing a 0.35 μm contact hole pattern (hole/duty ratio=1/3) by means of Nikon Stepper NSR-1505EX, and then heated at 130° C. for 90 seconds. Subsequently, the exposed resist film was subjected to 60-second puddle development with a 2.38% aqueous TMAH (tetramethylammonium hydroxide) solution, rinsed with pure water for 30 seconds, and then dried with a spin dryer. Each sample thus obtained was examined with KLA-2112, manufactured by KLA Tencol K. K., to count the number of development defects. The primary data obtained are taken as the number of development defects.

The results of the above evaluations are show in Table 4.

TABLE 4

| | Sensitivity (mJ/cm²) | Adhesion to Substrate, Minimum Width of Residual Lines (μm) | Number of Development Defects |
|---|---|---|---|
| Example 11 | 5 | 0.21 | 30 |
| Example 12 | 5 | 0.19 | 20 |
| Example 13 | 6 | 0.19 | 20 |
| Example 14 | 6 | 0.20 | 25 |
| Example 15 | 5 | 0.20 | 20 |
| Example 16 | 5 | 0.19 | 25 |
| Example 17 | 5 | 0.20 | 30 |
| Example 18 | 4 | 0.21 | 25 |
| Example 19 | 5 | 0.20 | 20 |
| Example 20 | 5 | 0.20 | 25 |
| Comparative Example 4 | 15 | 0.25 | 200 |
| Comparative Example 5 | 50 | 0.50 | 1000 |

As apparent from the results given in Table 4, the positive photoresist compositions obtained in the Comparative Examples each had problems in sensitivity, adhesion to substrate, and the number of development defects. In contrast, the positive photoresist compositions of the present invention were on satisfactory levels with respect to all of these properties. Namely, these compositions according to the present invention were suitable for lithography employing far ultraviolet rays, including ArF excimer laser light, for exposure.

The present invention can provide a positive photoresist composition which is sufficiently suitable for use with a light having a wavelength range of especially from 170 to 220 nm, gives a resist film having significantly improved sensitivity and excellent adhesion to substrates and attaining a diminution in development defects, and hence gives satisfactory resist pattern profiles.

While the invention has been described in detail and with reference to specific embodiments thereof, it will be apparent to one skilled in the art that various changes and modifications can be made therein without departing from the spirit and scope thereof.

What is claimed is:

1. A positive photosensitive composition comprising (A) a compound which generates an acid upon irradiation with actinic rays or a radiation, (B) a resin having monovalent polyalicyclic groups represented by at least one of formulae (I), (II), and (III) and further having groups which decompose by the action of an acid to enhance solubility of the resin in an alkaline developing solution, and (C) compound represented by formula (CI) or (CII):

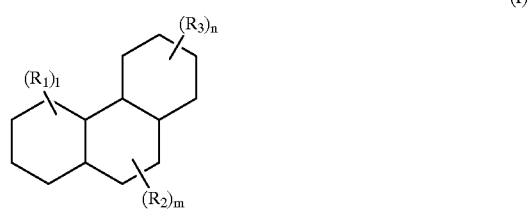

(I)

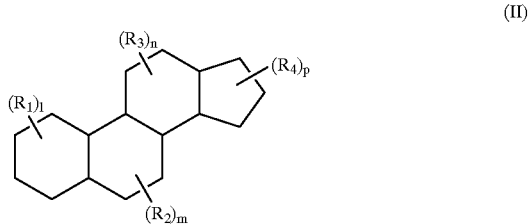

(II)

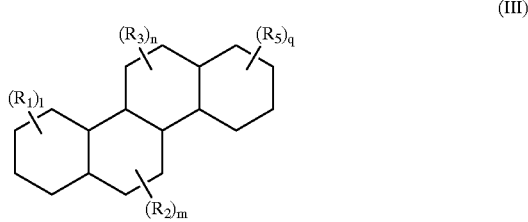

(III)

wherein $R_1$ to $R_5$ may be the same or different and each represents an optionally substituted alkyl, cycloalkyl, alkenyl, acyloxy, or alkynyl group, a halogen atom, a cyano group, or a group represented by —$R_6$—O—$R_7$,
—$R_8$—CO—O—$R_9$,
—$R_{10}$—CO—$NR_{11}R_{12}$,
—$R_{13}$—O—CO—$R_{14}$,
—$R_{15}$—CO—$X_1$—$A_1$—$R_{16}$,
—$R_{15}$—CO—$X_1$—$A_2$—$R_{17}$,
—$R_{15}$—CO—$NHSO_2$—$X_2$—A—$R_{17}$, or
—COOZ, wherein $R_7$ and $R_9$ may be the same or different and each represents a hydrogen atom, an optionally substituted alkyl, cycloalkyl, or alkenyl group, —Z, or such a group that the —O—$R_7$ or —CO—O—$R_9$ functions as an acid-decomposable group which decomposes by the action of an acid to enhance solubility of the resin in an alkaline developing solution, Z is a group represented by either of the following formulae:

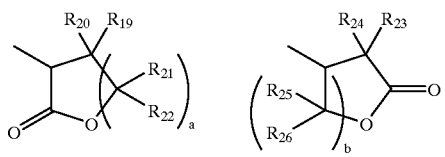

wherein $R_{19}$ to $R_{26}$ may be the same or different and each represents a hydrogen atom or an optionally substituted alkyl group and a and b each represents 1 or 2, $R_{11}$, $R_{12}$, and $R_{14}$ may be the same or different and each represents a hydrogen atom or an optionally substituted alkyl, cycloalkyl, or alkenyl group, provided that $R_{11}$ and $R_{12}$ may be bonded to each other to form a ring, $R_6$, $R_8$, $R_{10}$, and $R_{13}$ may be the same or different and each represents a single bond or an optionally substituted alkylene, alkenylene, or cycloalkylene group, $R_{15}$ represents a single bond or an optionally substituted alkylene or cycloalkylene group, $X_1$ represents an oxygen atom, a sulfur atom, or —NH—, $X_2$ represents a single bond or —NH—, A represents one member or a combination of two or more members selected from the group consisting of a single bond and optionally substituted alkylene, ether, thioether, carbonyl, ester, amide, sulfonamide, urethane, and urea groups, $A_1$ represents one member or a combination of two or more members selected from the group consisting of optionally substituted alkylene, ether, thioether, carbonyl, and ester groups, $A_2$ represents one member or a combination of two or more members selected from the group consisting of optionally substituted alkylene, ether, thioether, carbonyl, ester, amide, sulfonamide, urethane, and urea groups, provided that at least one $A_2$ is selected from sulfonamide, urethane, and urea groups, $R_{16}$ represents —COOH, —COOR$_9$, —OR$_7$, —COOZ, —CN, a hydroxyl group, or —CO—NH—SO$_2$—R$_{30}$, and $R_{17}$ represents —COOH, —COOR$_9$, —OR$_7$, —CN, a hydroxyl group, —CO—NH—R$_{30}$, —CO—NH—SO$_2$—R$_{30}$, —Z, or an optionally substituted alkyl, cycloalkyl, or alkoxy group, wherein $R_{30}$ represents an optionally substituted alkyl or cycloalkyl group and l, m, n, p, and q may be the same or different and each represents 0 or an integer of 1 to 5, provided that when l, m, n, p, or q is 2 or larger, the plural substituents with respect to each of $R_1$, $R_2$, $R_3$, $R_4$ and $R_5$ may be the same or different; two of the plural substituents, which are present on the same carbon, in combination may represent a carbonyl group (=O) or a thiocarbonyl group (=S); two of the plural substituents, which are bonded to adjacent carbon atoms, may represent a double bond between the carbon atoms; and two of the plural substituents may be bonded to each other to form a ring, the bond for external linkage of each monovalent polyalicyclic group represented by formula (I), (II), or (III) being located in any position in the polycyclic hydrocarbon structure;

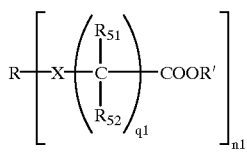

(CI)

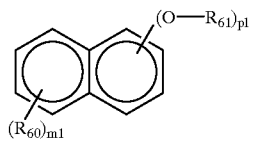

(CII)

wherein in formula (CI), X represents O, S, —N(R$_{53}$)—, or a single bond, $R_{51}$, $R_{52}$, and $R_{53}$ each represents a hydrogen atom or an alkyl group, R' represents such a group that the —COOR' functions as an acid-decomposable group, and R represents a residue having a valency of n1 and comprising either an internally crosslinked hydrocarbon group or a naphthalene ring, and in formula (CII), $R_{60}$ represents a hydrogen atom or an alkyl group, $R_{61}$ represents such a group that the —O—R$_{61}$ functions as an acid-decomposable group, m1, n1, and p1 may be the same or different and each represents an integer of 1 to 4, and q1 represents an integer of 0 to 10.

2. The positive photosensitive composition of claim 1, wherein the monovalent polyalicyclic groups comprise repeating structural units represented by at least one of formulae (IV) to (VI):

(IV)

(V)

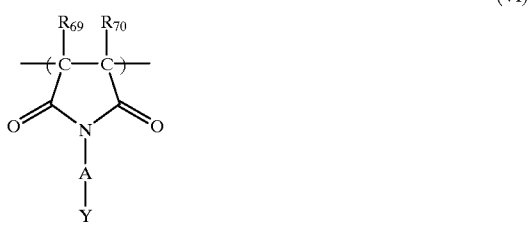

(VI)

wherein $R_{65}$, $R_{66}$, and $R_{68}$ to $R_{70}$, which may be the same or different, each represents a hydrogen atom, a halogen atom, a cyano group, an alkyl group or a haloalkyl group;

$R_{67}$ represents a cyano group, —CO—OR$_{77}$ or —CO—NR$_{78}$R$_{79}$;

A's may be the same or different and represent one member or a combination of two or more members selected from the group consisting of a single bond and optionally substituted alkylene, alkenylene, cycloalkylene, ether, thioether, carbonyl, ester, amide, sulfonamide, urethane, and urea groups, or each represents —$SO_2$—, —O—CO—$R_{80}$—, —CO—O—$R_{81}$—, or —CO—$NR_{82}$—$R_{83}$—;

$R_{77}$ represents a hydrogen atom, an optionally substituted alkyl, cycloalkyl, or alkenyl group, or such a group that the —CO—$OR_{77}$ functions as an acid-decomposable group;

$R_{78}$, $R_{79}$, and $R_{82}$, which may be the same or different, each represents a hydrogen atom or an optionally substituted alkyl, cycloalkyl or alkenyl group and $R_{78}$ and $R_{79}$ may be bonded to each other to form a ring;

$R_{80}$, $R_{81}$, and $R_{83}$, which may be the same or different, each represents a single bond, a bivalent alkylene, alkenylene or cycloalkylene group, or a bivalent group formed by combining these groups with an ether, ester, amide, urethane or ureido group; and Y represents any of the polyalicyclic groups represented by formulae (I) to (III).

3. The positive photosensitive composition of claim 2, wherein the resin having monovalent polyalicyclic groups further comprises repeating structural units represented by at least one of formulae (VII) to (IX):

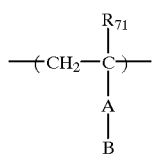
(VII)

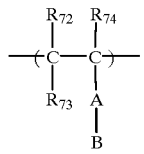
(VIII)

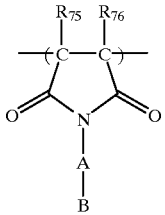
(IX)

wherein $R_{71}$, $R_{72}$, and $R_{74}$ to $R_{76}$, which may be the same or different, each represents a hydrogen atom, a halogen atom, a cyano group, an alkyl group, or a haloalkyl group;

$R_{73}$ has the same meaning as $R_{67}$ described above;

Symbol A has the same meaning as in formulae (IV) to (VI); and

B is a group which decomposes by the action of an acid to enhance solubility of the resin in an alkaline developing solution.

4. The positive photosensitive composition of claim 3, wherein the resin having monovalent polyalicyclic groups further comprises repeating structural units represented by at least one of formulae (X) to (XII):

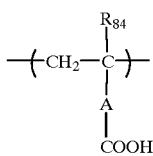
(X)

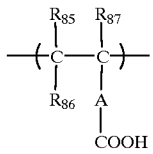
(XI)

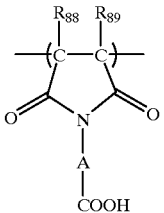
(XII)

$R_{84}$, $R_{85}$, and $R_{87}$ to $R_{89}$, which may be the same or different, each represents a hydrogen atom, a halogen atom, a cyano group, an alkyl group, or a haloalkyl group;

$R_{86}$ represents a cyano group, a carboxyl group, —CO—$OR_{90}$, or —CO—$NR_{91}R_{92}$;

Symbol A has the same meaning as in formulae (IV) to (VI);

$R_{90}$ represents an optionally substituted alkyl, cycloalkyl, or alkenyl group; and $R_{91}$ and $R_{92}$, which may be the same or different, each represents a hydrogen atom or an optionally substituted alkyl, cycloalkyl, or alkenyl group, provided that $R_{91}$ and $R_{92}$ may be bonded to each other to form a ring.

5. A positive photosensitive composition comprising (A) a compound which generates an acid upon irradiation with actinic rays or a radiation, (B) a resin having monovalent polyalicyclic groups represented by at least one of the following formulae (I), (II), and (III) and further having groups which decompose by the action of an acid to enhance solubility of the resin in an alkaline developing solution, and (C) at least one of (i) a low-molecular compound comprising one or more hydrophilic functional groups and an internally crosslinked hydrocarbon group having from 5 to 30 carbon atoms and (ii) a naphthalene compound having one or more hydrophilic functional groups and from 10 to 30 carbon atoms, wherein (C) is present in an amount of from 0.5 to 40% by weight based on the resin:

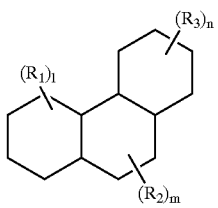
(I)

-continued

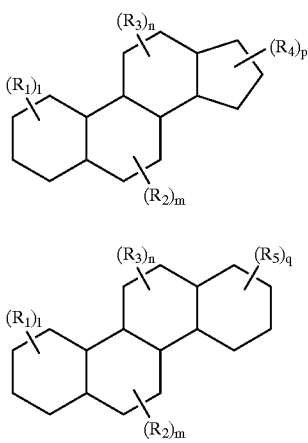

(II)

(III)

wherein $R_1$ to $R_5$ may be the same or different and each represents an optionally substituted alkyl, cycloalkyl, alkenyl, acyloxy, or alkynyl group, a halogen atom, a cyano group, or a group represented by
—$R_6$—O—$R_7$,
—$R_8$—CO—O—$R_9$,
—$R_{10}$—CO—$NR_{11}R_{12}$,
—$R_{13}$—O—CO—$R_{14}$,
—$R_{15}$—CO—$X_1$—$A_1$—$R_{16}$,
—$R_{15}$—CO—$X_1$—$A_2$—$R_{17}$,
—$R_{15}$—CO—$NHSO_2$—$X_2$—A—$R_{17}$, or
—COOZ, wherein $R_7$ and $R_9$ may be the same or different and each represents a hydrogen atom, an optionally substituted alkyl, cycloalkyl, or alkenyl group, —Z, or such a group that the —O—$R_7$, or —CO—O—$R_9$ functions as an acid-decomposable group which decomposes by the action of an acid to enhance solubility of the resin in an alkaline developing solution, Z is a group represented by either of the following formulae:

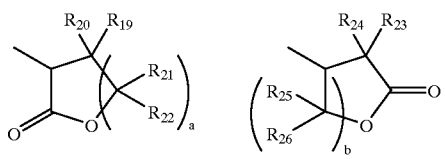

wherein $R_{19}$ to $R_{26}$ may be the same or different and each represents a hydrogen atom or an optionally substituted alkyl group and a and b each represents 1 or 2, $R_{11}$, $R_{12}$, and $R_{14}$ may be the same or different and each represents a hydrogen atom or an optionally substituted alkyl, cycloalkyl, or alkenyl group, provided that R11 and R12 may be bonded to each other to form a ring, $R_6$, $R_8$, $R_{10}$, and $R_{13}$ may be the same or different and each represents a single bond or an optionally substituted alkylene, alkenylene, or cycloalkylene group, $R_{15}$ represents a single bond or an optionally substituted alkylene or cycloalkylene group, $X_1$ represents an oxygen atom, a sulfur atom, or —NH—, $x_2$ represents a single bond or —NH—, A represents one member or a combination of two or more members selected from the group consisting of a single bond and optionally substituted alkylene, ether, thioether, carbonyl, ester, amide, sulfonamide, urethane, and urea groups, $A_1$ represents one member or a combination of two or more members selected from the group consisting of optionally substituted alkylene, ether, thioether, carbonyl, and ester groups, $A_2$ represents one member or a combination of two or more members selected from the group consisting of optionally substituted alkylene, ether, thioether, carbonyl, ester, amide, sulfonamide, urethane, and urea groups, provided that at least one $A_2$ is selected from sulfonamide, urethane, and urea groups, $R_{16}$ represents —COOH, —$COOR_9$, —$OR_7$, —COOZ, —CN, a hydroxyl group, or —CO—NH—$SO_2$—$R_{30}$, and $R_{17}$ represents —COOH, —$COOR_9$, —$OR_7$, —CN, a hydroxyl group, —CO—NH—$R_{30}$, —CO—NH—$SO_2$—$R_{30}$, —Z, or an optionally substituted alkyl, cycloalkyl, or alkoxy group, wherein $R_{30}$ represents an optionally substituted alkyl or cycloalkyl group, and l, m, n, p, and q may be the same or different and each represents 0 or an integer of 1 to 5, provided that when l, m, n, p, or q is 2 or larger, the plural substituents with respect to each of $R_1$, $R_2$, $R_3$, $R_4$ and $R_5$ may be the same or different; two of the plural substituents, which are present on the same carbon, in combination may represent a carbonyl group (=O) or a thiocarbonyl group (=5); two of the plural substituents, which are bonded to adjacent carbon atoms, may represent a double bond between the carbon atoms; and two of the plural substituents may be bonded to each other to form a ring, the bond for external linkage of each monovalent polyalicyclic group represented by formula (I), (II), or (III) being located in any position in the polycyclic hydrocarbon structure.

6. The positive photosensitive composition of claim 5, wherein the monovalent polyalicyclic groups comprise repeating structural units represented by at least one of formulae (IV) to (VI):

(IV)

(V)

(VI)

wherein $R_{65}$, $R_{66}$, and $R_{68}$ to $R_{70}$, which may be the same or different, each represents a hydrogen atom, a halogen atom, a cyano group, an alkyl group or a haloalkyl group;

$R_{67}$ represents a cyano group, —CO—$OR_{77}$ or —CO—$NR_{78}R_{79}$;

A's may be the same or different and represent one member or a combination of two or more members selected from the group consisting of a single bond and optionally substituted alkylene, alkenylene, cycloalkylene, ether, thioether, carbonyl, ester, amide, sulfonamide, urethane, and urea groups, or each represents —$SO_2$—, —O—CO—$R_{80}$—, —CO—O—$R_{81}$—, or —CO—$NR_{82}$—$R_{83}$—;

$R_{77}$ represents a hydrogen atom, an optionally substituted alkyl, cycloalkyl, or alkenyl group, or such a group that the —CO—$OR_{77}$ functions as an acid-decomposable group;

$R_{78}$, $R_{79}$, and $R_{82}$, which may be the same or different, each represents a hydrogen atom or an optionally substituted alkyl, cycloalkyl or alkenyl group and $R_{78}$ and $R_{79}$ may be bonded to each other to form a ring;

$R_{80}$, $R_{81}$, and $R_{83}$, which may be the same or different, each represents a single bond, a bivalent alkylene, alkenylene or cycloalkylene group, or a bivalent group formed by combining these groups with an ether, ester, amide, urethane or ureido group; and Y represents any of the polyalicyclic groups represented by formulae (I) to (III).

7. The positive photosensitive composition of claim 6, wherein the resin having monovalent polyalicyclic groups further comprises repeating structural units represented by at least one of formulae (VII) to (IX):

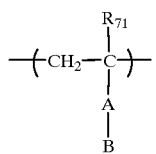
(VII)

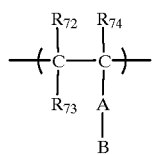
(VIII)

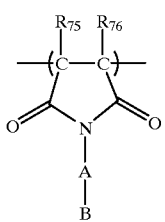
(IX)

wherein $R_{71}$, $R_{72}$, and $R_{74}$ to $R_{76}$, which may be the same or different, each represents a hydrogen atom, a halogen atom, a cyano group, an alkyl group, or a haloalkyl group;

$R_{73}$ has the same meaning as $R_{67}$ described above;

Symbol A has the same meaning as in formulae (IV) to (VI); and

B is a group which decomposes by the action of an acid to enhance solubility of the resin in an alkaline developing solution.

8. The positive photosensitive composition of claim 7, wherein the resin having monovalent polyalicyclic groups further comprises repeating structural units represented by at least one of formulae (X) to (XII):

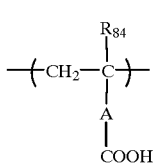
(X)

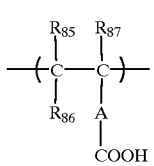
(XI)

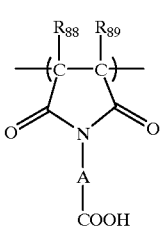
(XII)

$R_{84}$, $R_{85}$, and $R_{87}$ to $R_{89}$, which may be the same or different, each represents a hydrogen atom, a halogen atom, a cyano group, an alkyl group, or a haloalkyl group;

$R_{86}$ represents a cyano group, a carboxyl group, —CO—$OR_{90}$, or —CO—$NR_{91}R_{92}$;

Symbol A has the same meaning as in formulae (IV) to (VI);

$R_{90}$ represents an optionally substituted alkyl, cycloalkyl, or alkenyl group; and $R_{91}$ and $R_{92}$, which may be the same or different, each represents a hydrogen atom or an optionally substituted alkyl, cycloalkyl, or alkenyl group, provided that $R_{91}$ and $R_{92}$ may be bonded to each other to form a ring.

* * * * *